(12) United States Patent
Kanzaki et al.

(10) Patent No.: US 7,701,063 B2
(45) Date of Patent: Apr. 20, 2010

(54) SEMICONDUCTOR DEVICE

(75) Inventors: Teruaki Kanzaki, Tokyo (JP);
Yoshinori Deguchi, Tokyo (JP);
Kazunobu Miki, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 691 days.

(21) Appl. No.: 10/590,276

(22) PCT Filed: Feb. 22, 2005

(86) PCT No.: PCT/JP2005/002801

§ 371 (c)(1),
(2), (4) Date: Aug. 22, 2006

(87) PCT Pub. No.: WO2005/083767

PCT Pub. Date: Sep. 9, 2005

(65) Prior Publication Data

US 2007/0182001 A1  Aug. 9, 2007

(30) Foreign Application Priority Data

Feb. 26, 2004 (JP) ............................. 2004-051486

(51) Int. Cl.
*H01L 23/48* (2006.01)
*H01L 23/52* (2006.01)

(52) U.S. Cl. .................... 257/773; 257/786; 257/758; 257/E23.145

(58) Field of Classification Search ................. 257/773, 257/786, 758, E23.145
See application file for complete search history.

(56) References Cited

U.S. PATENT DOCUMENTS

| | | | | |
|---|---|---|---|---|
| 5,686,762 A | * | 11/1997 | Langley | 257/775 |
| 5,739,587 A | * | 4/1998 | Sato | 257/758 |
| 5,847,466 A | * | 12/1998 | Ito et al. | 257/775 |
| 5,986,343 A | * | 11/1999 | Chittipeddi et al. | 257/758 |
| 6,181,016 B1 | * | 1/2001 | Lin et al. | 257/786 |
| 6,198,170 B1 | * | 3/2001 | Zhao | 257/784 |
| 6,455,943 B1 | * | 9/2002 | Sheu et al. | 257/786 |
| 6,847,124 B2 | * | 1/2005 | Semi | 257/786 |
| 7,049,701 B2 | * | 5/2006 | Usui | 257/773 |
| 2001/0000928 A1 | * | 5/2001 | Lee et al. | 257/786 |
| 2002/0121701 A1 | | 9/2002 | Furuhata | |
| 2004/0016949 A1 | | 1/2004 | Semi | |

FOREIGN PATENT DOCUMENTS

JP  1-246861  10/1989

(Continued)

*Primary Examiner*—Nitin Parekh
(74) *Attorney, Agent, or Firm*—McDermott Will & Emery LLP

(57) ABSTRACT

The present invention aims at offering the semiconductor device which can improve the strength to the stress generated with a bonding pad. In the semiconductor device concerning the present invention, a plurality of bonding pads are formed on a semiconductor chip. In each bonding pad, a plurality of second line-like metals are formed under the first metal formed using the wiring layer of the top layer. And a bonding pad is put in order and located along the long-side direction of a second metal to achieve the above objects. That is, a bonding pad is put in order and located so that the long-side direction of a second metal and the arrangement direction of a bonding pad may become in the same direction.

3 Claims, 56 Drawing Sheets

FOREIGN PATENT DOCUMENTS

| | | |
|---|---|---|
| JP | 06-196525 | 7/1994 |
| JP | 8-236706 | 9/1996 |
| JP | 10-199925 | 7/1998 |
| JP | 2001-85465 | 3/2001 |
| JP | 2002-16069 | 1/2002 |
| JP | 2002-110731 | 4/2002 |
| JP | 2002-222811 | 8/2002 |
| JP | 2002-299567 | 10/2002 |
| JP | 2002-324798 | 11/2002 |
| JP | 2003-163267 | 6/2003 |
| JP | 2004-14609 | 1/2004 |

* cited by examiner

FIG. 6

| | | AMOUNT OF OD (μm) | NUMBER OF TIMES OF PROBING | | | |
|---|---|---|---|---|---|---|
| | | | ONCE | 5 TIMES | 7 TIMES | 10 TIMES |
| 1 | CONVENTIONAL STRUCTURE (LARGE CALIBER VIA HOLE) | 50<br>80<br>100 | ○<br>○<br>○ | ○<br>○<br>○ | ○<br>○<br>× | ○<br>×<br>× |
| 2 | EMBODIMENT 1 (CONTACTING AT RIGHT ANGLE TO SECOND METAL) | 50<br>80<br>100 | ○<br>○<br>○ | ○<br>○<br>○ | ○<br>○<br>× | ○<br>×<br>× |
| 3 | EMBODIMENT 1 (CONTACTING IN PARALLEL WITH SECOND METAL) | 50<br>80<br>100 | ○<br>○<br>○ | ○<br>○<br>× | ○<br>×<br>× | ×<br>×<br>× |
| 4 | EMBODIMENT 2 (STRESS SIMULATION) | 50<br>80<br>100 | ○<br>○<br>○ | ○<br>○<br>○ | ○<br>○<br>○ | ○<br>×<br>× |
| 5 | EMBODIMENT 4 (COMBINATION STRUCTURE WITH EMBODIMENT 1) | 50<br>80<br>100 | ○<br>○<br>○ | ○<br>○<br>○ | ○<br>○<br>○ | ○<br>○<br>○ |

○ : NO CRACK
× : CRACK GENERATION

PAD FORMATION AREA    USUAL WIRING AREA

PAD FORMATION AREA    USUAL WIRING AREA

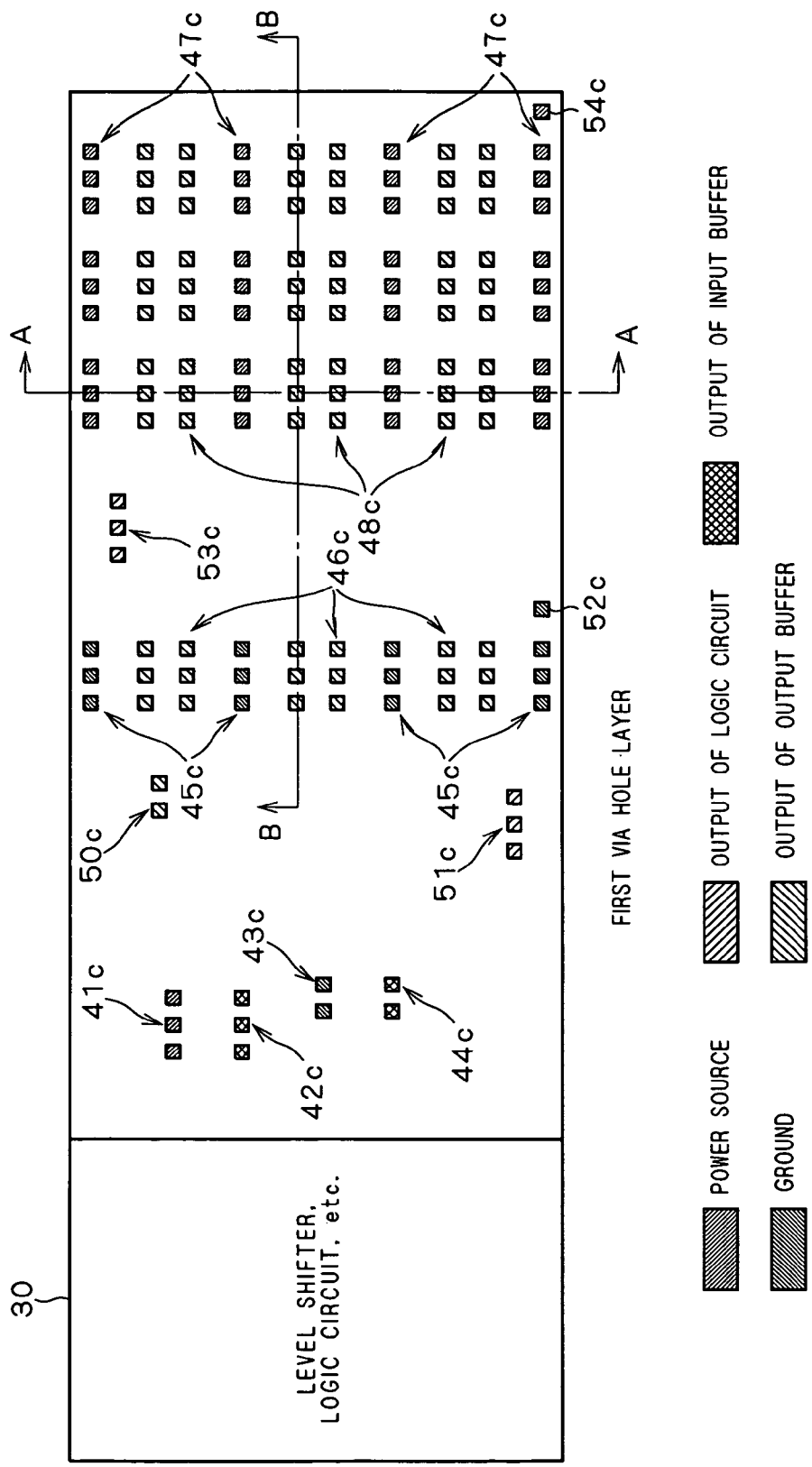

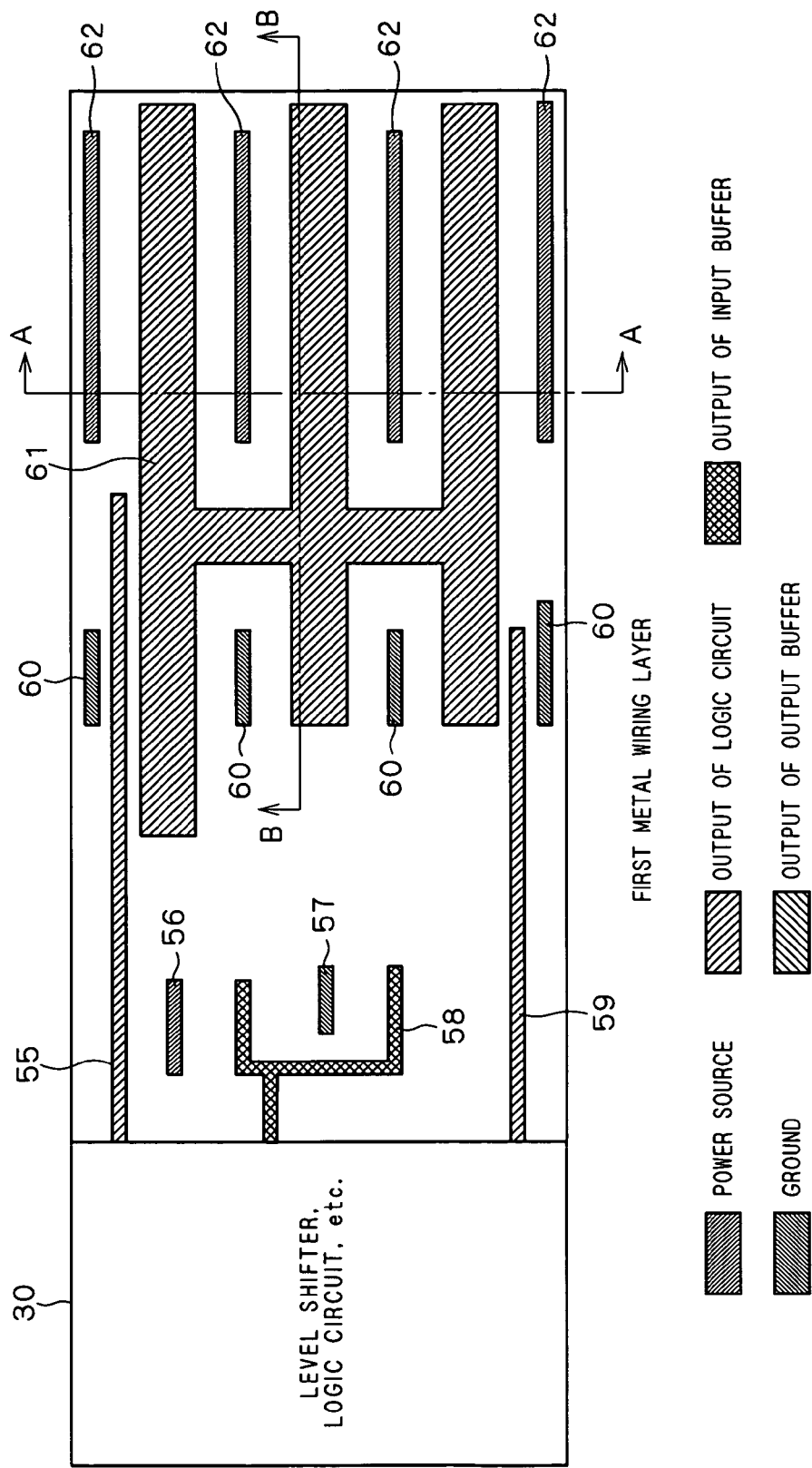

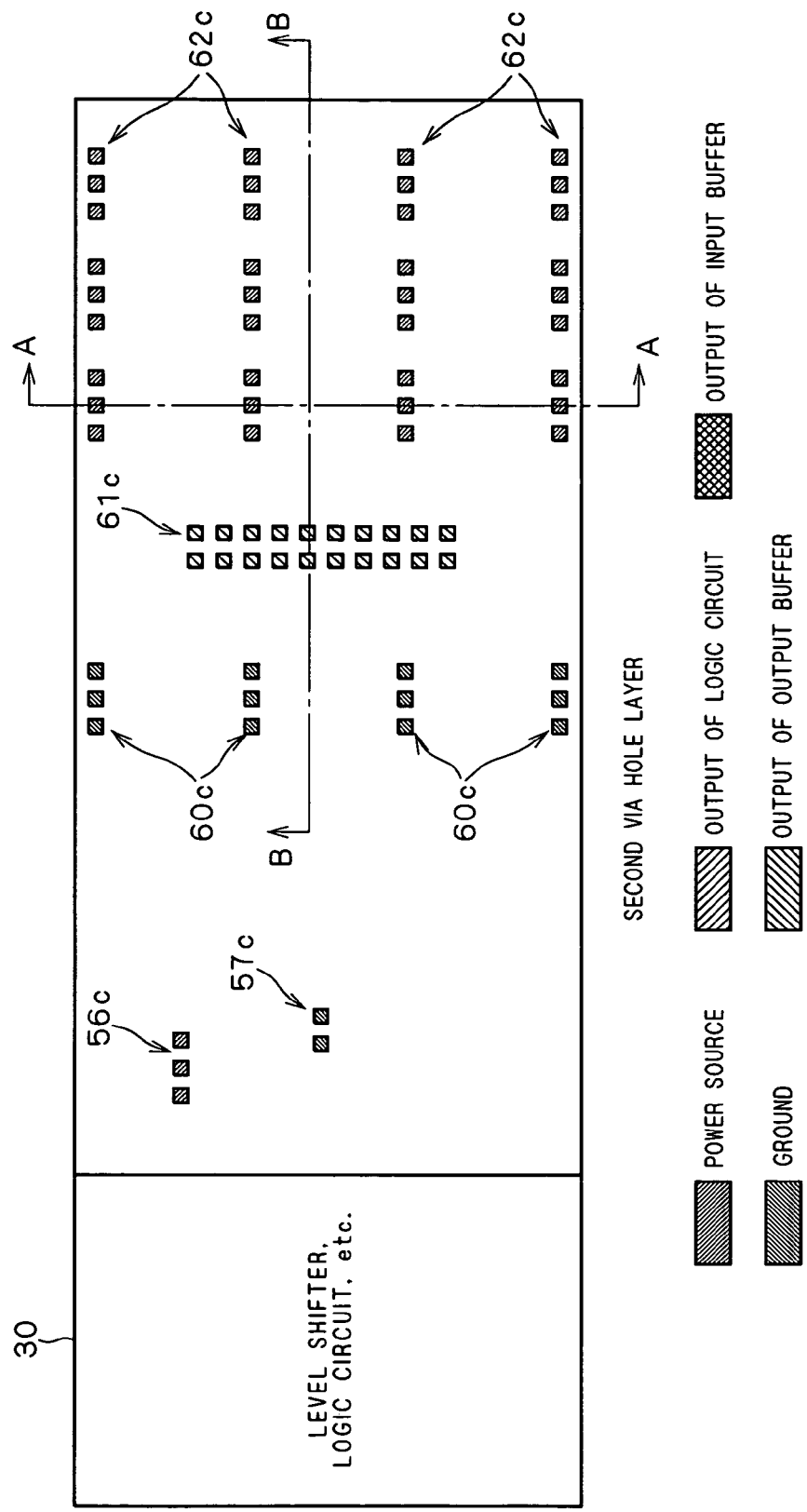

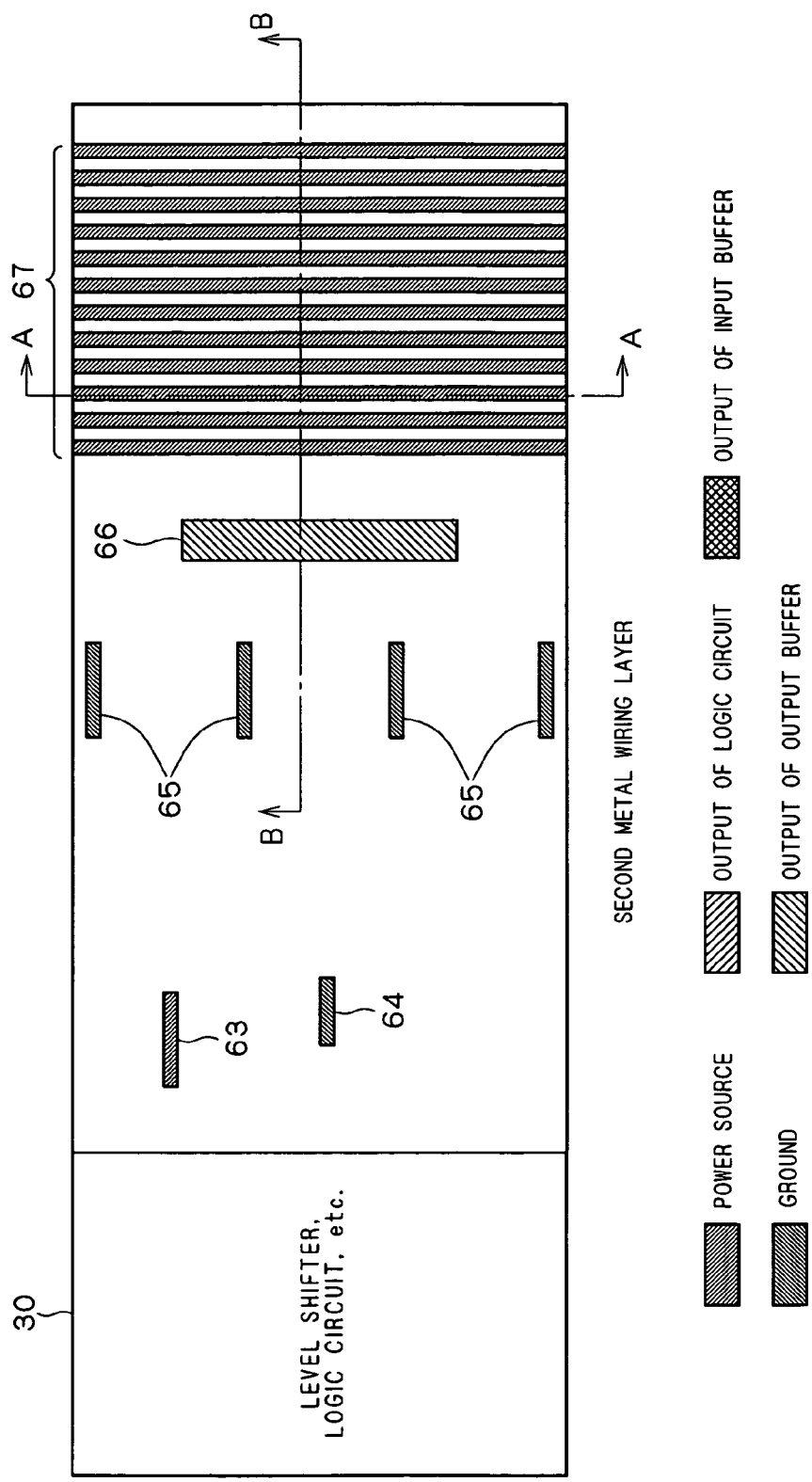

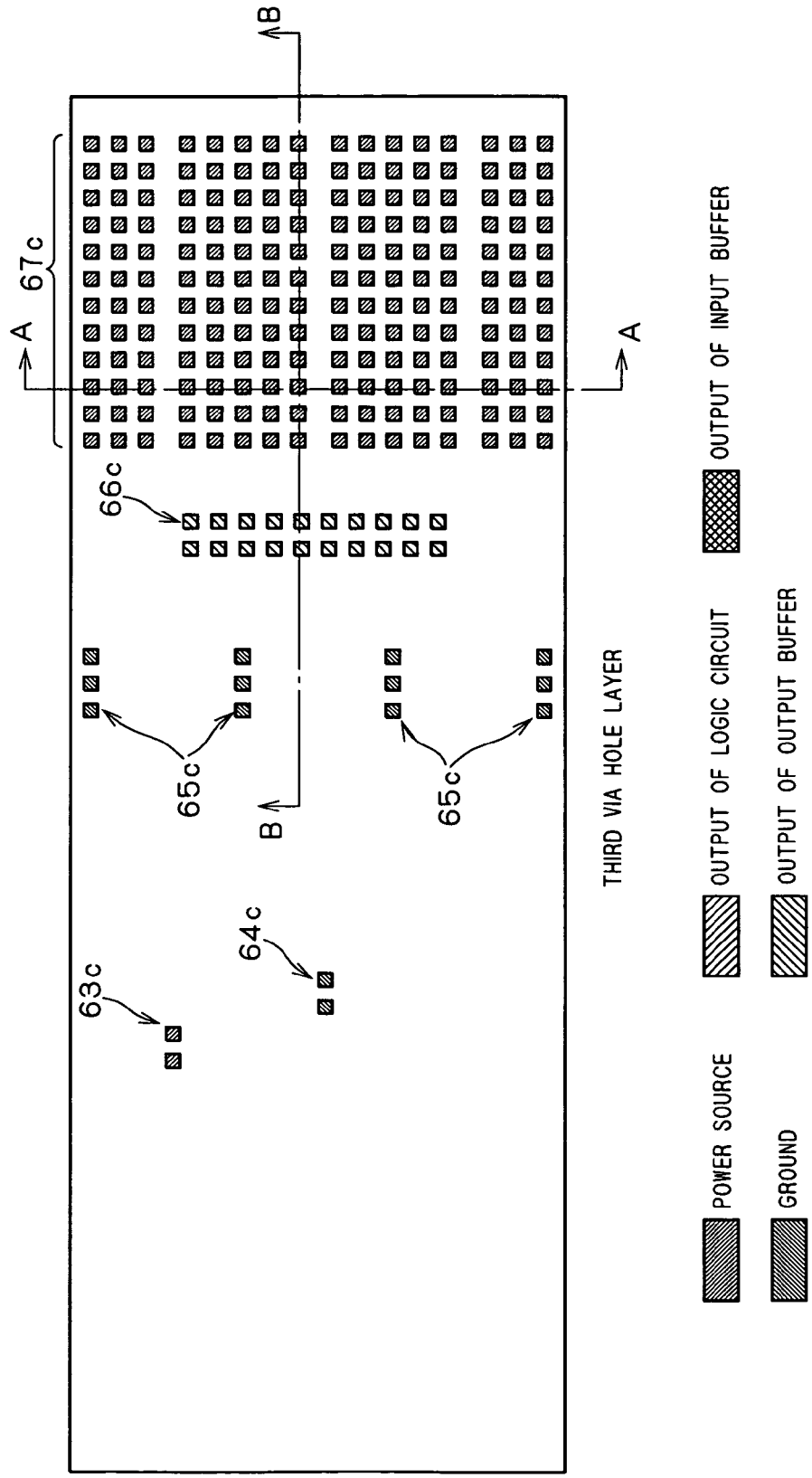

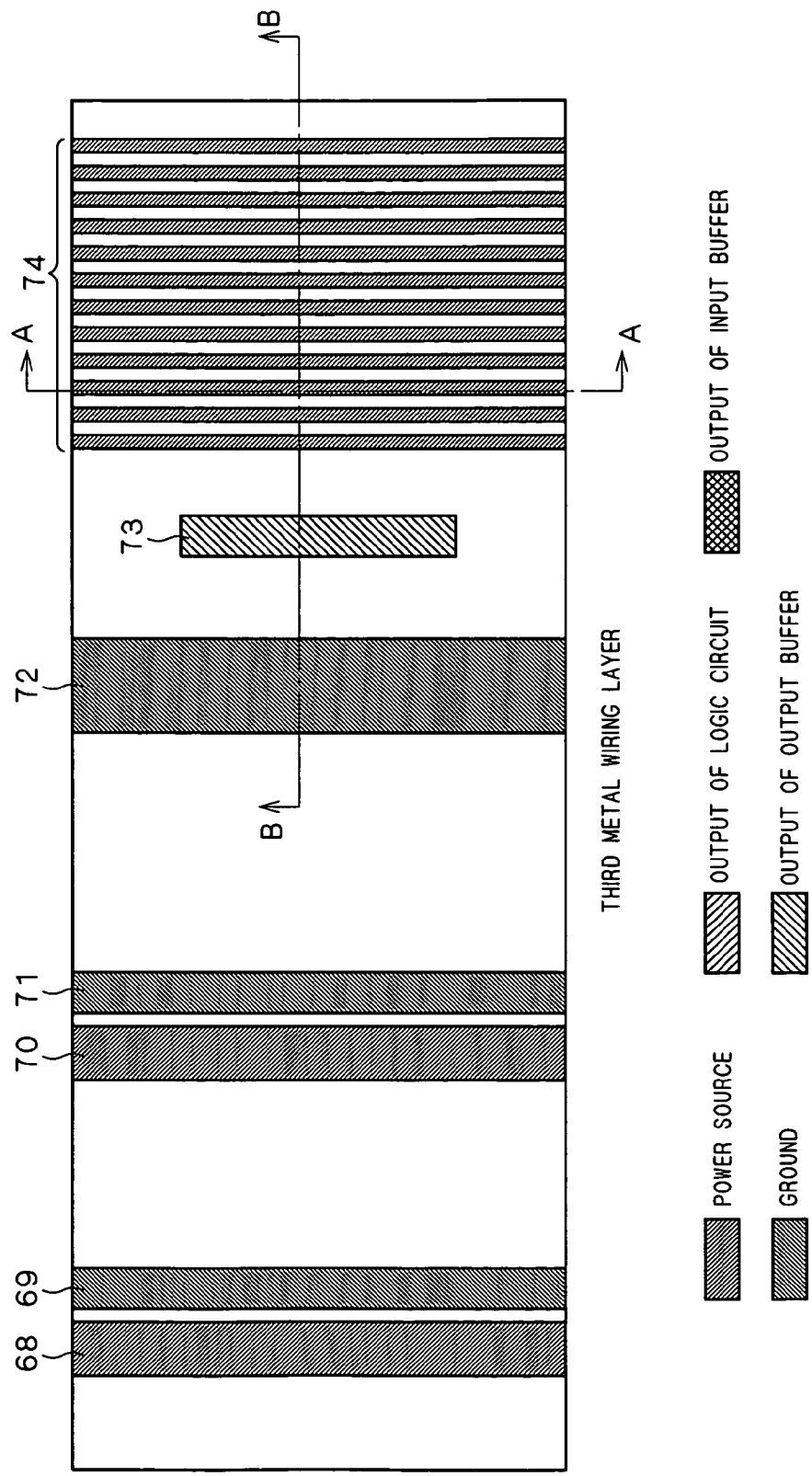

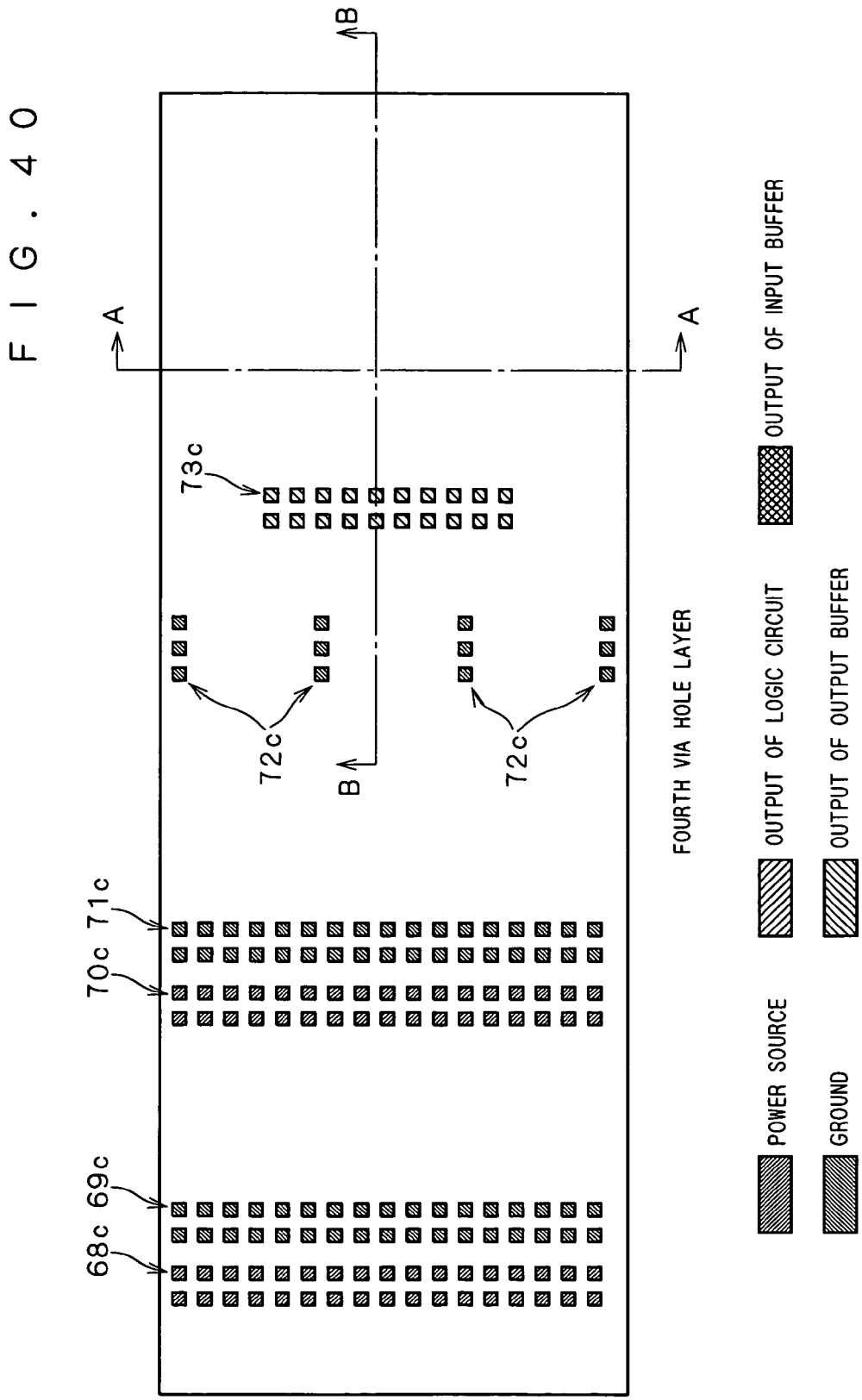

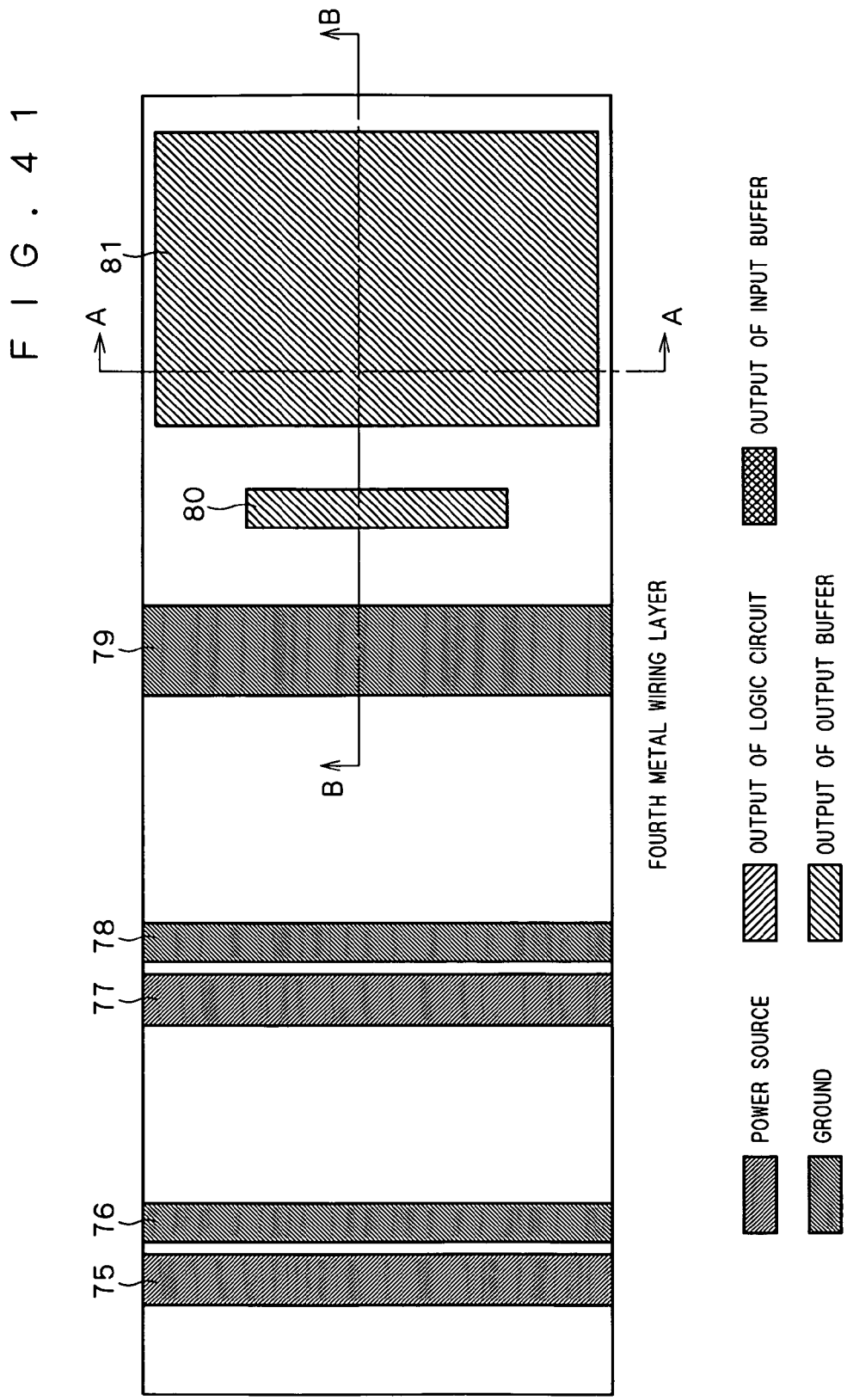

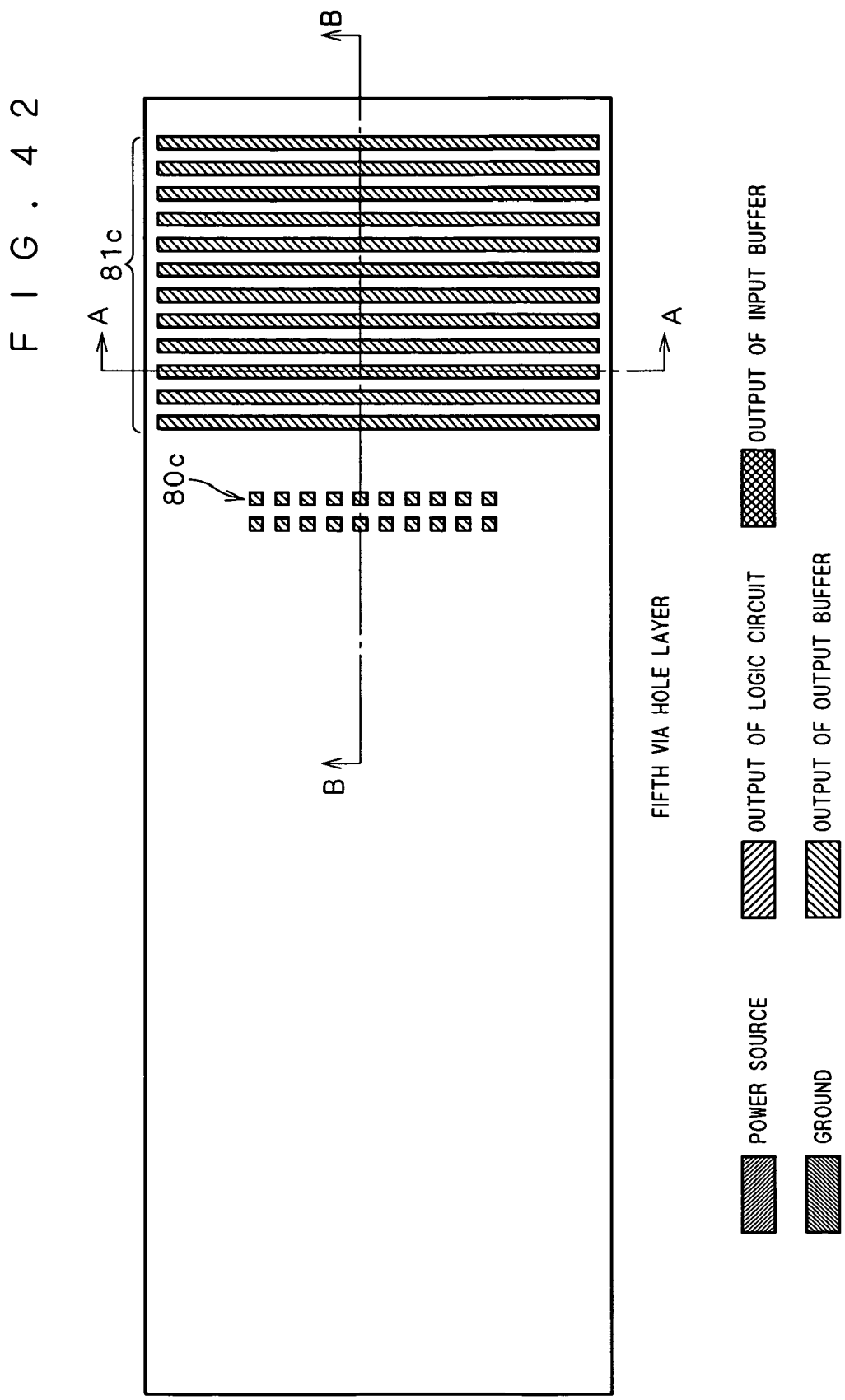

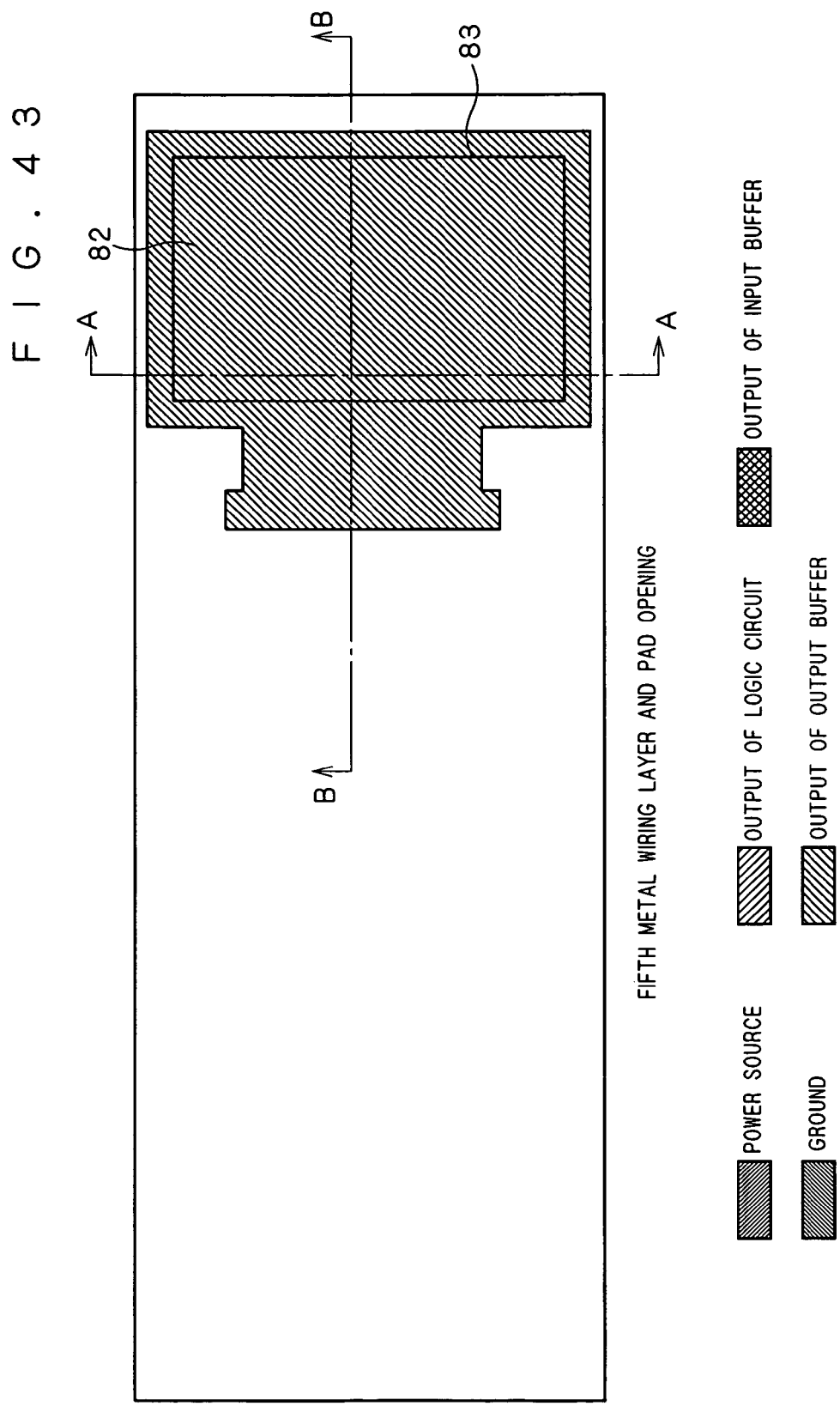

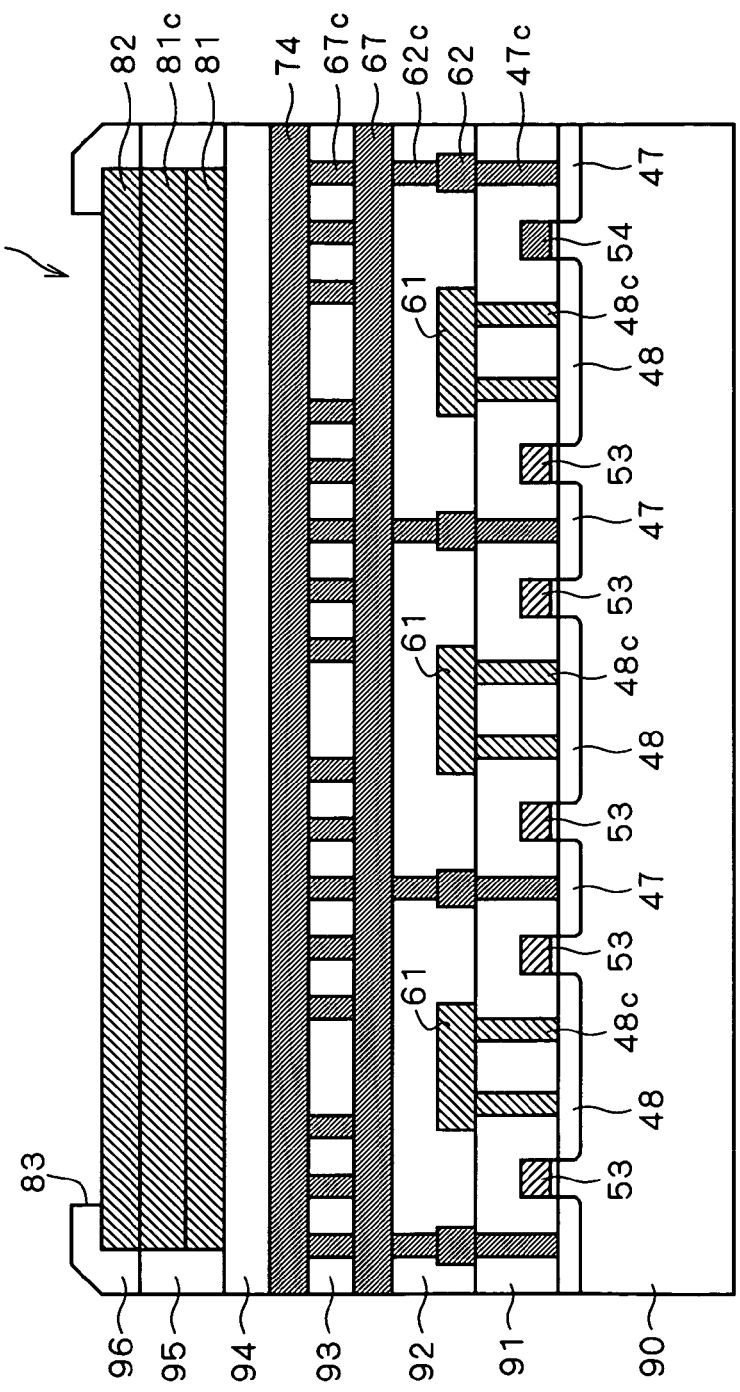

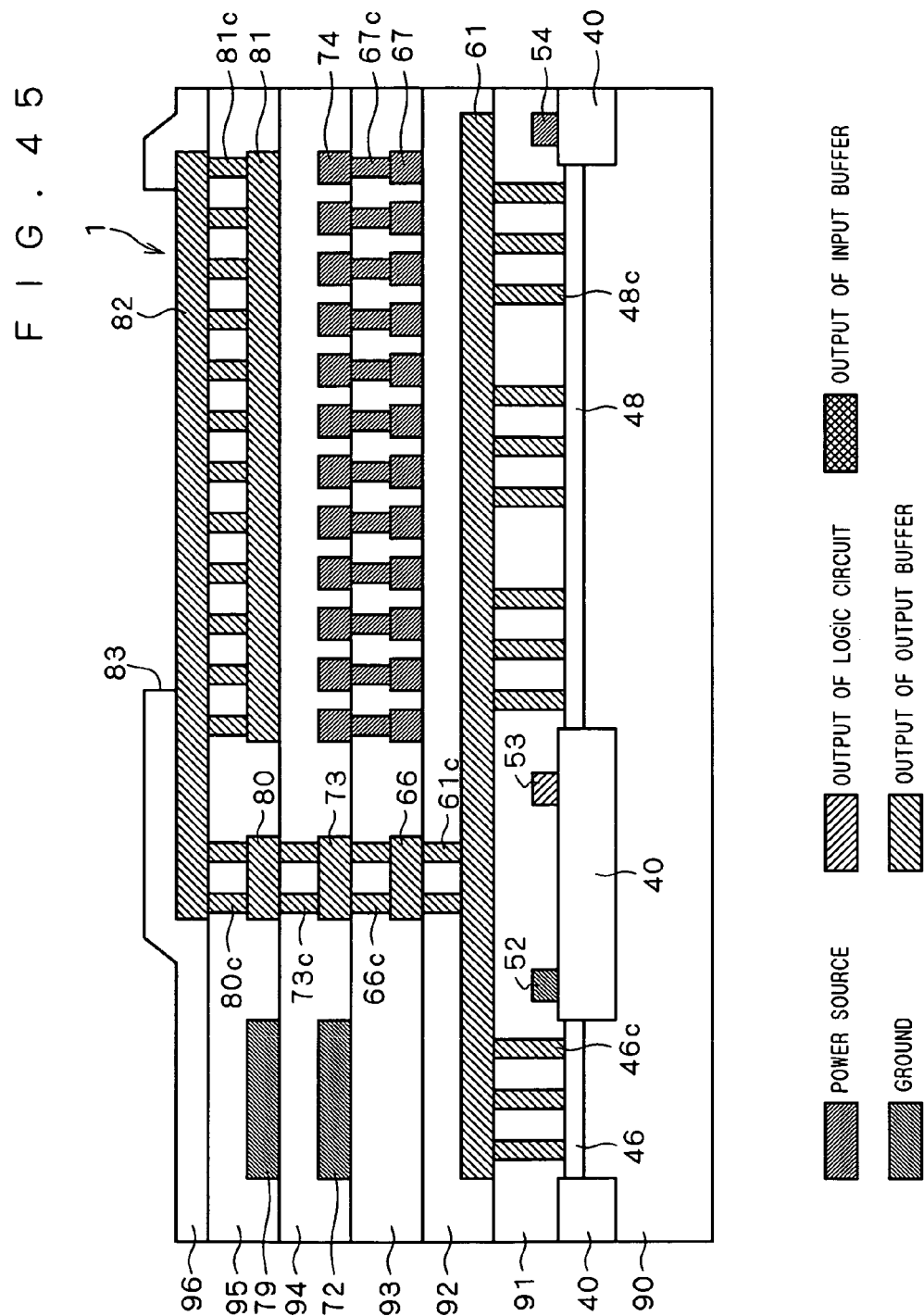

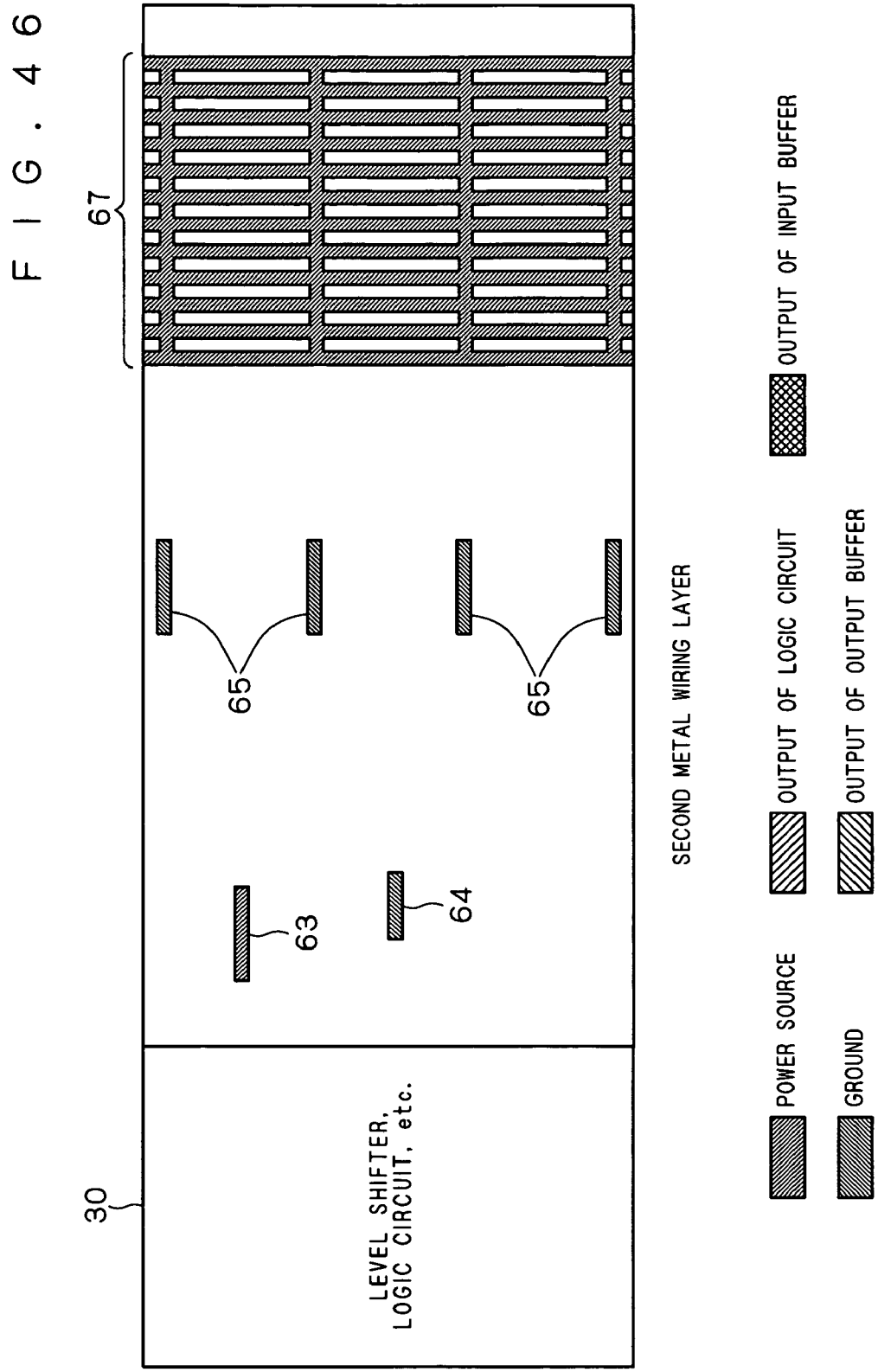

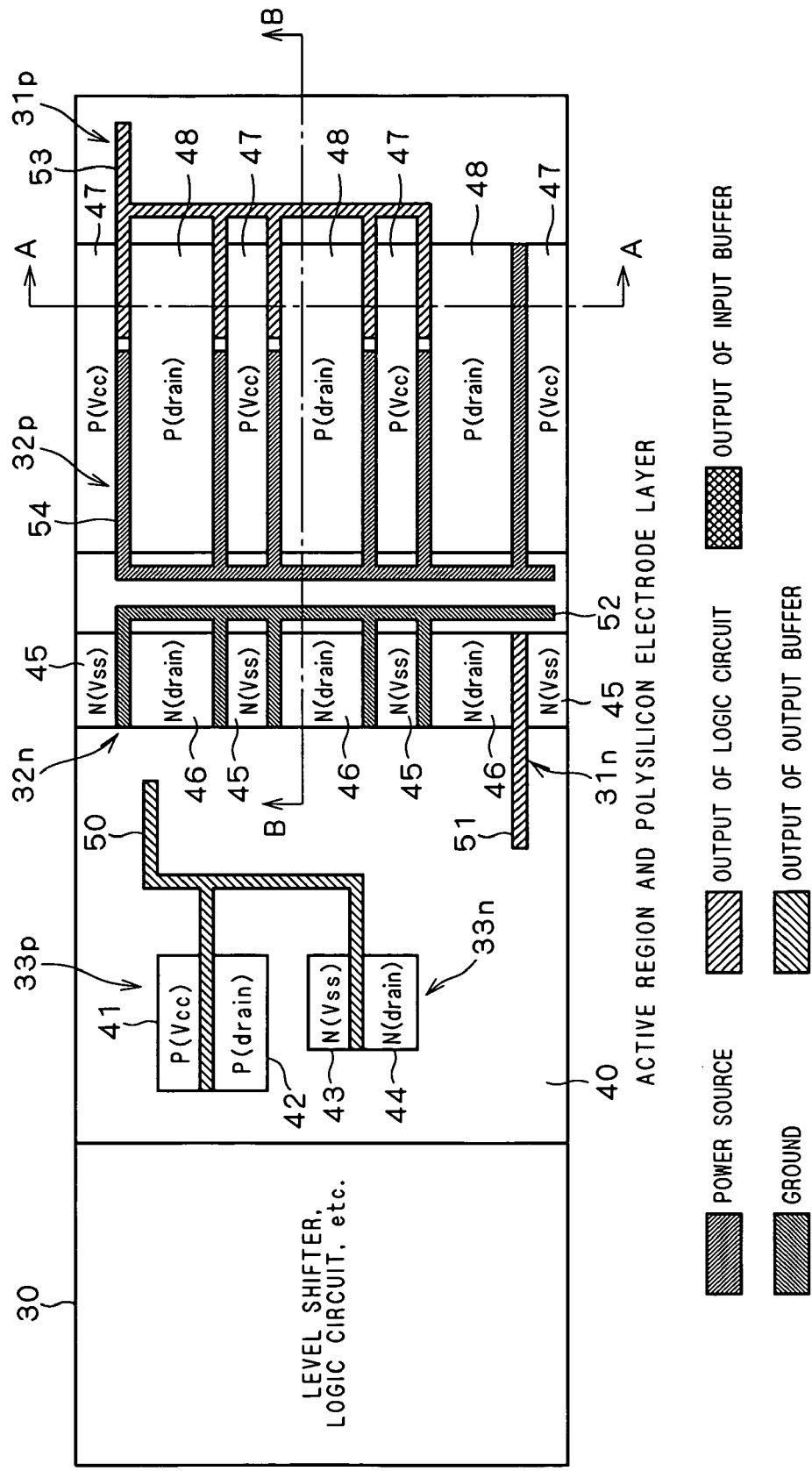

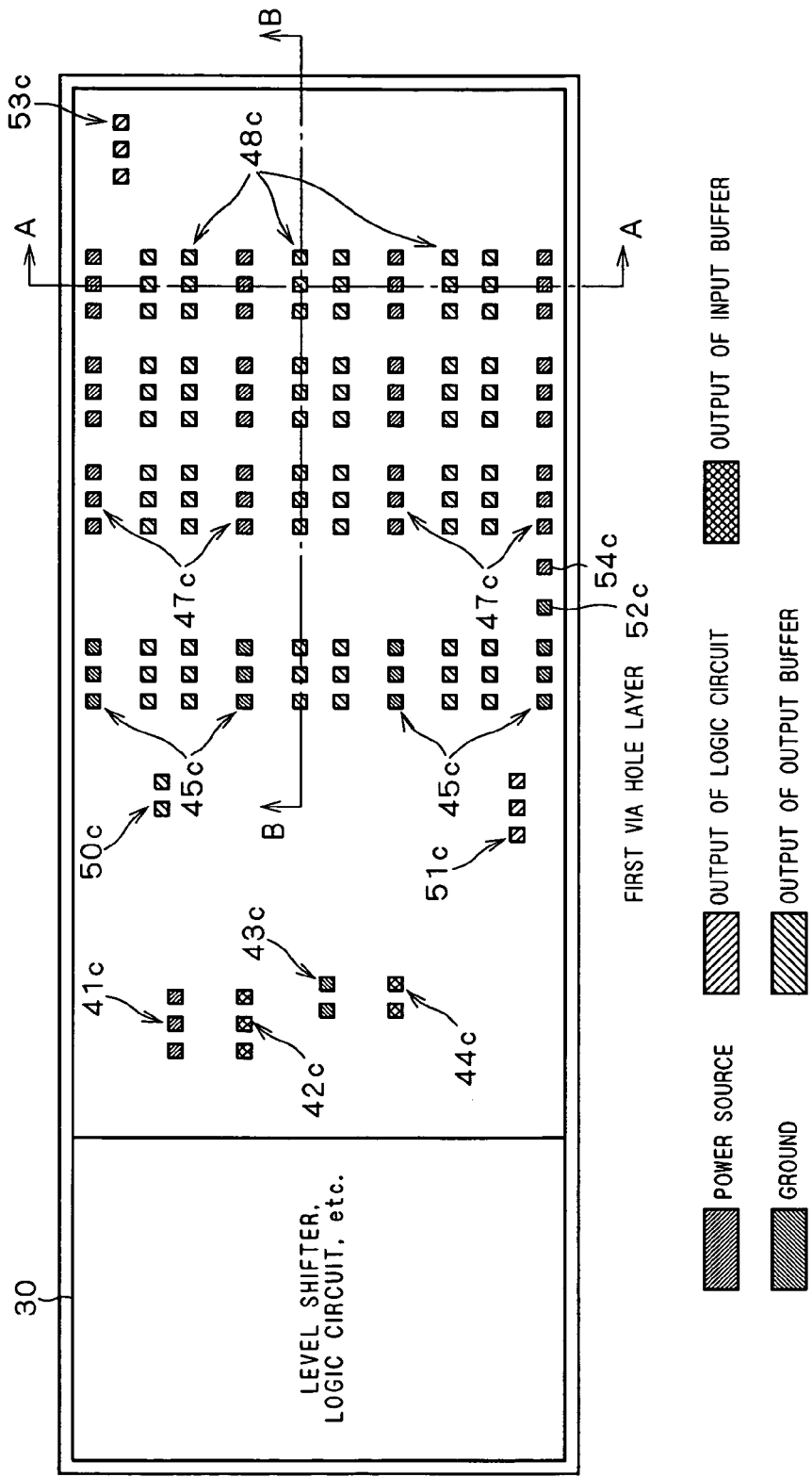

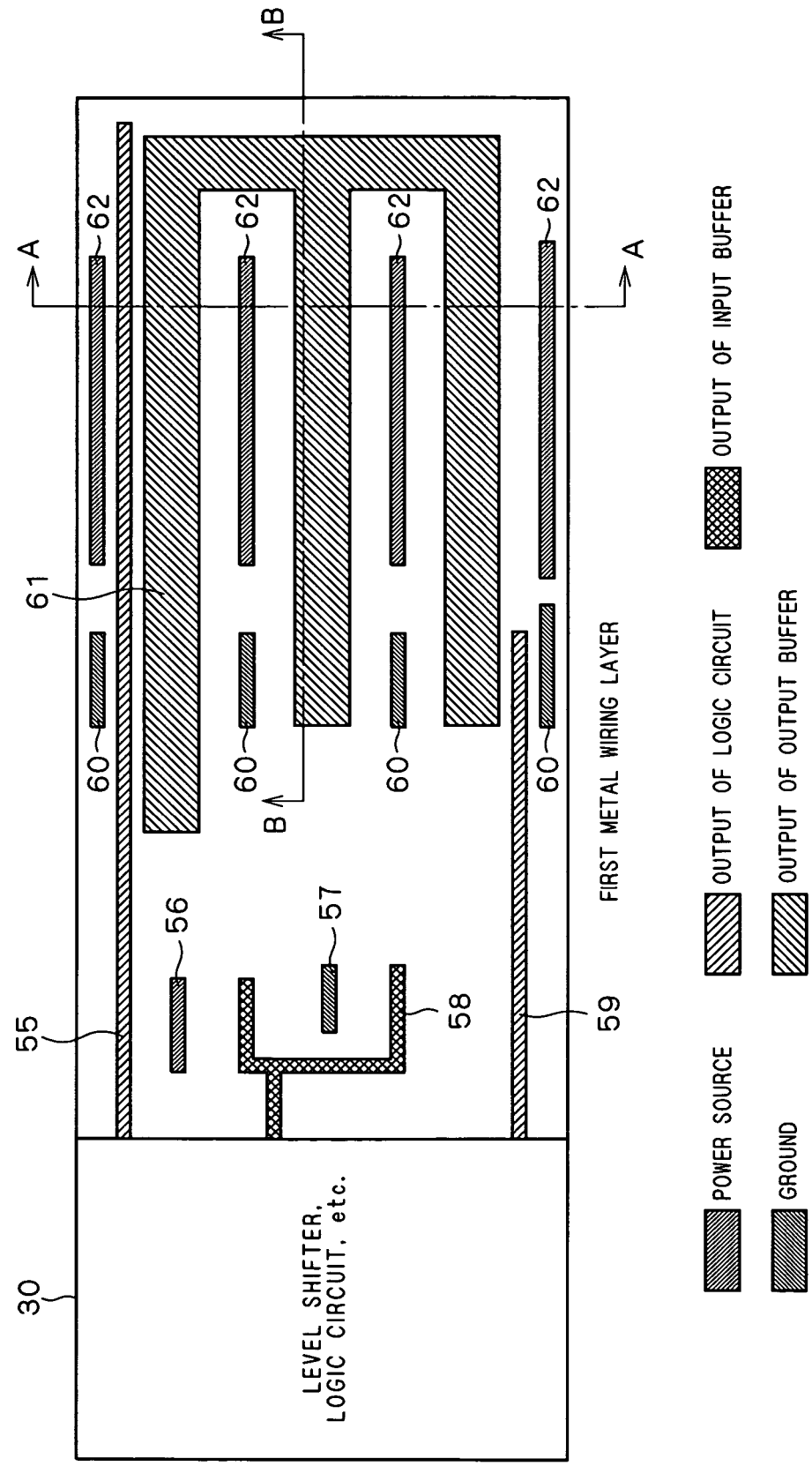

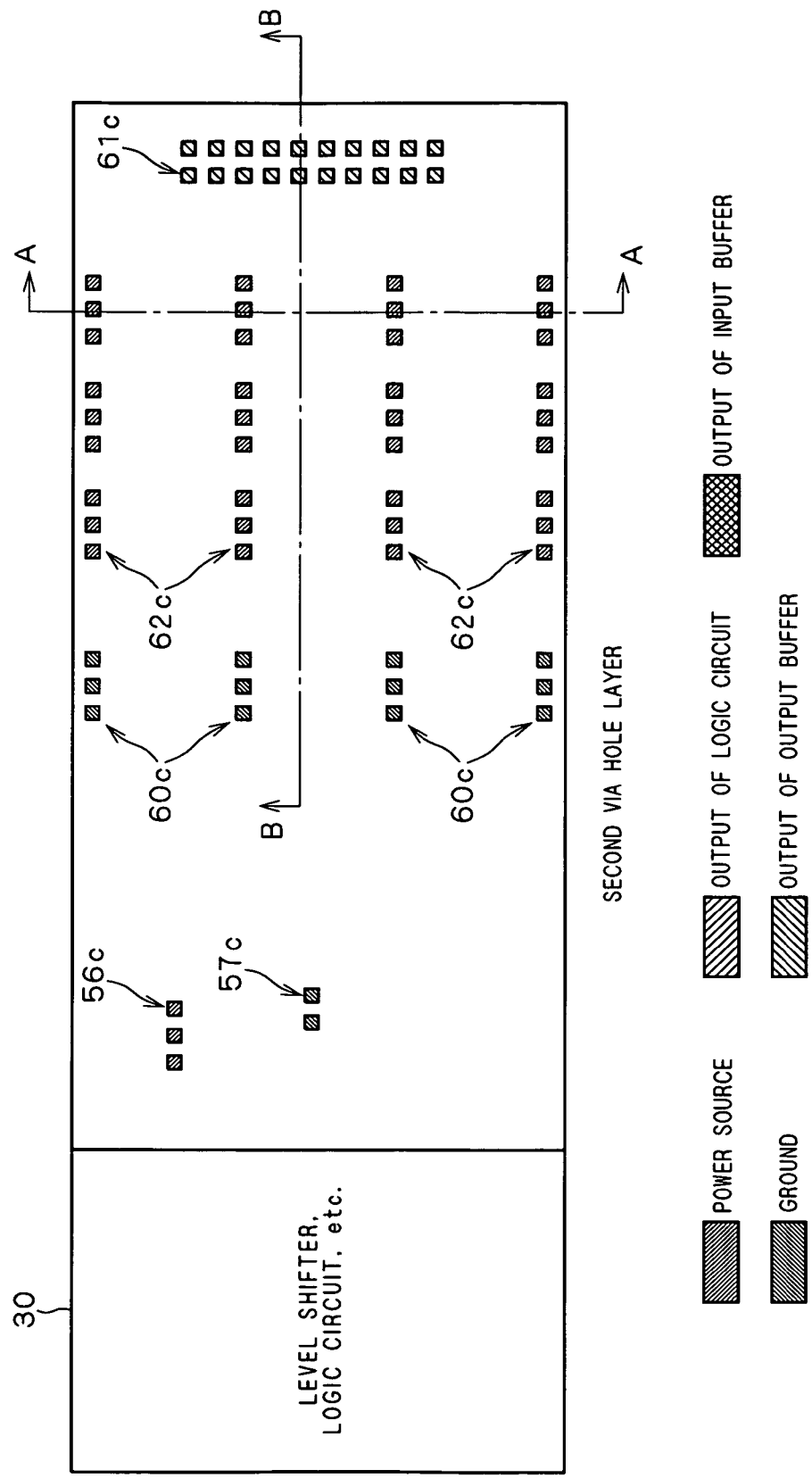

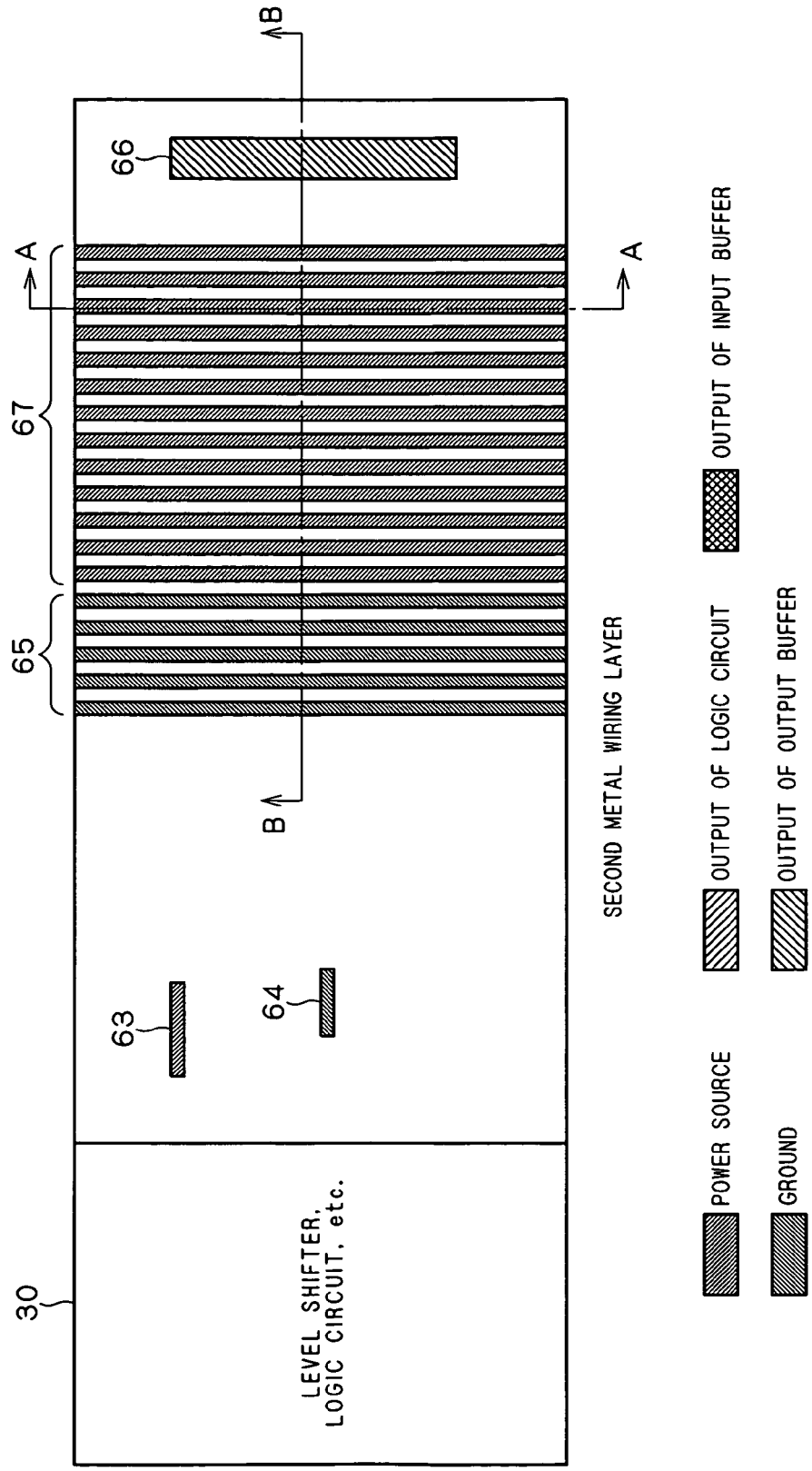

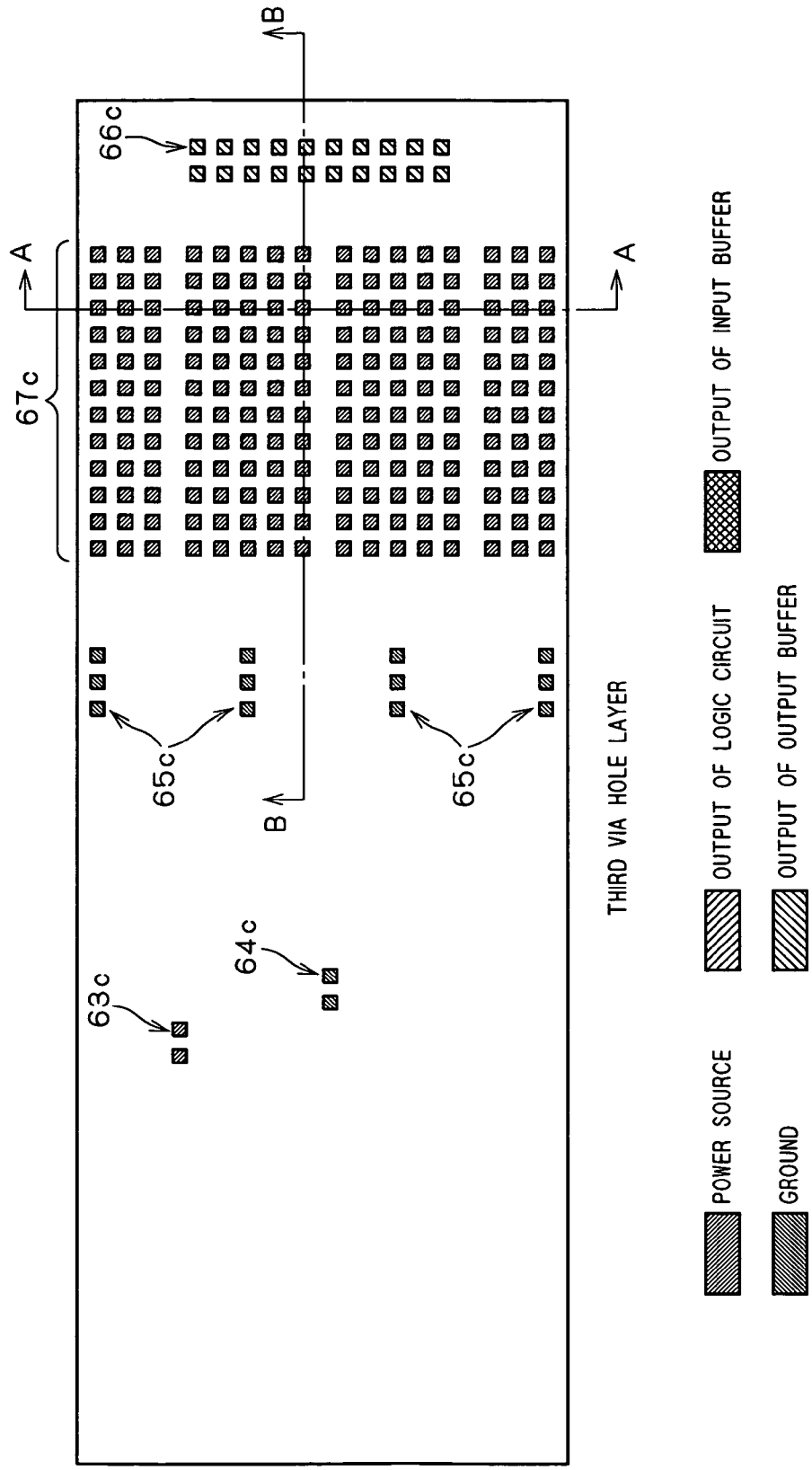

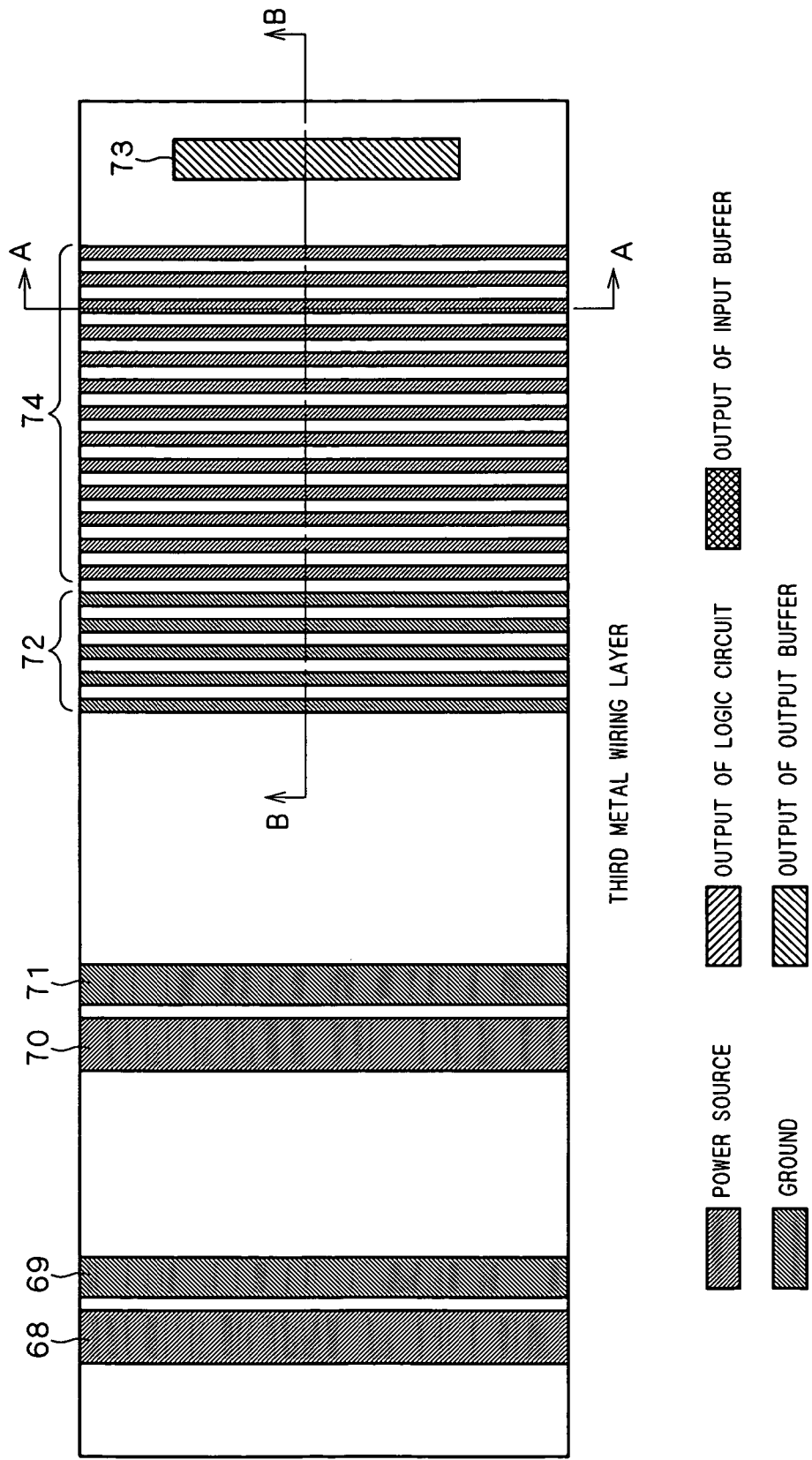

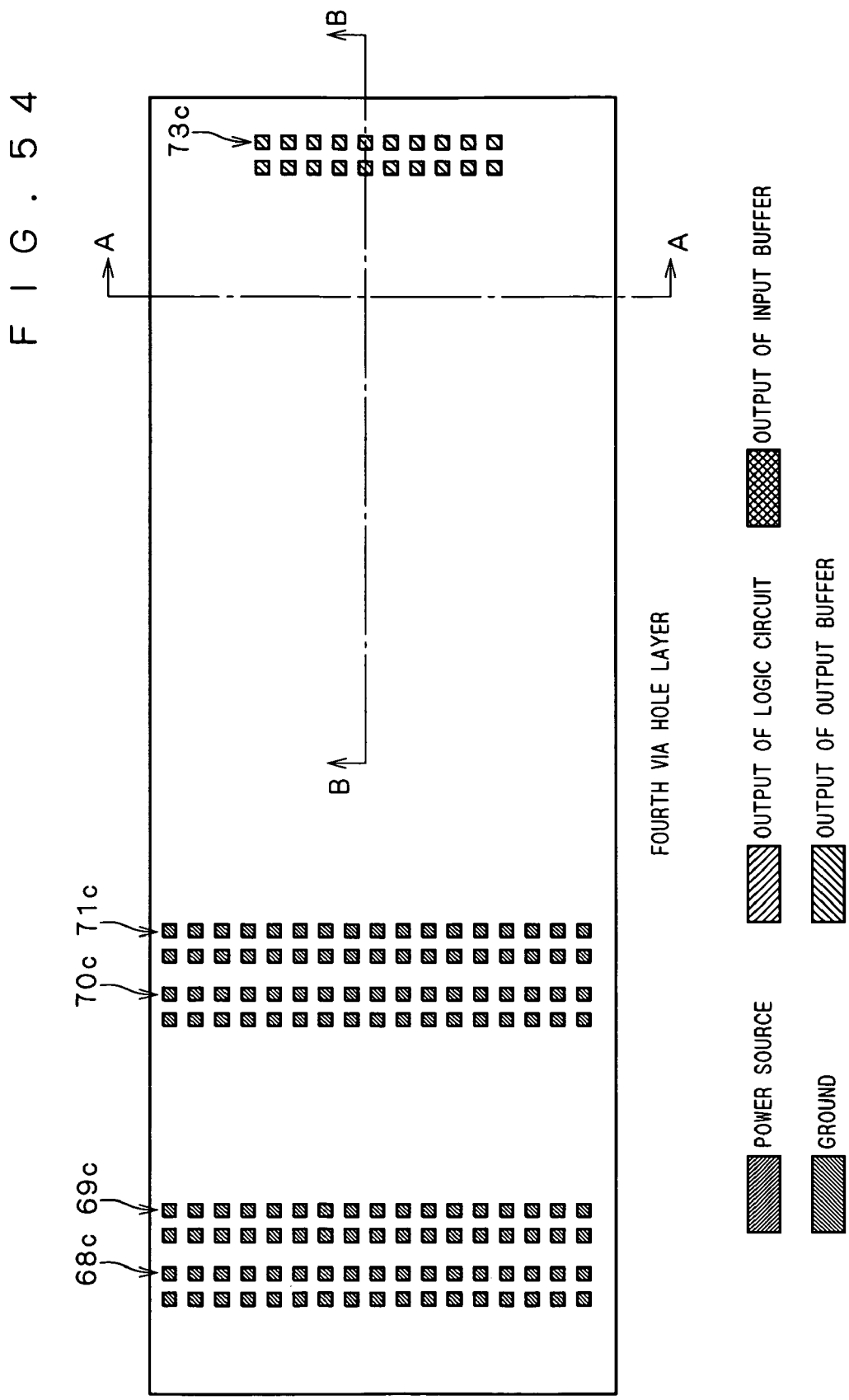

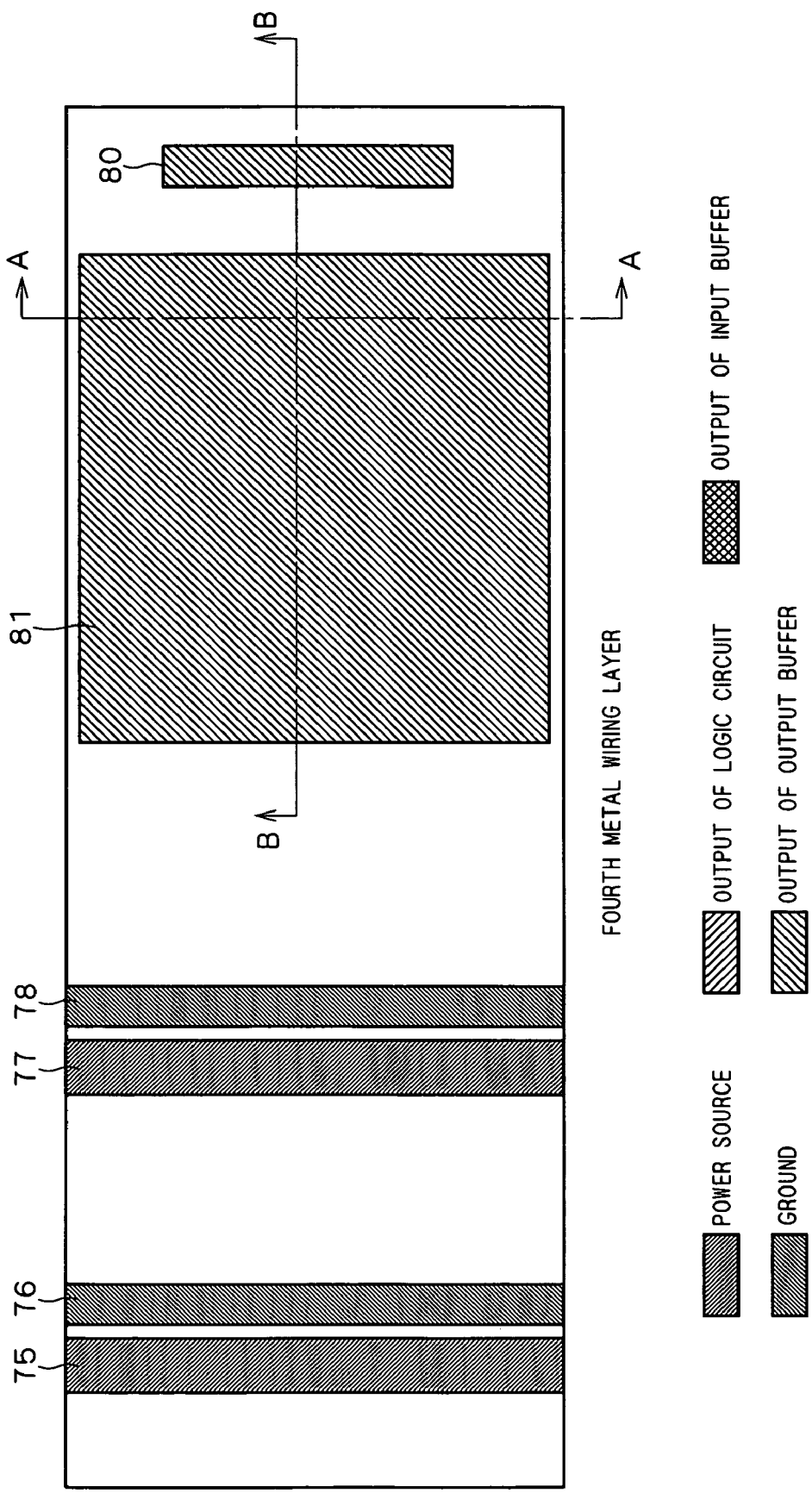

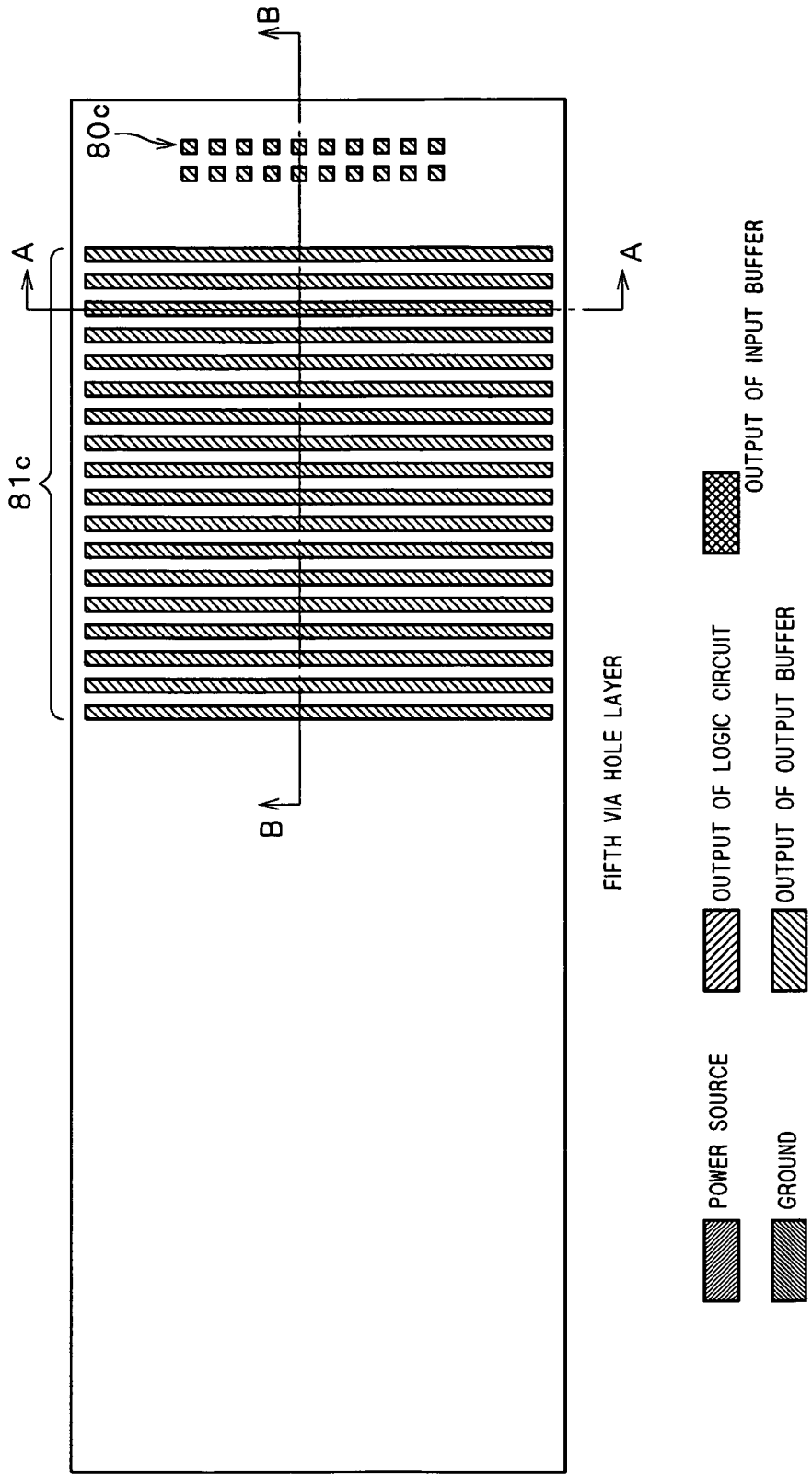

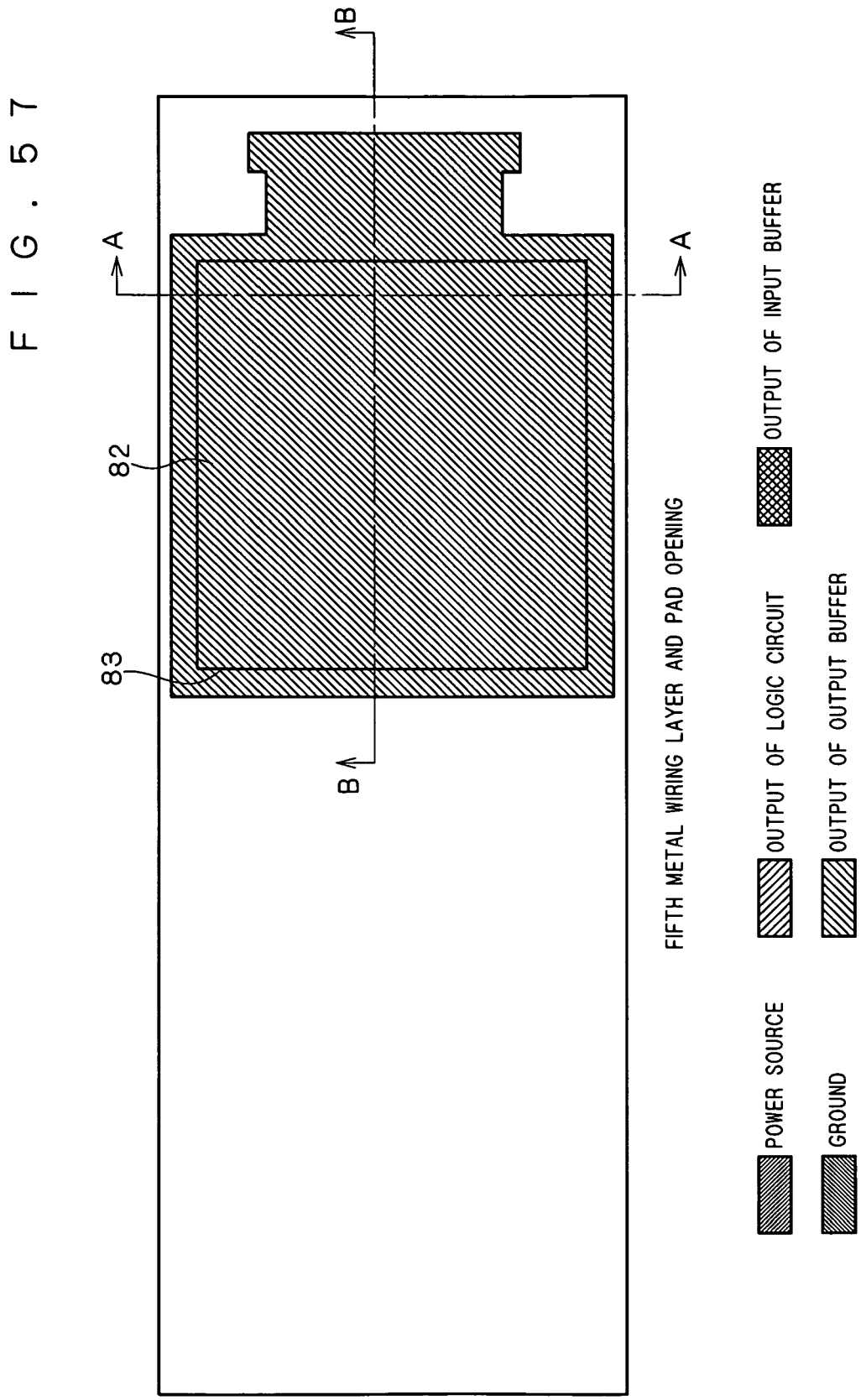

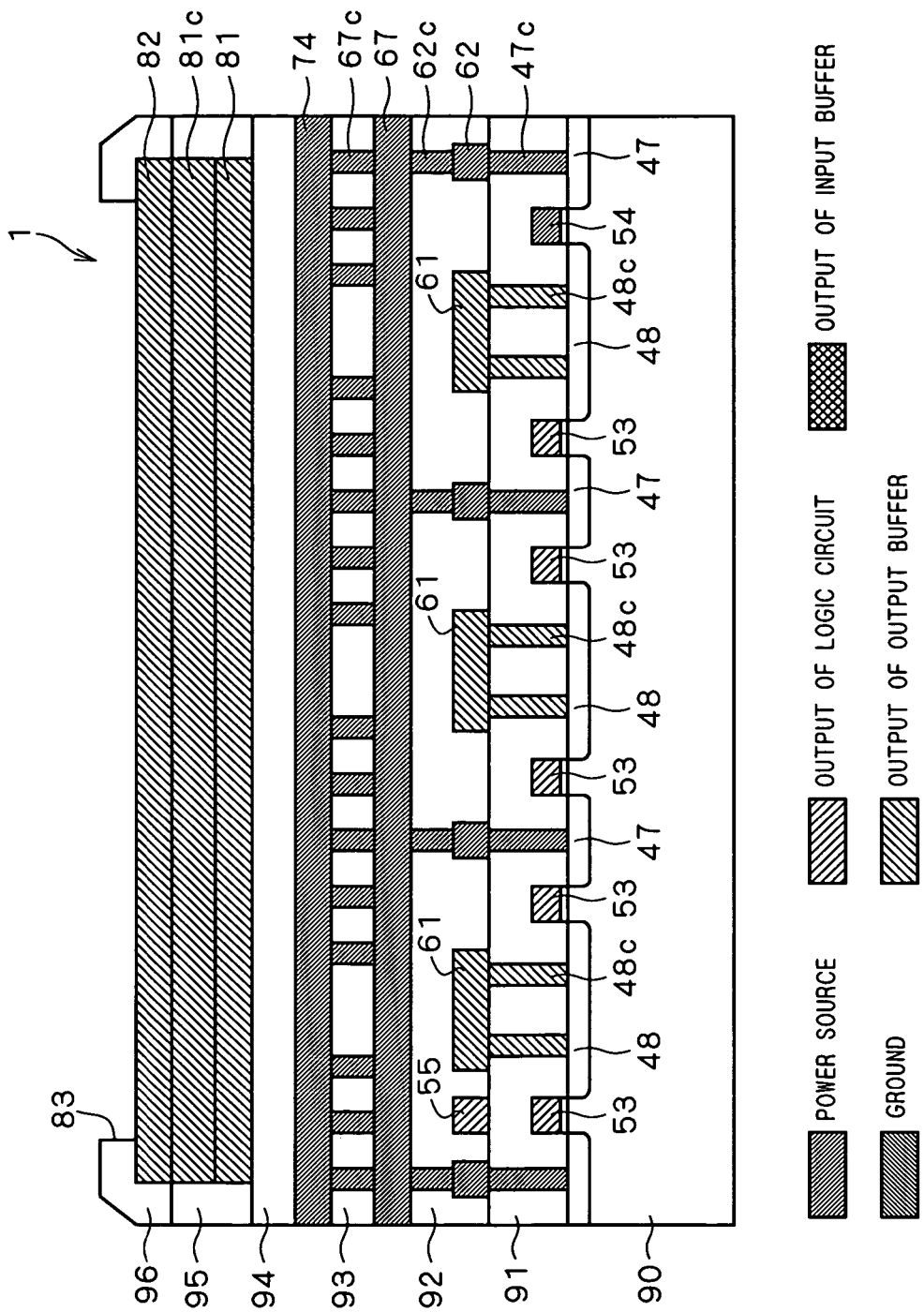

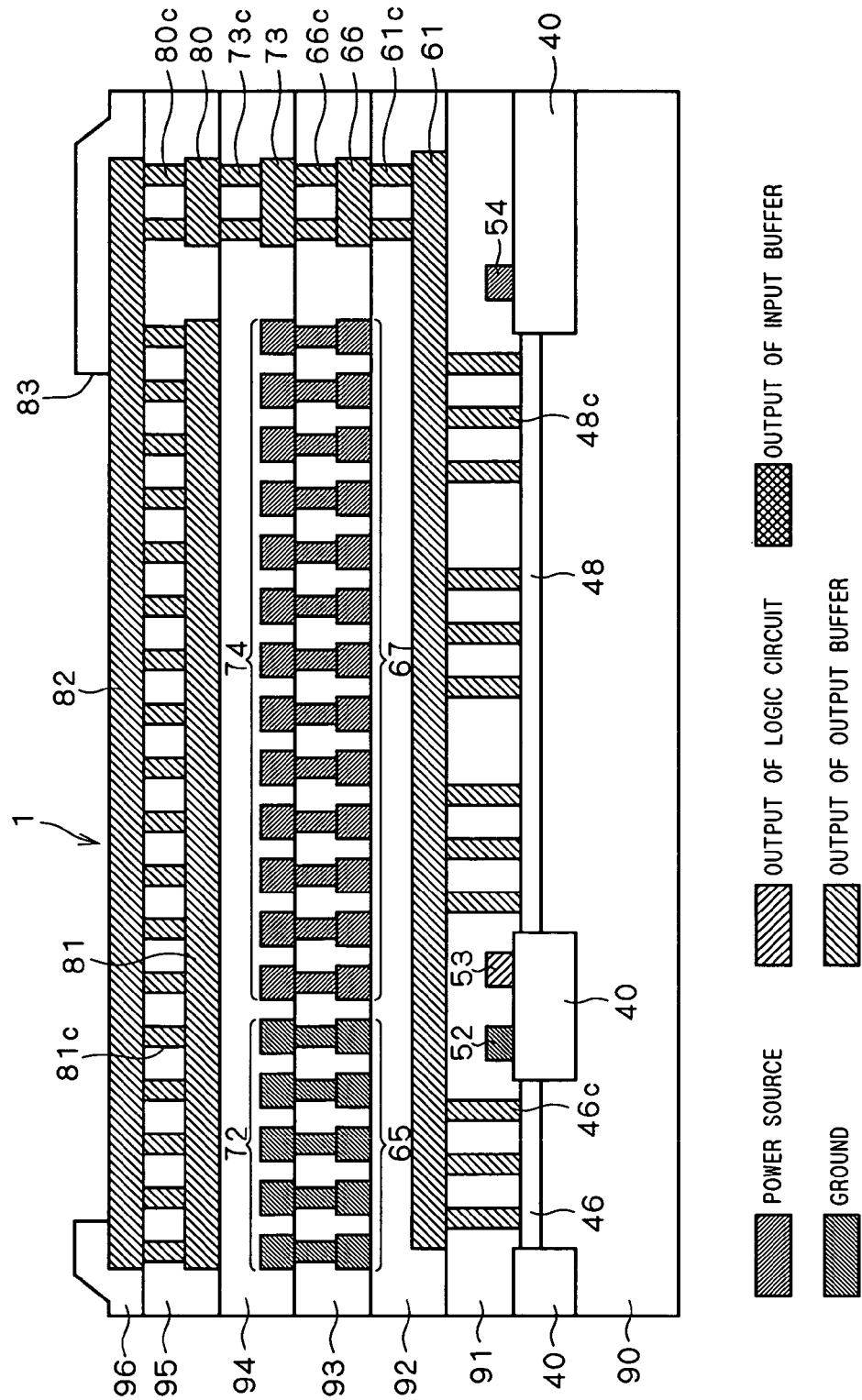

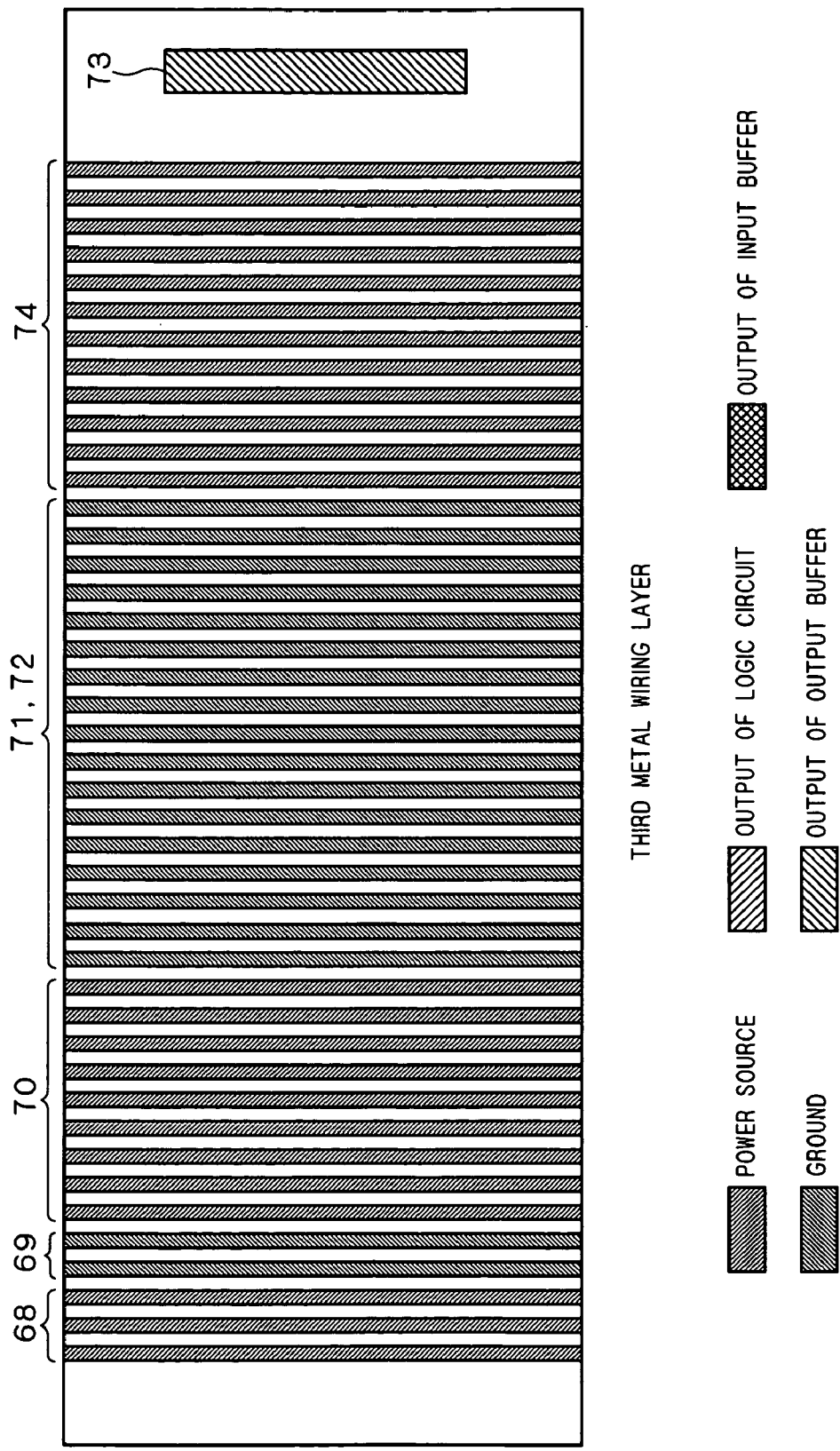

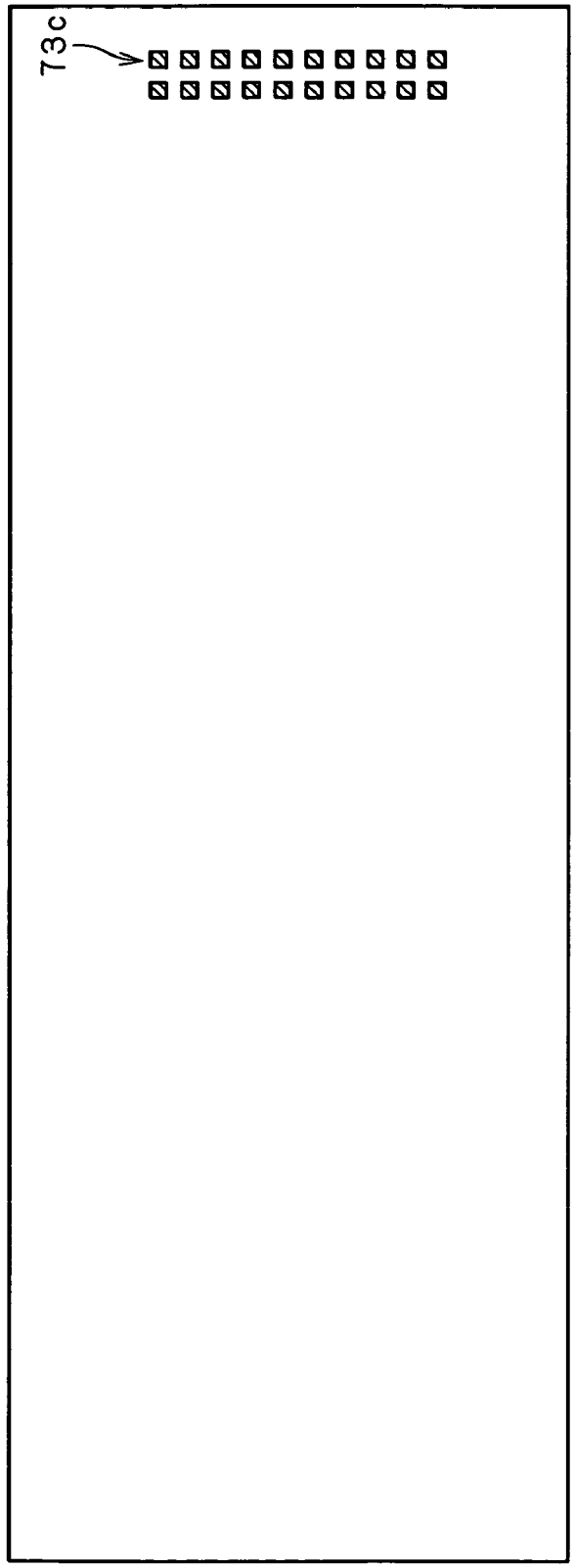

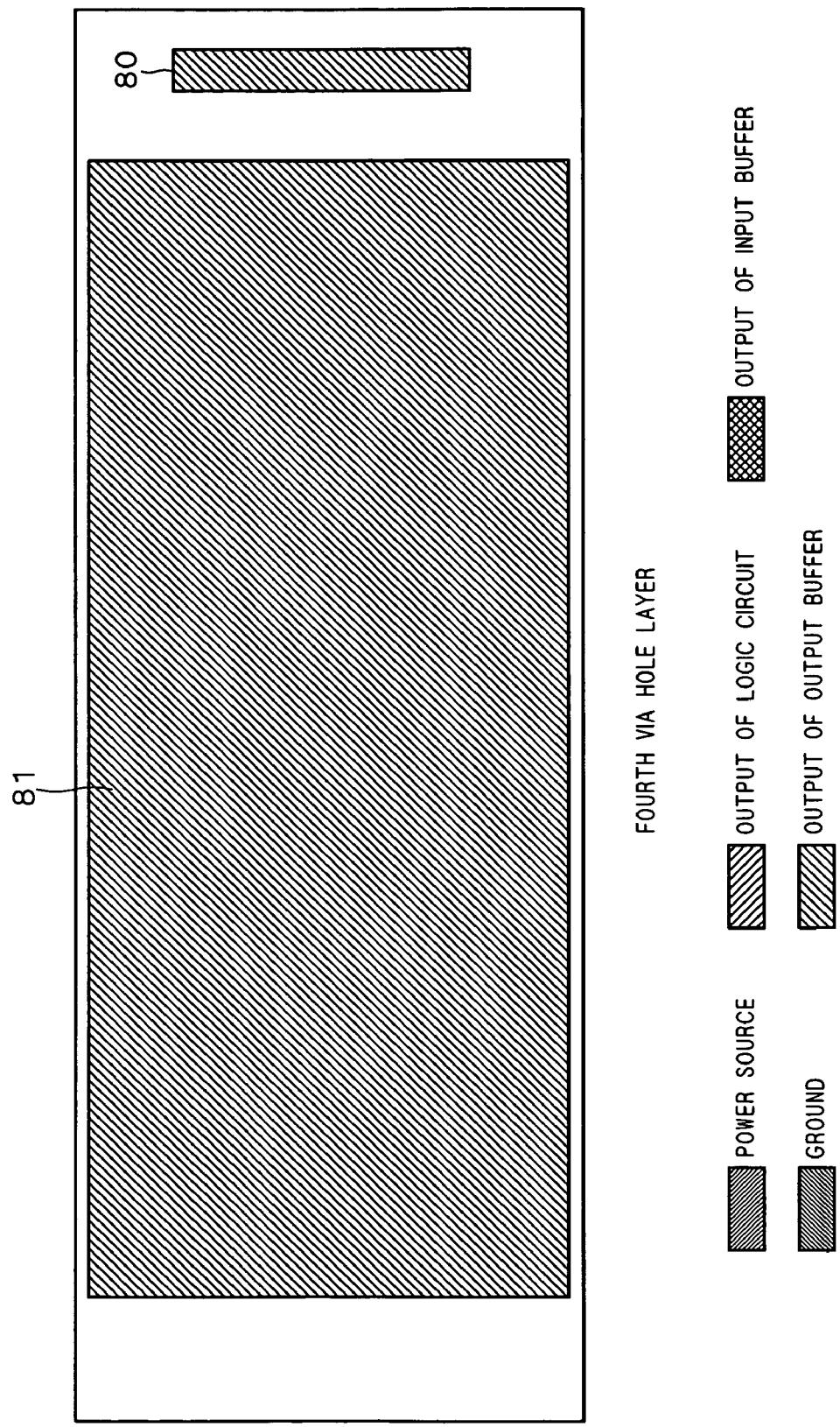

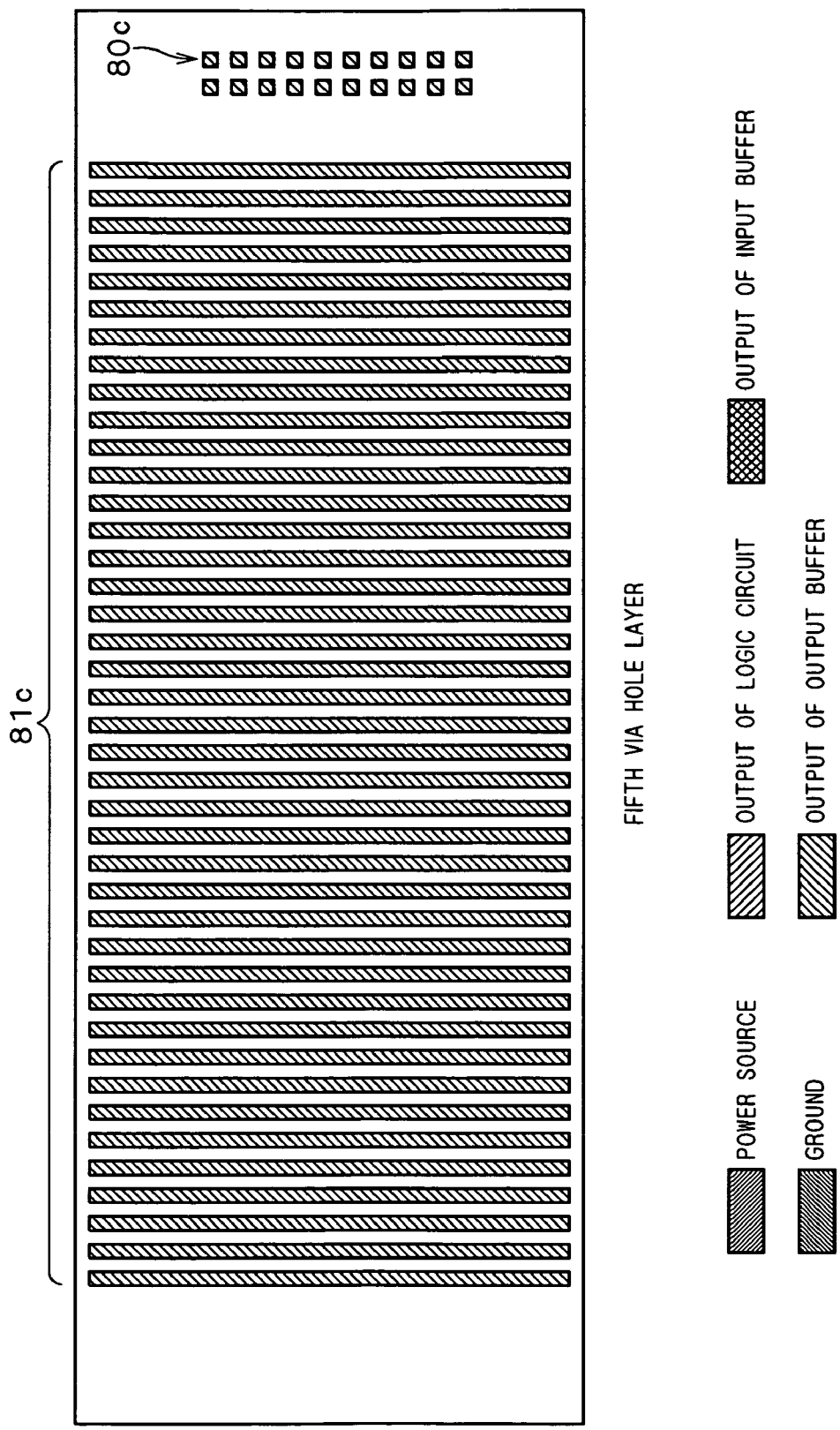

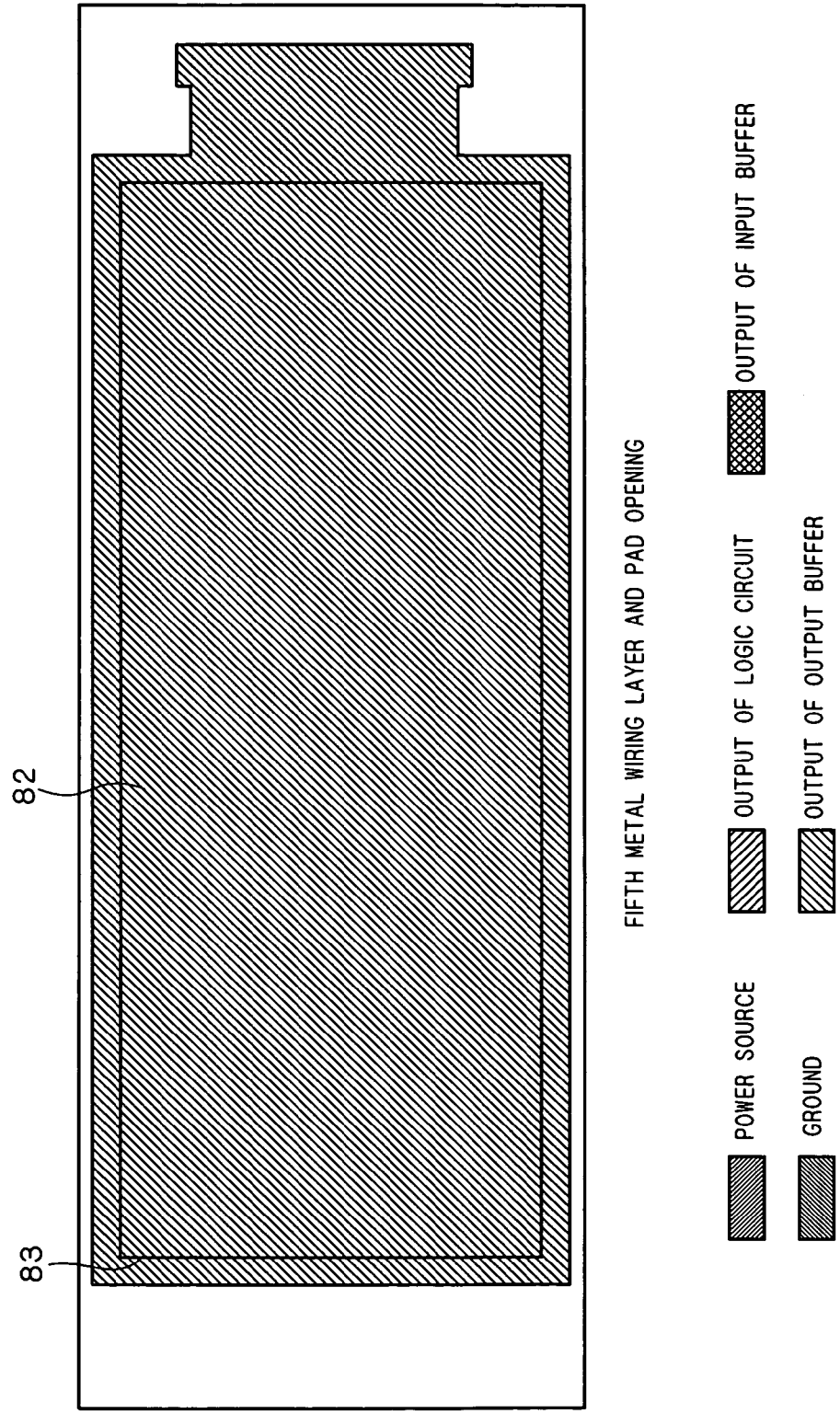

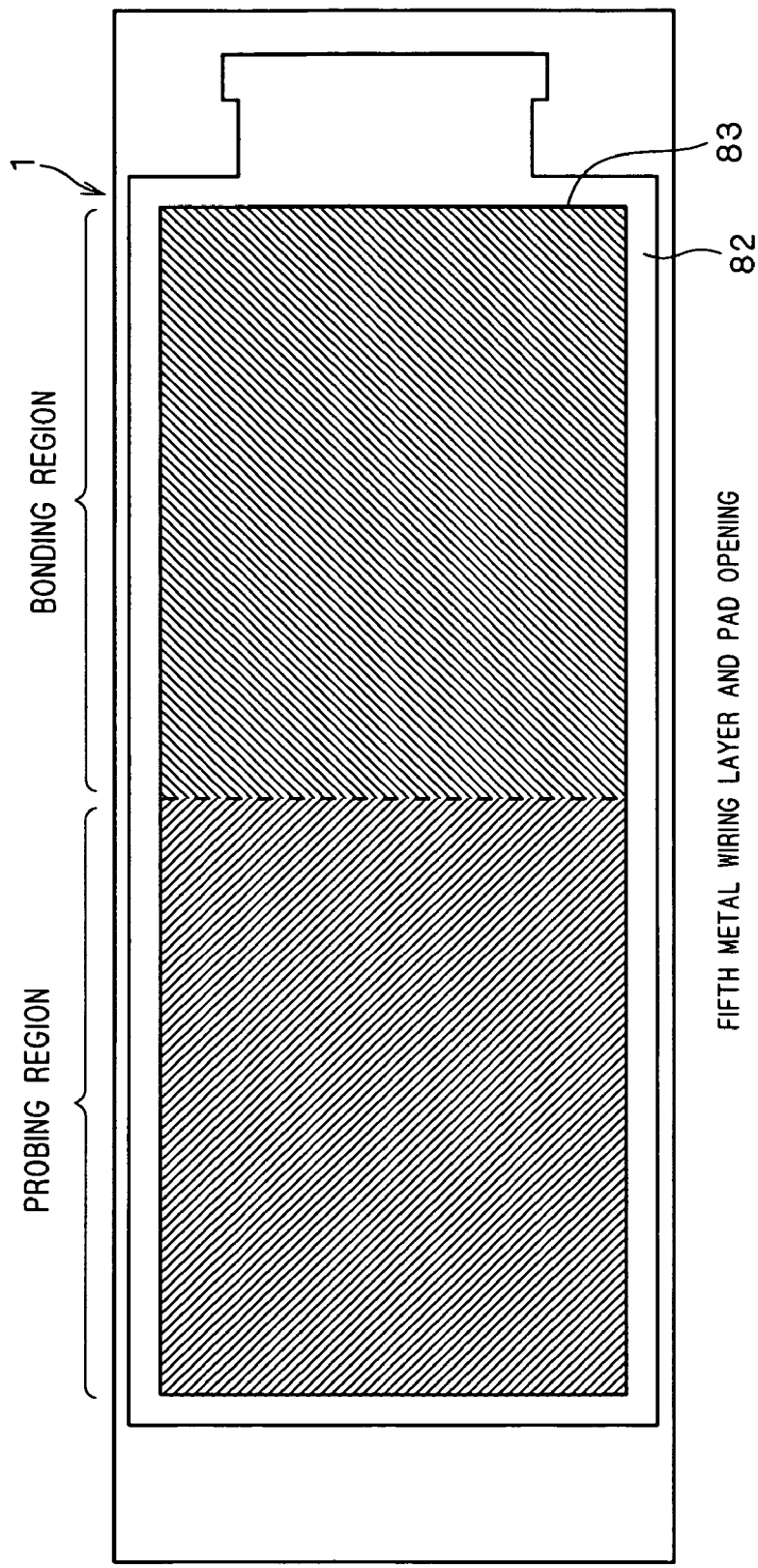

SEMICONDUCTOR DEVICE

RELATED APPLICATION

This application is a national phase of PCT/JP2005/002801 filed on Feb. 22, 2005 which claims priority from Japanese Application No. 2004-051486 filed on Feb. 26, 2004, the disclosures of which Applications are incorporated by reference herein. The benefit of the filing and priority dates of the International and Japanese Applications is respectfully requested.

TECHNICAL FIELD

The present invention relates to a structure of a semiconductor device having a bonding pad, and particularly relates to a technology for improving the strength to a stress applied to a bonding pad in the case of probing or wire bonding.

BACKGROUND ART

A mechanical stress is applied to a bonding pad formed on a semiconductor chip upper surface in the case of probing in an electrical test of a semiconductor chip, and a wire bonding at the time of assembly of a semiconductor device. The stress applied to the bonding pad makes the interlayer insulation film under the pad concerned generate a crack, and has become a cause which causes a pad separation at the time of wire bonding.

Therefore, a method of making the metal layer concerned absorb the stress was conventionally taken by laying a metal layer, such as tungsten, as a foundation of the bonding pad. Usually, a bonding pad is formed using an uppermost wiring layer (top layer wiring layer), and a metal layer of the foundation is formed using a via hole (Via) for connecting an upper wiring layer and the wiring layer under it (lower-layer wiring layer). That is, formation of a foundation metal layer is performed at the same step as the original formation of a via hole for connecting an upper wiring layer and a lower-layer wiring layer.

It is necessary to make the size of a foundation metal layer into same extent as the size of a bonding pad, and it becomes a large caliber extremely as compared with an original via hole. Therefore, in the manufacturing process of a conventional semiconductor device, a via hole (foundation metal layer) of a large caliber and a via hole (original via hole) of a small caliber are formed simultaneously. However, since a via hole of a large caliber differs in an etch rate from a via hole of a small caliber, it is difficult to obtain suitable etching quantity in both the via hole of the large caliber, and the via hole of the small caliber, and the forming accuracy will fall. When making a metal deposit in a via hole, since a via hole of a large caliber takes a long time to bury a metal thoroughly compared with that of a small caliber, the thickness of the metal cannot be fully secured, but it is easy to cause dishing of the upper surface of the via hole of the large caliber, originating from it. That is, since the height of the upper surface of the foundation metal layer becomes uneven, it will become difficult to make uniform the height of the upper surface of the bonding pad formed on it. Sure probing and wire bonding will become difficult when the height of the upper surface of the bonding pad is uneven, and the reliability of the semiconductor device will fall.

On the other hand, the technology which makes a foundation metal layer of a bonding pad a shape of a plurality of lines (shape of a long size) instead of a via hole of a large caliber, and forms it is known (for example, Patent References 1-3). The upper problem will be solved when a foundation metal layer is made into a shape of a plurality of lines.

[Patent Reference 1] Japanese Unexamined Patent Publication No. 2002-110731

[Patent Reference 2] Japanese Unexamined Patent Publication No. Hei 10-199925

[Patent Reference 3] Japanese Unexamined Patent Publication No. Hei 6-196525

However, when a foundation metal layer of a bonding pad is made into a shape of a plurality of lines and formed, as compared with the case where a via hole of a large caliber is formed as a foundation metal layer, we are anxious about strength falling greatly to the stress from a specific direction. In Patent Reference 1, for example, it is disclosed that when a long-side direction of a foundation metal layer (the direction of a line) and an advancement direction of a probe in the case of probing become vertical in plan view (namely, when an applying direction of a stress is vertical to a direction of a line of a foundation metal layer in plan view), it is easy to generate a crack from between the side wall of a line-like foundation metal layer and the interlayer film.

When a crack occurs in an insulating layer under a bonding pad and it reaches even a wiring according to the stress from the outside applied to the bonding pad, the metal migration resistance of the wiring concerned will deteriorate. The structure located so that wirings may pass along a lower part of a bonding pad is in the tendency that the strength is comparatively weak and a crack becomes easy to generate. Therefore, in order to prevent the generation of a crack, it is desirable not to let wirings pass carelessly in the lower part of the bonding pad. However, in order to integrate a semiconductor device highly, the region under a bonding pad is also needed to be used effectively and it is obliged to locate wirings also under the bonding pad.

DISCLOSURE OF THE INVENTION

The present invention is made in order to solve the above problems, and it aims at offering a semiconductor device which can improve the strength to the stress generated at a bonding pad.

A semiconductor device concerning the first aspect of the present invention is provided with a plurality of bonding pads each having a first metal formed using a top layer wiring layer, and a plurality of second metals each of which has a line shape, is arranged under the first metal, and is connected with the first metal concerned, wherein the bonding pads are put in order and located to a long-side direction of the second metal which has a line shape.

A semiconductor device concerning the second aspect of the present invention is provided with a bonding pad having a first metal formed using a top layer wiring layer, and a plurality of second metals each of which has a line shape, is arranged under the first metal, and is connected with the first metal concerned, wherein the second metals are embedded in an insulating layer under the first metal, and an upper part is connected mutually in the insulating layer concerned.

A semiconductor device concerning the third aspect of the present invention is provided with a bonding pad having a first metal formed using a top layer wiring layer, and a plurality of second metals each of which has a line shape, is arranged under the first metal, and is connected with the first metal concerned, wherein the semiconductor device concerned has a first lower-layer wiring layer of one layer under than the top layer wiring layer; and the bonding pad has an etching stopper which is arranged under the second metal and formed using a barrier metal of the first lower-layer wiring layer front surface.

A semiconductor device concerning the fourth aspect of the present invention comprises: a bonding pad; a wiring which passes along a lower part of the bonding pad; and a plurality of metals of predetermined shape over the wiring in a region of a lower part of the bonding pad.

A semiconductor device concerning the fifth aspect of the present invention comprises: a bonding pad; an output buffer which outputs a signal to the bonding pad; an input buffer into which a signal applied to the bonding pad is inputted; and an internal circuit connected to an input side of the output buffer, and to an output side of the input buffer; wherein the bonding pad is formed above the output buffer, and is not formed above the input buffer and the internal circuit.

A semiconductor device concerning the sixth aspect of the present invention comprises: a bonding pad; an output buffer which outputs a signal to the bonding pad; an input buffer into which a signal applied to the bonding pad is inputted; and an internal circuit connected to an input side of the output buffer, and an output side of the input buffer; wherein the bonding pad is formed ranging over an upper part of the output buffer and the input buffer, and an upper part of a part of the internal circuit.

According to the first aspect of the present invention, since a plurality of bonding pads are arranged and located to the long-side direction of the second metal having a line shape, it becomes easy to make a probe, a bonding tool, etc. which advance from the outside of a chip contact so that the advancement direction may become vertical to the long-side direction of the second metal of a bonding pad. By adjusting the width and the interval of the second metal appropriately, the generation of a crack can be suppressed and it becomes possible to form a reliable semiconductor device.

According to the second aspect of the present invention, since the upper parts of a plurality of second metals have connected mutually, the direction dependency of the strength of a bonding pad becomes small.

According to the third aspect of the present invention, since a bonding pad is provided with the etching stopper formed using the barrier metal of a first lower-layer wiring layer front surface under the second metal, in addition to the effect of the improvement in strength by a second metal, it can be performed easily making suitable the depth of the via hole for the second metal in the case of the forming step.

According to the fourth aspect of the present invention, since it has a plurality of fourth metals on the wiring of a second lower-layer wiring layer in the region of the lower part of a bonding pad, a stress generated at the bonding pad can be absorbed with the fourth metal concerned, and it can suppress that a crack occurs in the interlayer insulation film under a bonding pad. Therefore, also when locating a wiring under the bonding pad in order to aim at high integration of a semiconductor device, degradation of the strength by it can be suppressed.

According to the fifth aspect of the present invention, a bonding pad is formed above an output buffer, and not formed above an input buffer and an internal circuit. Since the formation area is large and the resistance of an output buffer over a stress is high, high integration can be aimed at, suppressing the strength deterioration of a semiconductor device to the minimum.

According to the sixth aspect of the present invention, since the bonding pad is formed ranging over the upper part of an output buffer and an input buffer, and the upper part of a part of internal circuit, the area of a bonding pad can be enlarged and probing and bonding to the bonding pad concerned become easy. When using it, dividing the upper surface of a bonding pad into the region for performing probing, and the region for performing wire bonding, even if it is after probing, bonding of the wire can be made surely, and the reliability of a semiconductor device will improve.

Purposes, features, aspects, and advantages of this invention become clearer with the following detailed explanation and accompanying drawings.

BRIEF DESCRIPTION OF THE DRAWINGS

FIG. 6 is a drawing showing the experimental result which shows the effect of the present invention;

FIG. 34 is a layout pattern of the first via hole layer of the input output section of the semiconductor device concerning Embodiment 6;

FIG. 35 is a layout pattern of the first metal wiring layer of the input output section of the semiconductor device concerning Embodiment 6;

FIG. 36 is a layout pattern of the second via hole layer of the input output section of the semiconductor device concerning Embodiment 6;

FIG. 37 is a layout pattern of the second metal wiring layer of the input output section of the semiconductor device concerning Embodiment 6;

FIG. 38 is a layout pattern of the third via hole layer of the input output section of the semiconductor device concerning Embodiment 6;

FIG. 39 is a layout pattern of the third metal wiring layer of the input output section of the semiconductor device concerning Embodiment 6;

FIG. 40 is a layout pattern of the fourth via hole layer of the input output section of the semiconductor device concerning Embodiment 6;

FIG. 41 is a layout pattern of the fourth metal wiring layer of the input output section of the semiconductor device concerning Embodiment 6;

FIG. 42 is a layout pattern of the fifth via hole layer of the input output section of the semiconductor device concerning Embodiment 6;

FIG. 43 is a layout pattern of the fifth metal wiring layer of the input output section of the semiconductor device concerning Embodiment 6;

FIG. 44 is a sectional view of the input output section of the semiconductor device concerning Embodiment 6;

FIG. 45 is a sectional view of the input output section of the semiconductor device concerning Embodiment 6;

FIG. 46 is a drawing showing the modification of Embodiment 6;

FIG. 47 is a layout pattern of the active region and polysilicon electrode layer of the input output section of the semiconductor device concerning Embodiment 7;

FIG. 48 is a layout pattern of the first via hole layer of the input output section of the semiconductor device concerning Embodiment 7;

FIG. 49 is a layout pattern of the first metal wiring layer of the input output section of the semiconductor device concerning Embodiment 7;

FIG. 50 is a layout pattern of the second via hole layer of the input output section of the semiconductor device concerning Embodiment 7;

FIG. 51 is a layout pattern of the second metal wiring layer of the input output section of the semiconductor device concerning Embodiment 7;

FIG. 52 is a layout pattern of the third via hole layer of the input output section of the semiconductor device concerning Embodiment 7;

FIG. 53 is a layout pattern of the third metal wiring layer of the input output section of the semiconductor device concerning Embodiment 7;

FIG. 54 is a layout pattern of the fourth via hole layer of the input output section of the semiconductor device concerning Embodiment 7;

FIG. 55 is a layout pattern of the fourth metal wiring layer of the input output section of the semiconductor device concerning Embodiment 7;

FIG. 56 is a layout pattern of the fifth via hole layer of the input output section of the semiconductor device concerning Embodiment 7;

FIG. 57 is a layout pattern of the fifth metal wiring layer of the input output section of the semiconductor device concerning Embodiment 7;

FIG. 58 is a sectional view of the input output section of the semiconductor device concerning Embodiment 7;

FIG. 59 is a sectional view of the input output section of the semiconductor device concerning Embodiment 7;

FIG. 60 is a layout pattern of the third metal wiring layer of the input output section of the semiconductor device concerning Embodiment 8;

FIG. 61 is a layout pattern of the fourth via hole layer of the input output section of the semiconductor device concerning Embodiment 8;

FIG. 62 is a layout pattern of the fourth metal wiring layer of the input output section of the semiconductor device concerning Embodiment 8;

FIG. 63 is a layout pattern of the fifth via hole layer of the input output section of the semiconductor device concerning Embodiment 8;

FIG. 64 is a layout pattern of the fifth metal wiring layer of the input output section of the semiconductor device concerning Embodiment 8;

FIG. 65 is a drawing for explaining the effect of Embodiment 8; and

BEST MODE FOR CARRYING OUT THE INVENTION

Embodiment 1

Figure 1:
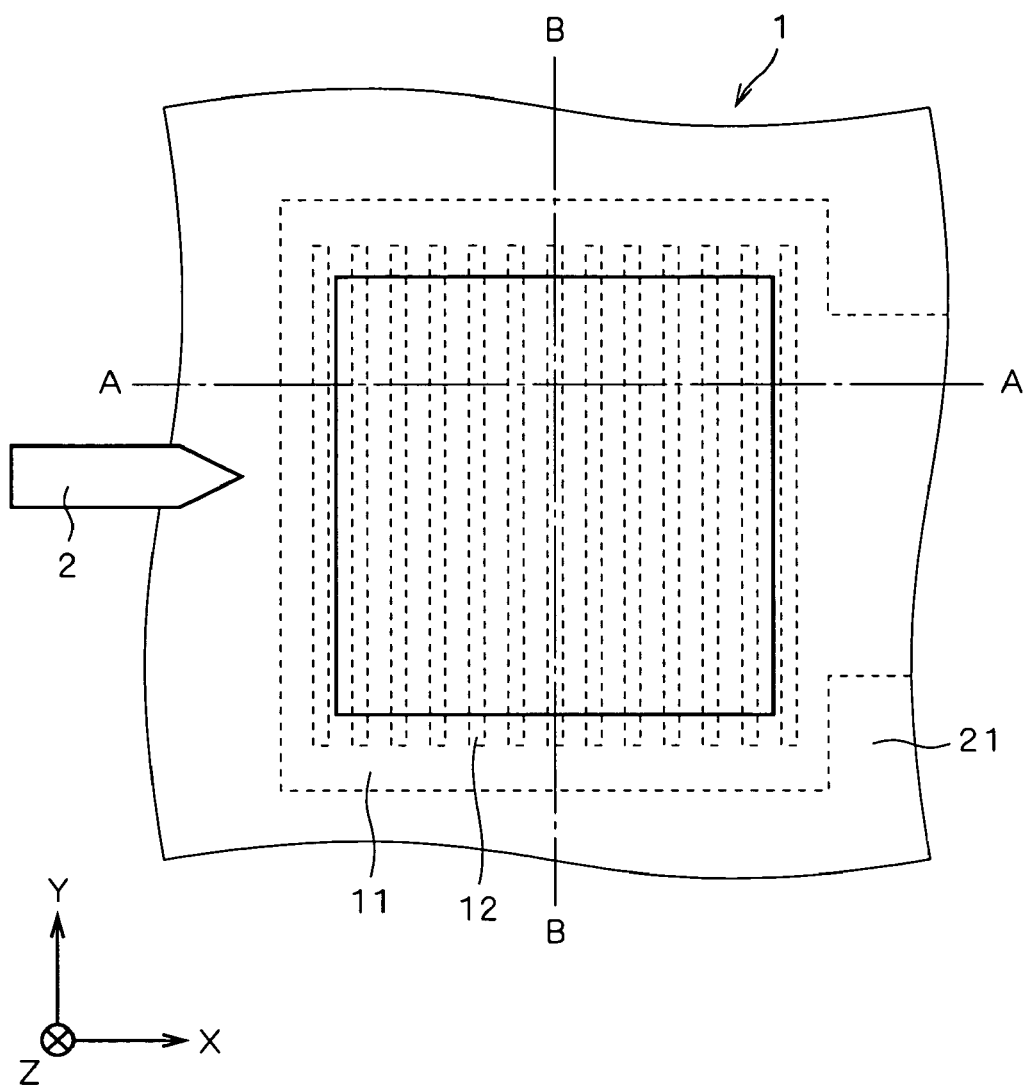
FIG. 1 is a top view of the bonding pad of the semiconductor device concerning Embodiment 1.
Figure 2:
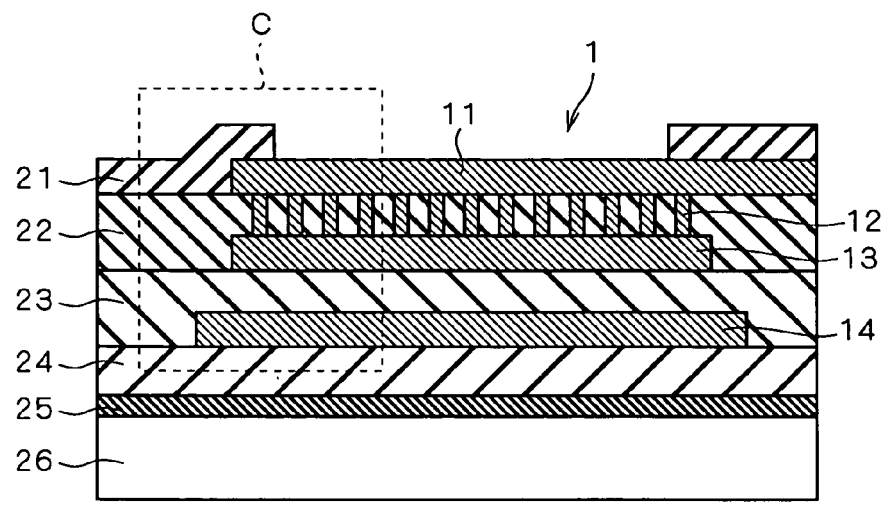
FIG. 2 is a sectional view of the bonding pad of the semiconductor device concerning Embodiment 1.
Figure 3:
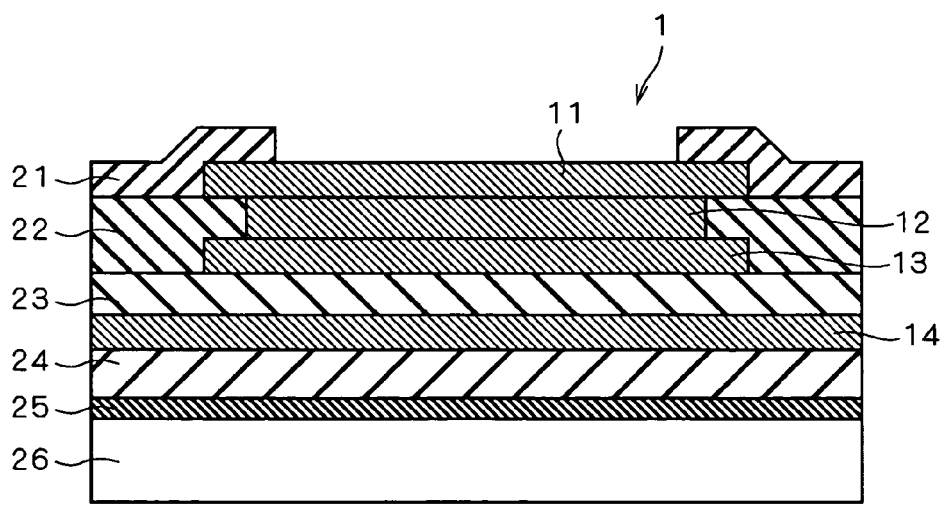
FIG. 3 is a sectional view of the bonding pad of the semiconductor device concerning Embodiment 1.

FIG. 1-FIG. 3 are the drawings showing the structure of the bonding pad of the semiconductor device concerning Embodiment 1 of the present invention. FIG. 1 is a top view of a bonding pad, and FIG. 2 and FIG. 3 are the sectional views of the bonding pad concerned taken along a line A-A and a line B-B of FIG. 1, respectively.

As shown in these drawings, bonding pad 1 has first metal 11 formed using the top layer wiring layer on first interlayer insulation film 22, and second metal 12 as a foundation metal layer embedded in first interlayer insulation film 22. Second metal 12 has connected under first metal 11 and is formed by a plurality of mutually parallel line-like metals. Bonding pad 1 has further third metal 13 connected under second metal 12.

First metal 11 is formed as a part of original wiring by a top layer wiring layer. Although passivation film 21 is formed on the top layer wiring layer, an opening of the upper part of bonding pad 1 is made. Third metal 13 is formed using the first lower-layer wiring layer of one layer under than the top layer wiring layer. Second metal 12 is formed using a via hole (contact plug) for connecting the top layer wiring layer and the first lower-layer wiring layer.

The semiconductor device concerned has a second lower-layer wiring layer of the layer below the first lower-layer wiring layer. And under the bonding pad 1, original wiring 14 formed using the second lower-layer wiring layer is located via second interlayer insulation film 23. Wiring 14 is electrically independent with bonding pad 1. In order that explanation is easy for FIG. 2 and FIG. 3, the second lower layer wiring is drawn on them as a wiring layer of one layer under than the first lower layer wiring, but it may be a wiring layer of a lower layer further. The above structure is formed via field oxide 25 and third interlayer insulation film 24 on semiconductor substrate 26. The component of the referential mark "2" in FIG. 1 shows the tip of the probe which contacts bonding pad 1.

The material of first metal 11, third metal 13, and wiring 14 is a common wiring material, and for example, aluminium (Al), copper (Cu), those alloy (for example, Al—Si—Cu, Al—Cu, etc.), etc. are mentioned. Second metal 12 is also a common via hole material, and for example, tungsten (W), copper, its alloy, etc. are mentioned. As a material of passivation film 21 and first-third interlayer insulation films 22, 23, and 24, usual silicon oxide film ($SiO_2$) is common. However, in addition to this, low dielectric-constant insulating layers (low-k film), such as a fluorine doped silicon oxide film (FSG) and a carbon doped silicon oxide film (SiOC), etc. are sufficient.

As mentioned above, in Patent Reference 1, a problem of becoming easy to generate a crack is reported with the case where the applying direction of a stress to a bonding pad becomes vertical to the long-side direction (the direction of a line) of the foundation metal layer in plan view when the foundation metal layer of the bonding pad is made into the shape of a plurality of lines.

The present inventor found out that the problem was solved, when setting up appropriately each width and interval of second metal 12 having a line shape by an experiment and stress simulation in bonding pad 1 which has the structure of FIG. 1-FIG. 3. Surprisingly, it also turned out that, when the applying direction of the stress becomes near vertically to the long-side direction of second metal 12 in plan view, it becomes difficult to generate a crack in first interlayer insulation film 22 and second interlayer insulation film 23, and the strength equivalent to the case where a via hole of a large caliber is formed as a foundation metal layer can be obtained.

Figure 4:
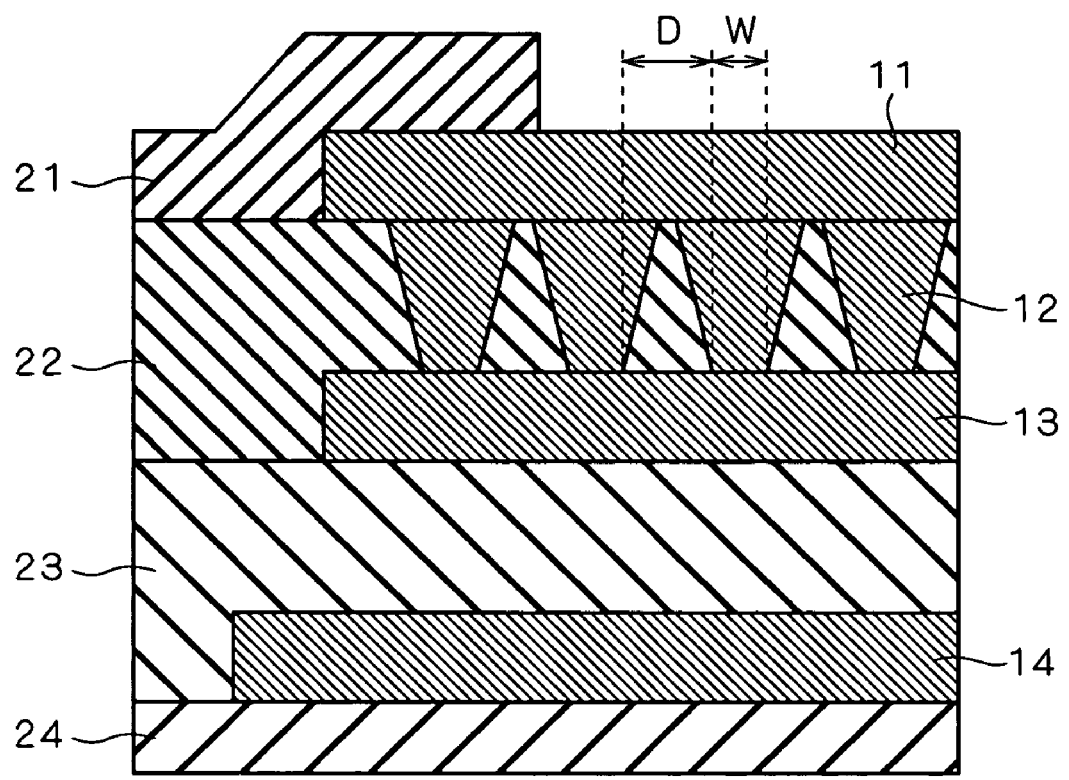
FIG. 4 is an enlarged sectional view of the bonding pad of the semiconductor device concerning Embodiment 1.

Concretely, when width W and interval D of second metal 12 satisfied the relation:

$$W \leq D \leq 2 \times W \quad (1),$$

the above-mentioned effect was acquired. Here, FIG. 4 is an enlarged sectional view of region C shown in FIG. 2. Since a via hole is formed of etching from upward, the upper part is in the tendency to be formed more widely than a bottom. Therefore, as for second metal 12, each is formed in an inverted trapezoid type like FIG. 4. Since it can be formed with the dimension comparatively near a designed size at the bottom of a via hole, in the specification, width W and interval D of second metal 12 are defined as a dimension at the bottom of second metal 12, as shown in FIG. 4.

In the embodiment, bonding pad 1 is formed so that width W and interval D of second metal 12 may satisfy the relation of the formula (1). And it is made for the direction of the stress applied to the bonding pad 1 concerned to become near vertically to the long-side direction of second metal 12 in plan view. By it, the crack generation in first interlayer insulation film 22 and second interlayer insulation film 23 can be suppressed.

It is difficult to make equal correctly width W and interval D of second metal 12 actually formed with width $W_0$ and interval $D_0$ of the designed size (mask size at the time of patterning of second metal 12). Usually a finished size has a certain amount of error to a designed size. For example, in the central part of the length direction, in second metal 12 having a line shape, width tends to be widely formed a little rather than both ends by the characteristics of etching. Therefore, it is difficult to form the whole with homogeneous width. Therefore, in the experiment, the above-mentioned effect may have been acquired also in the case which does not satisfy the relation of the formula (1) strictly partially. However, at least, when width W0 and interval D0 of a designed size of second metal 12 satisfied the relation:

$$W_0 \leq D_0 \leq 2 \times W_0 \quad (2),$$

the above-mentioned effect was acquired.

Figure 5A:
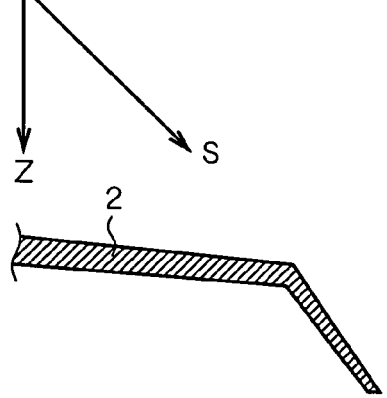
FIGS. 5A and 5B are drawings showing an example of the probe which contacts a bonding pad.
Figure 5B:

Here, probe 2 used for an electrical test of a semiconductor chip is explained. As the shape of probe 2, the thing of a canti-lever type which advances from the horizontal direction of bonding pad 1 (hereinafter referred to as a "canti-lever probe") as shown in FIG. 5A, and what advances perpendicularly to bonding pad 1 (hereinafter referred to as a "vertical probe") as shown FIG. 5B are known well. In FIG. 5A, canti-lever probe 2 contacts first metal 11 by moving to perpendicular direction Z to bonding pad 1. Thereby, the stress applied to bonding pad 1 has not only a perpendicular (Z direction) component but a component of the advancement direction (X direction) resulting from the shape and elasticity of probe 2. Therefore, the direction S of the stress concerned turns into an oblique direction to the front surface of bonding pad 1 like FIG. 5A.

It is made for the direction of the stress applied to bonding pad 1 to become near vertically to the long-side direction of second metal 12 in plan view in the embodiment. Therefore, when probe 2 is a canti-lever type, as shown in FIG. 1, it is necessary to make near vertically the advancement direction (X direction) of probe 2 to the long-side direction of second metal 12.

When making a vertical probe contact first metal 11, the direction S of the stress applied to bonding pad 1 is perpendicular direction Z of bonding pad 1 like FIG. 5B.

FIG. 6 is a drawing showing the above-mentioned experiment and simulation result. In each of an experiment and a simulation, the existence of the crack generation of first interlayer insulation film 22 and second interlayer insulation film 23 to the number of times of probing to bonding pad 1 was observed supposing the electrical test (test) of a semiconductor chip. In experiment concerned and simulation, in order to confirm the direction dependency in strength of bonding pad 1, a canti-lever probe was used as probe 2 made to contact. The table shown in FIG. 6 is an experiment and simulation result at the time of setting width $W_0$ of the designed size of second metal 12 to 0.28 μm, and forming as interval $D_0$=0.36 μm concretely. The overdrive amount at the time of probing (the amount of OD) is shown in the longitudinal direction of a table, and the number of times of probing is shown in the horizontal direction of the table. An overdrive amount is the amount of depression after contacting probe 2 in first metal 11 of bonding pad 1.

As shown in FIG. 6, in bonding pad 1 of Embodiment 1, when advancement direction X of probe 2 was made vertical in plan view and made to contact the long-side direction of second metal 12, the good result equivalent to conventional bonding pad structure (structure using a via hole of a large caliber as a foundation metal layer) was obtained. Even when advancement direction X of probe 2 was made to contact in parallel with the long-side direction of second metal 12 to bonding pad 1 of Embodiment 1 as shown in the same drawing, the result near conventional bonding pad structure was obtained, and it turned out that strength direction dependency is small. However, as compared with the case where it is made vertical to long-side direction, and it is made to contact, strength falls a little.

Figure 7:
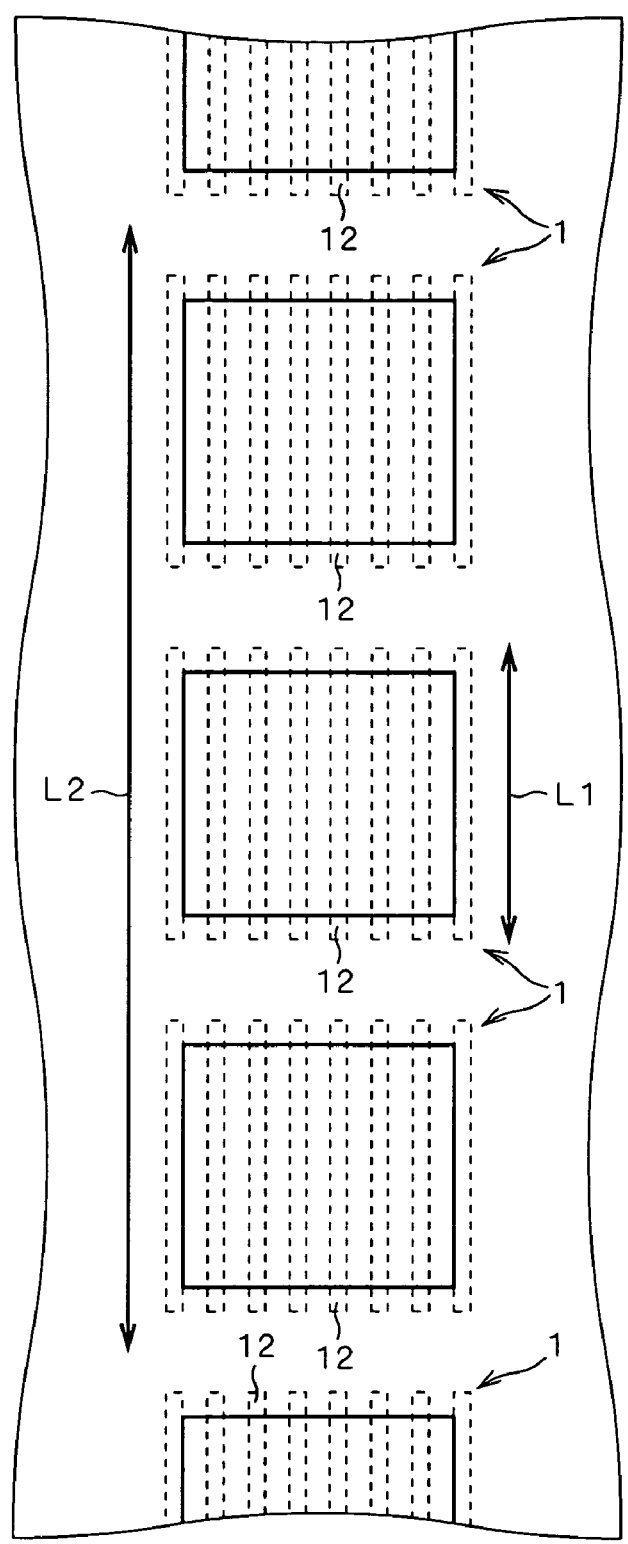
FIG. 7 is a drawing for explaining the arrangement method of the bonding pad in the semiconductor device concerning Embodiment 1.

It is desirable to make the advancement direction X vertical to the long-side direction of second metal 12, and to make probe 2 contact to bonding pad 1 of the embodiment as this result also shows. So, in the embodiment, bonding pads 1 are put in order and located on a semiconductor chip like FIG. 7 to the long-side direction of second metal 12. In FIG. 7, arrow head L1 shows the long-side direction of second metal 12, and arrow head L2 shows the arrangement direction of bonding pads 1. Thus, bonding pads 1 are put in order and located so that the long-side direction of second metal 12 and the arrangement direction of bonding pads 1 may become in the same direction.

Figure 8:
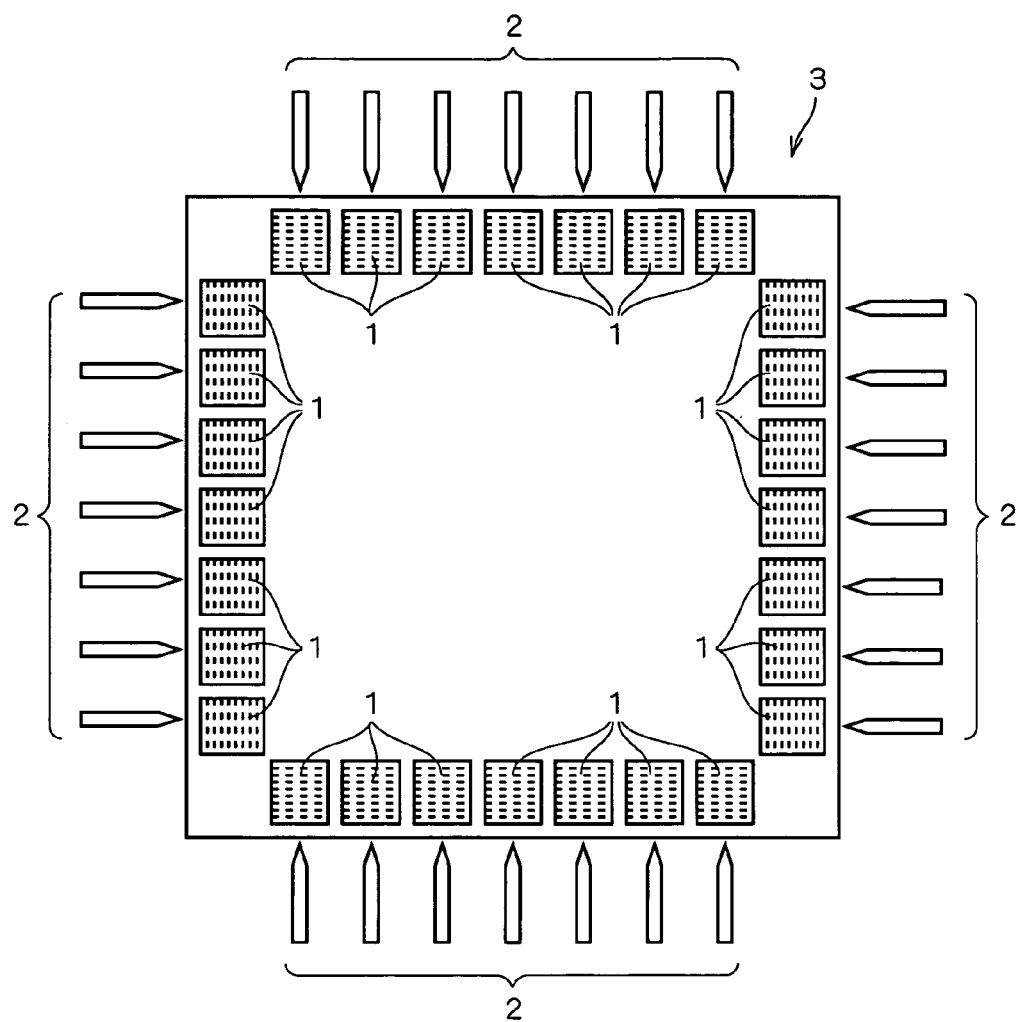
FIG. 8 is a drawing showing an example of the layout of the bonding pad in the semiconductor device concerning Embodiment 1.
Figure 9:
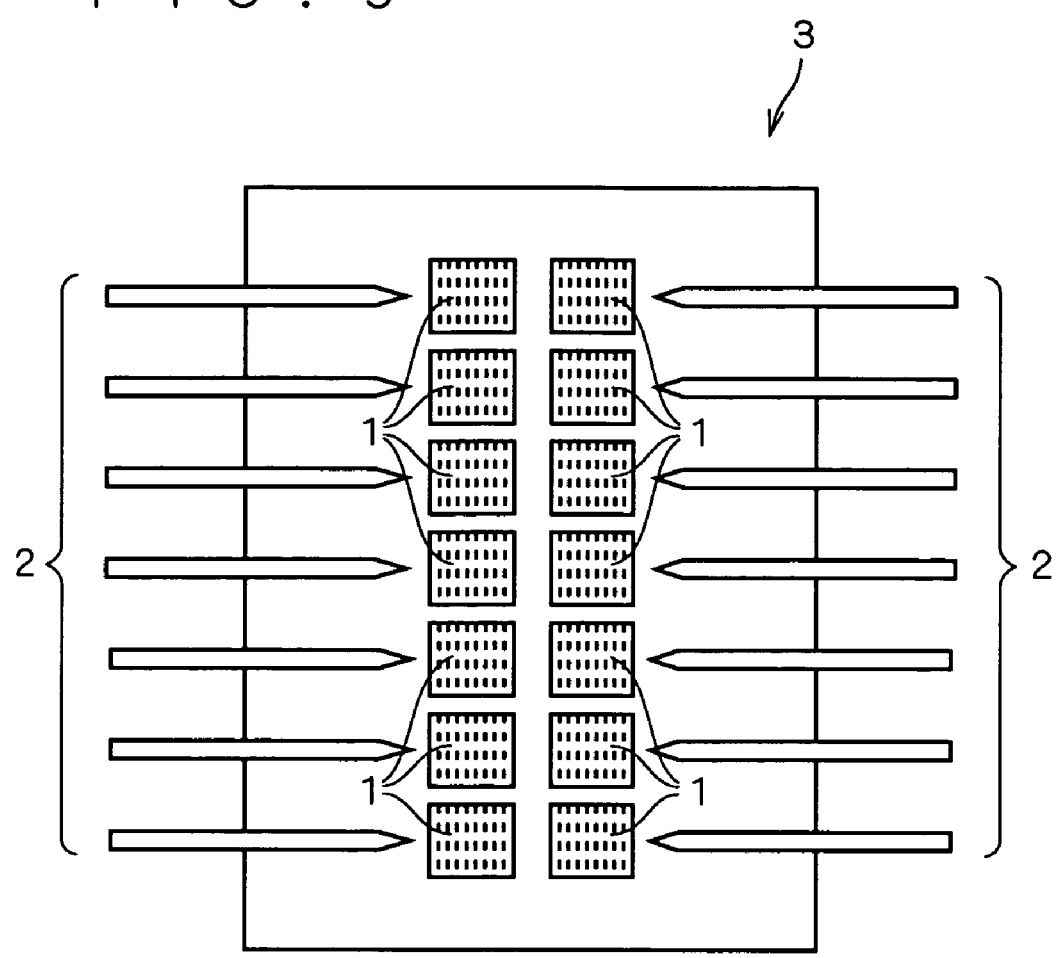
FIG. 9 is a drawing showing an example of the layout of the bonding pad in the semiconductor device concerning Embodiment 1.

FIG. 8 and FIG. 9 are the drawings showing an example of the layout of bonding pad 1 in the embodiment. Usually, in the test equipment of the semiconductor chip, it is located so that probe 2 may advance toward the inside from the outside of a semiconductor chip. The advancement direction differs according to each test equipment and a semiconductor chip of a test target. For example, the case which advances from four directions to semiconductor chip 3 like FIG. 8, and the case which advances from two directions to semiconductor chip 3 like FIG. 9 are common. In the case of FIG. 8, the row of bonding pad 1 put in order like FIG. 7 is made to arrange along each of four sides of semiconductor chip 3. Thereby, the advancement direction of each probe 2 which advances from four directions becomes vertical to the long-side direction of second metal 12 of each bonding pad 1 in plan view, and the crack generation in semiconductor chip 3 can be suppressed. In the case of FIG. 9, two rows of bonding pad 1 put in order like FIG. 7 are arranged side by side on semiconductor chip 3. Thereby, it becomes easy to make vertical the advancement direction of each probe 2 which advances from two directions to the long-side direction of second metal 12 of each bonding pad 1 in plan view, and the crack generation in semiconductor chip 3 can be suppressed.

That is, by putting in order and locating bonding pads 1 on semiconductor chip 3 like FIG. 7 to the long-side direction of second metal 12, it becomes easy to make probe 2 which advances from the outside of a chip contact so that the advancement direction may become vertical in plan view to the long-side direction of second metal 12 of bonding pad 1. In the embodiment, when the direction of the stress applied to bonding pad 1 becomes near in plan view vertically to the long-side direction of second metal 12, it will become difficult to generate a crack in first interlayer insulation film 22 and second interlayer insulation film 23. Therefore, the generation of a crack by probing can be suppressed and it becomes possible to form a reliable semiconductor device.

Since second metal 12 which is a foundation layer is a line-like, also when forming in parallel to the original via hole of a small caliber, it is hard to generate dishing on the upper surface of second metal 12, and the height of the front surface becomes almost uniform. Therefore, also when forming first metal 11 on it, it also becomes easy to make uniform the height of the upper surface of the first metal 11 concerned, and to form it. Therefore, when the height of the upper surface of first metal 11 becomes uniform, sure probing and the wire bonding to it become possible, and can contribute to the improvement in reliability of a semiconductor device further.

Although the canti-lever type thing was used as probe 2 in the above-mentioned embodiment, the same effect can be acquired even if it will be a probe of another shape, when it has the advancement direction to bonding pad 1. The same strength as a conventional semiconductor device is obtained also to a vertical probe without the advancement direction. Not only a probe but when making the bonding tool used, for example by wire bonding contact bonding pad 1, it is clear that the same effect is acquired. FIG. 2 and FIG. 3 showed the structure of having three-layer wiring layers of a top layer wiring layer, and the first and the second lower layer wirings, as a semiconductor device. However, in the embodiment, since the second lower-layer wiring layer is not necessarily required, it is applicable to the semiconductor device which has two or more-layer wiring layers.

Figure 10:
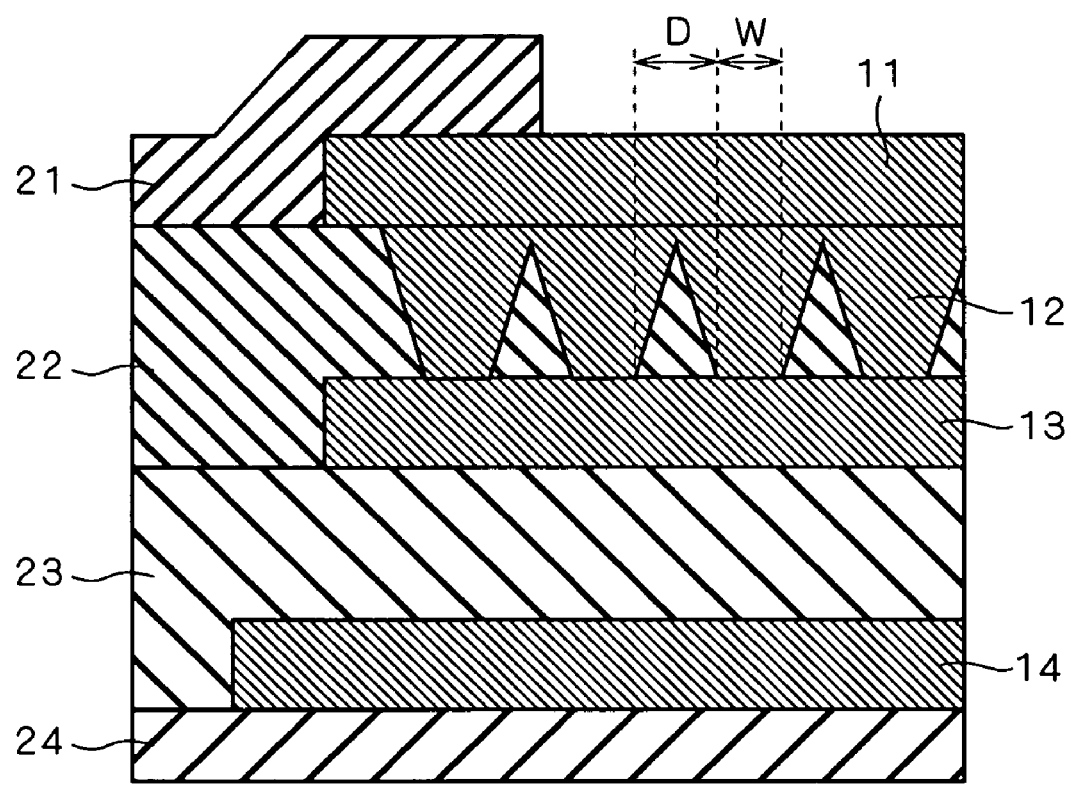
FIG. 10 is an enlarged sectional view of the bonding pad of the semiconductor device concerning Embodiment 1.

In the experiment, when interval D of second metal 12 was narrowed (for example, $D_0=0.36$ μm), especially the generation of a crack was suppressed and high strength was obtained. As mentioned above, since an upper part is in the tendency to become wider than a bottom as to a via hole, when interval D is narrowed, as shown in FIG. 10, there is also a case where the upper part of line-like second metal 12 connects mutually and is formed in first interlayer insulation film 22. Even in such a case, it was confirmed that high strength is obtained like the above. When the upper surface is connected mutually, the direction dependency of the strength of bonding pad 1 becomes still smaller.

Furthermore, in the experiment, when all materials of the first and the second lower-layer wiring layer wiring (material of third metal 13 and wiring 14) were set to Cu, compared with the case where another materials are used, the good result was obtained especially. Even if it uses Cu for the material of a top layer wiring layer (material of first metal 11), the same result is obtained, but since the upper surface exposes first metal 11 and bonding of the wire is further made to a front surface, it is desirable to use the alloy of Al which is comparatively strong in corrosion and can perform bonding easily.

Embodiment 2

Figure 11:
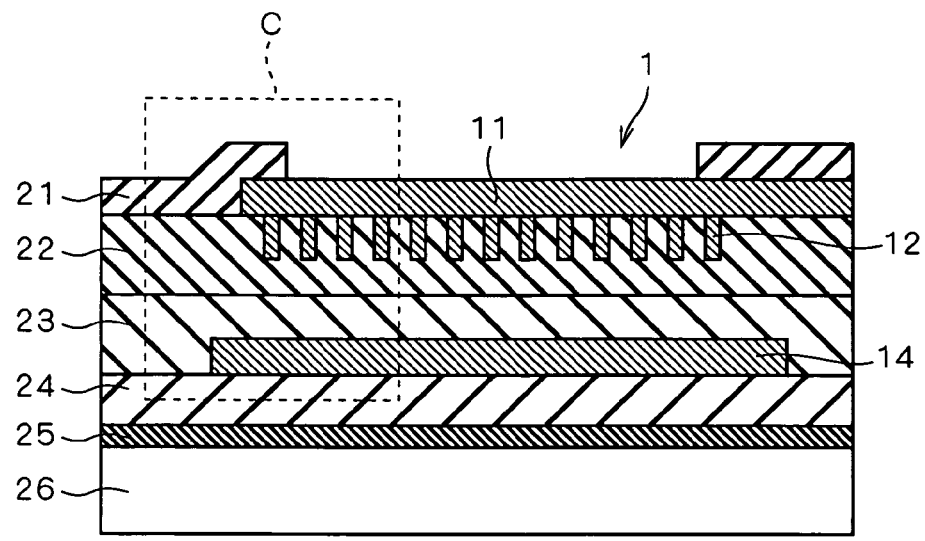
FIG. 11 is a sectional view of the bonding pad of the semiconductor device concerning Embodiment 2.
Figure 12:
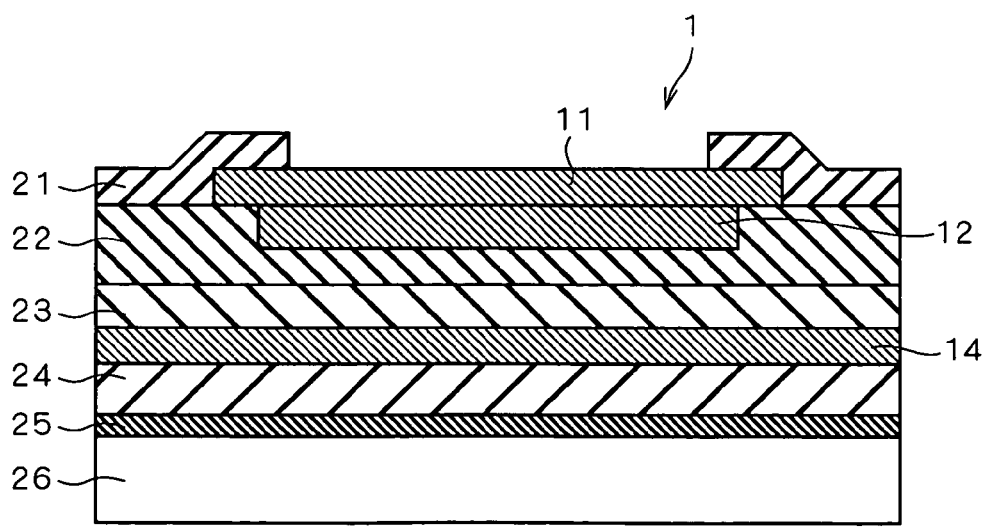
FIG. 12 is a sectional view of the bonding pad of the semiconductor device concerning Embodiment 2.
Figure 13:
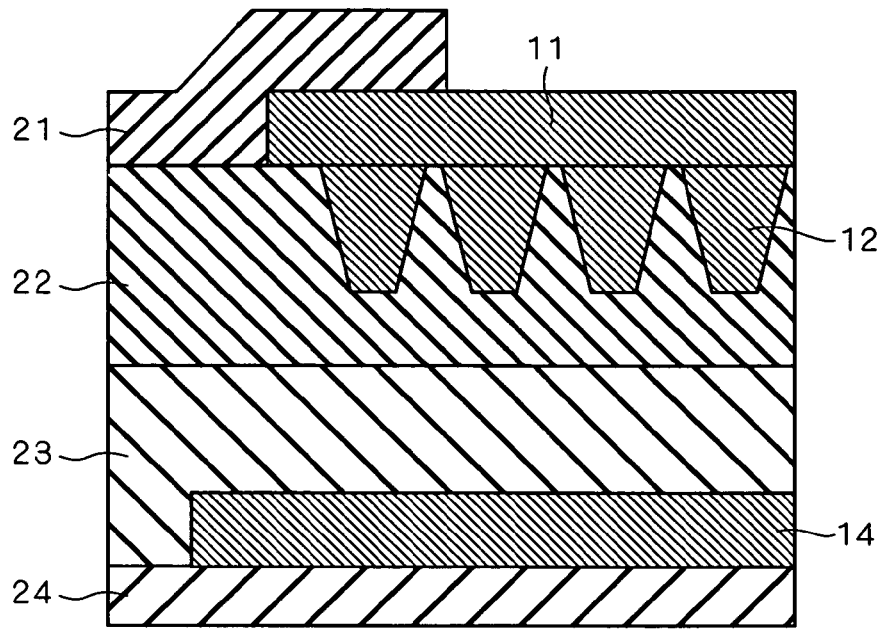
FIG. 13 is an enlarged sectional view of the bonding pad of the semiconductor device concerning Embodiment 2.

FIG. 11 and FIG. 12 are the sectional views of the bonding pad of the semiconductor device concerning Embodiment 2. Since the top view is the same as that of FIG. 1, it is omitted, but FIG. 11 and FIG. 12 are equivalent to the cross section of the bonding pad concerned which is taken along a line A-A and a line B-B of FIG. 1, respectively. And FIG. 13 is an enlarged view of region C shown in FIG. 11. In these drawings, the same numeral is given to the component which has the same function as what was shown in FIG. 2 and FIG. 3. Since the semiconductor device concerned is the same structure as the semiconductor device of Embodiment 1 except for third metal 13 not being formed under second metal 12, explanation of each component is omitted here.

Stress simulation was performed to the semiconductor device of Embodiment 2. In the simulation concerned, the stress applied to first interlayer insulation film 22 and second interlayer insulation film 23 was computed, the relative comparison was made to the experiment and simulation result in Embodiment 1, and the existence of the crack generation was asked for. A canti-lever probe was used as probe 2 made to contact bonding pad 1, and the advancement direction was made vertical in plan view to the long-side direction of second metal 12. The result is also shown in FIG. 6. As shown in the same drawing, in bonding pad 1 of Embodiment 2, the generation of a crack can be further suppressed rather than Embodiment 1.

When putting in order and locating bonding pad 1 on a semiconductor chip also in the embodiment to the long-side direction of second metal 12, as Embodiment 1 explained using FIG. 7-FIG. 9, it becomes easy to make probe 2 which advances from the outside of a chip contact, making the advancement direction vertical in plan view to the long-side direction of second metal 12 of bonding pad 1.

Embodiment 3

Figure 14:
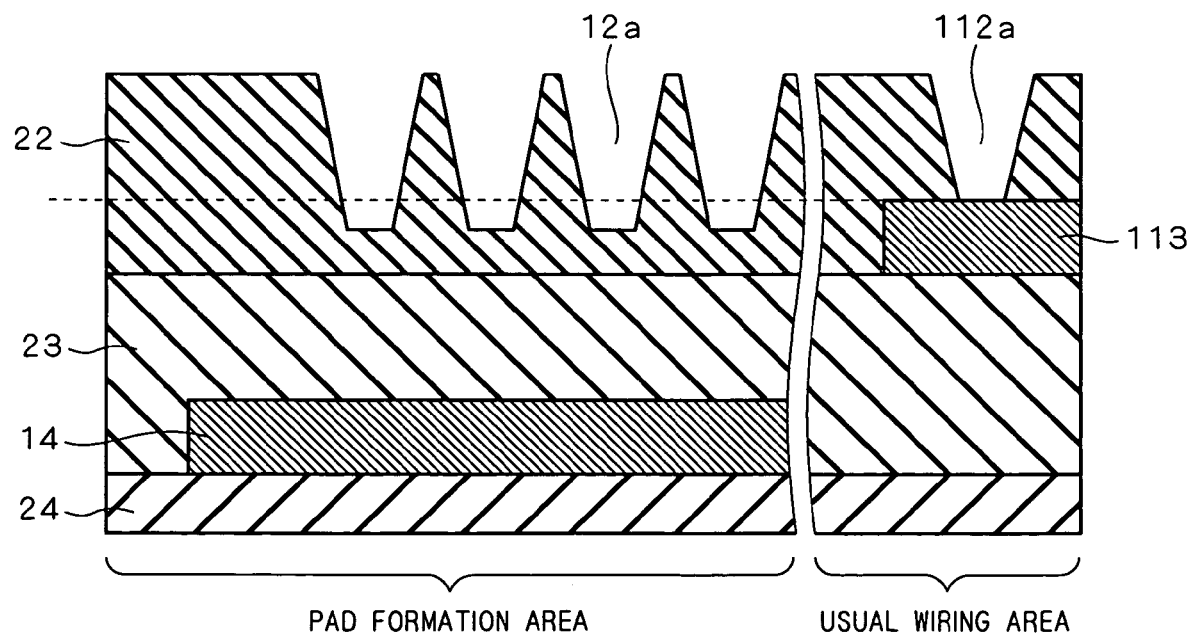
FIG. 14 is a drawing for explaining a problem in Embodiment 2.

As mentioned above, according to Embodiment 2, it is possible to suppress the generation of a crack rather than Embodiment 1. However, there are the following problems in the forming step of Embodiment 2. FIG. 14 is a drawing for explaining the problem, and shows the forming step of the via hole for forming second metal 12. The left-hand side of the same drawing shows the pad formation area in which bonding pad 1 is formed, and right-hand side shows the usual wiring area in which original wiring 113 of a first lower-layer wiring layer is formed.

In Embodiment 1, third metal 13 is formed in a pad formation area using a first lower-layer wiring layer (by the same forming step as formation of wiring 113), and second metal 12 is formed on third metal 13 after that. So, in the via hole forming step for forming second metal 12, third metal 13 can be operated as an etching stopper. Since the third metal 13 is not formed by Embodiment 2 to it, it is easy to generate an over-etching in via hole 12a for forming second metal 12 like FIG. 14.

On the other hand, since wiring 113 usually functions as an etching stopper in a wiring area, an over-etching is not produced in via hole 112a. That is, via hole 12a for second metal 12 in a pad formation area becomes that it is usually easy to be formed more deeply than via hole 112a of a wiring area. As a result, dishing occurs on the upper surface of second metal 12, or when the worst, second metal 12 reaches even original wiring 14 of a second lower-layer wiring layer, and insulation between bonding pad 1 and wiring 14 is no longer maintained.

On the contrary, since there is a danger that via hole 112a for an original via hole will not fully reach wiring 113, but a connection failure will occur when etching quantity is lessened, in order to avoid an over-etching, it is not desirable. As the measures, there is a method of making size of via hole 12a small (thinly) to via hole 112a, and making the etching quantity of via hole 12a small to that of via hole 112a. However, by this method, it is necessary to adjust the size of suitable via hole 12a for every manufacture method.

Figure 15:
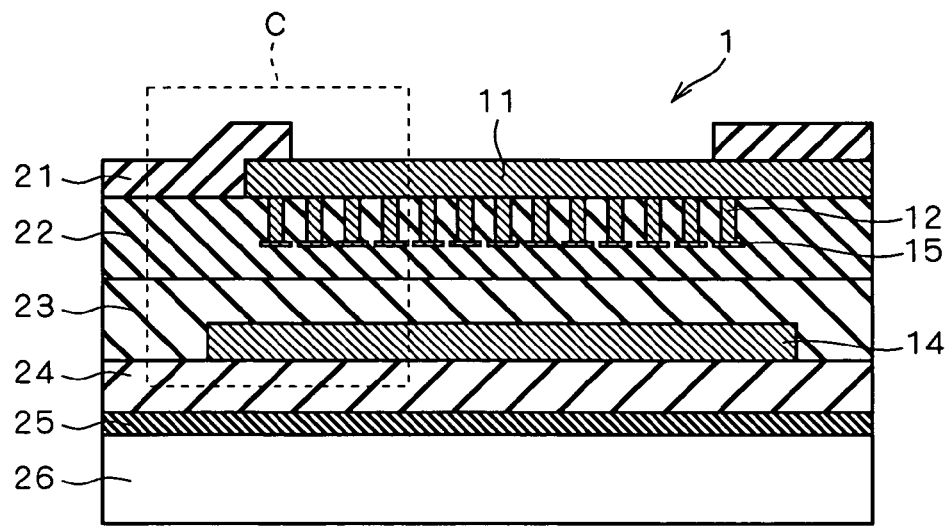
FIG. 15 is a sectional view of the bonding pad of the semiconductor device concerning Embodiment 3.
Figure 16:
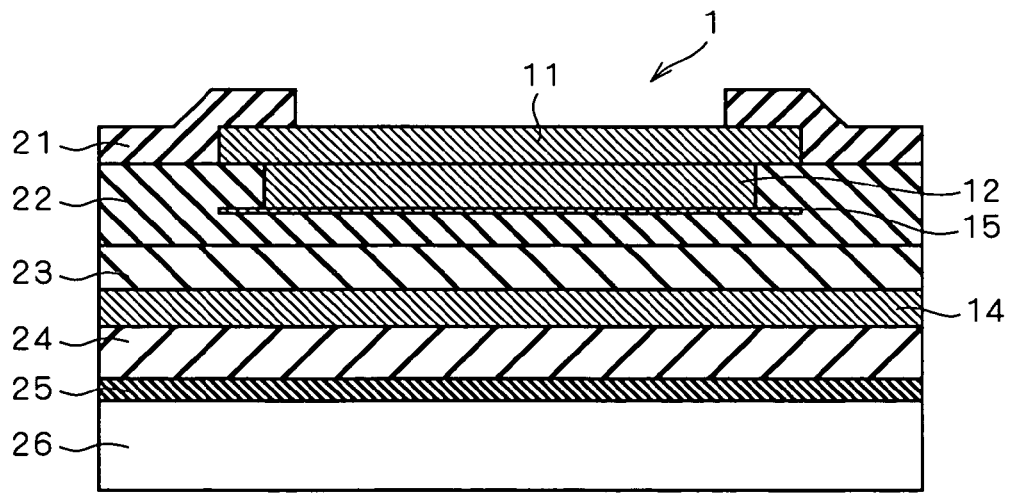
FIG. 16 is a sectional view of the bonding pad of the semiconductor device concerning Embodiment 3.

FIG. 15 and FIG. 16 are the sectional views of the bonding pad of a semiconductor device concerning Embodiment 3. Since the top view is the same as that of FIG. 1, it is omitted, but FIG. 15 and FIG. 16 are equivalent to the cross section of the bonding pad concerned which is taken along a line A-A and a line B-B of FIG. 1, respectively. In these drawings, the same numeral is given to the component which has the same function as what was shown in FIG. 2 and FIG. 3. In the embodiment, third metal 13 is not formed under second metal 12 like Embodiment 2. However, under second metal 12, etching stopper 15 in the case of etching of via hole 12a formation is formed. The other structure is the same structure as the semiconductor device of Embodiment 2.

Figure 17:
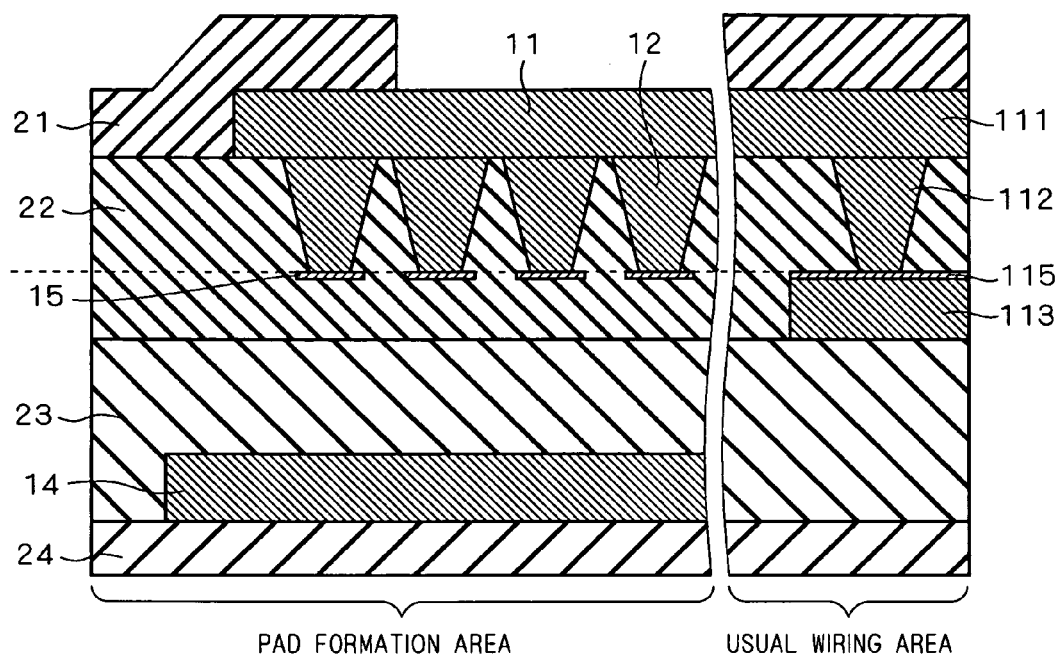
FIG. 17 is an enlarged sectional view of the bonding pad of the semiconductor device concerning Embodiment 3.

FIG. 17 is an enlarged sectional view of the bonding pad of a semiconductor device concerning Embodiment 3. The left-hand side of the same drawing is equivalent to region C which shows the pad formation area and is shown in FIG. 15, and right-hand side shows the usual wiring area in which original wiring 113 of a first lower-layer wiring layer is formed. Etching stopper 15 is formed using barrier metal 115 formed on the front surface of wiring 113, and as shown in FIG. 17, it is formed at the same height as the upper surface (barrier metal 115) of wiring 113. As an example of the material of etching stopper 15 and barrier metal 115, Ti, TiN or those multilayer structure, etc. are mentioned.

Figure 18:
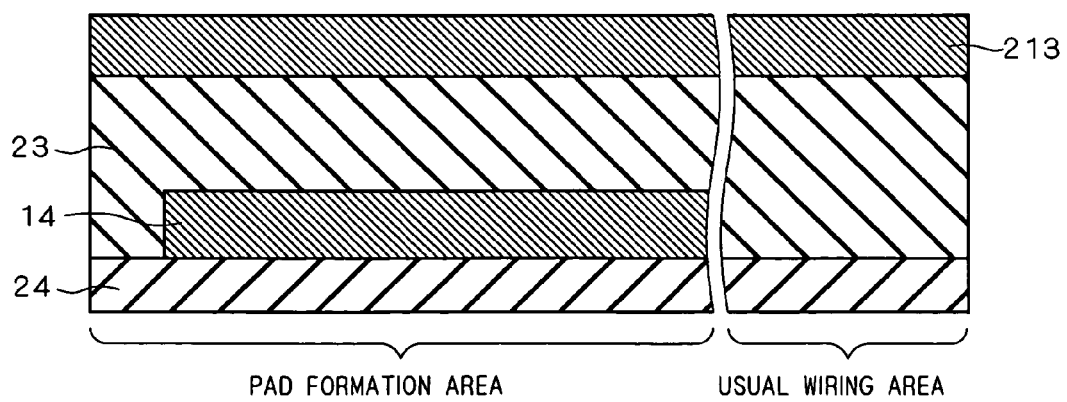
FIG. 18 is a drawing showing the manufacturing process of the semiconductor device concerning Embodiment 3.
Figure 19:
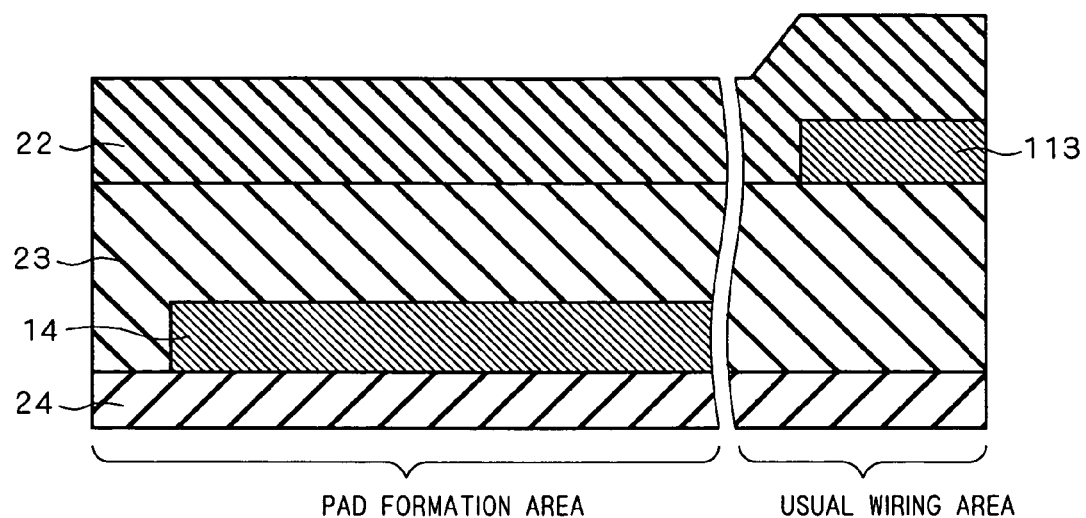
FIG. 19 is a drawing showing the manufacturing process of the semiconductor device concerning Embodiment 3.

FIG. 18-FIG. 22 are the drawings showing the manufacturing process of a semiconductor device concerning Embodiment 3. Hereafter, based on these drawings, the manufacturing process of a semiconductor device concerning Embodiment 3 is explained. First, by the same steps as the manufacturing method of a conventional semiconductor device, after forming field oxide 25, third interlayer insulation film 24, and second interlayer insulation film 23 on semiconductor substrate 26, wiring material 213 of a first lower-layer wiring layer is deposited (FIG. 18). And wiring material 213 is patterned into a predetermined wiring pattern, original wiring 113 is formed in a usual wiring area, and first interlayer insulation film 22 is deposited on it (FIG. 19).

Figure 20:
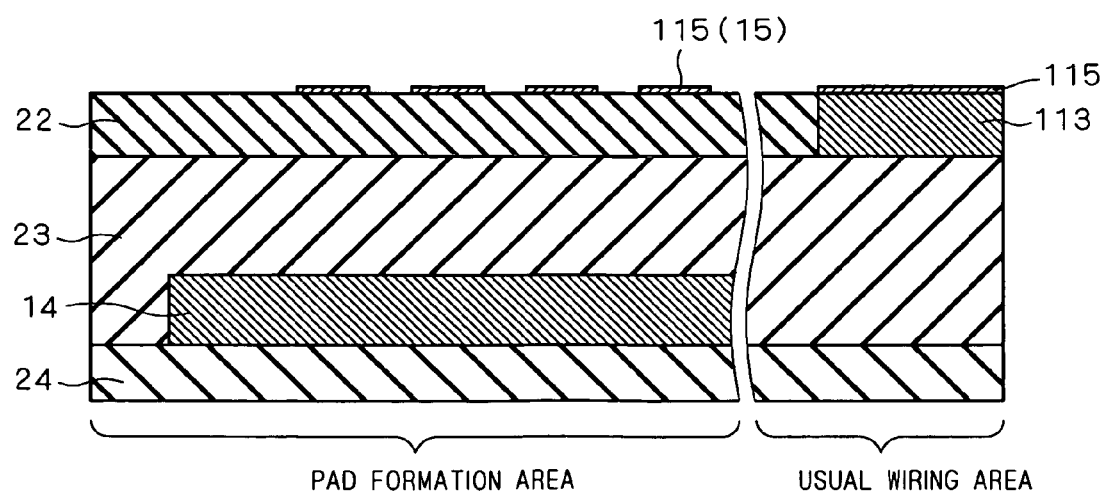
FIG. 20 is a drawing showing the manufacturing process of the semiconductor device concerning Embodiment 3.

And the upper surface of wiring 113 is once exposed, for example by the CMP method. At this time, flattening is made so that the height of the upper surface of exposed wiring 113 and first interlayer insulation film 22 top may become the same. Subsequently, barrier metal 115 is selectively formed on the upper surface of wiring 113, and in the region which forms second metal 12 at a next step by depositing and patterning barrier metal material (FIG. 20).

Figure 21:
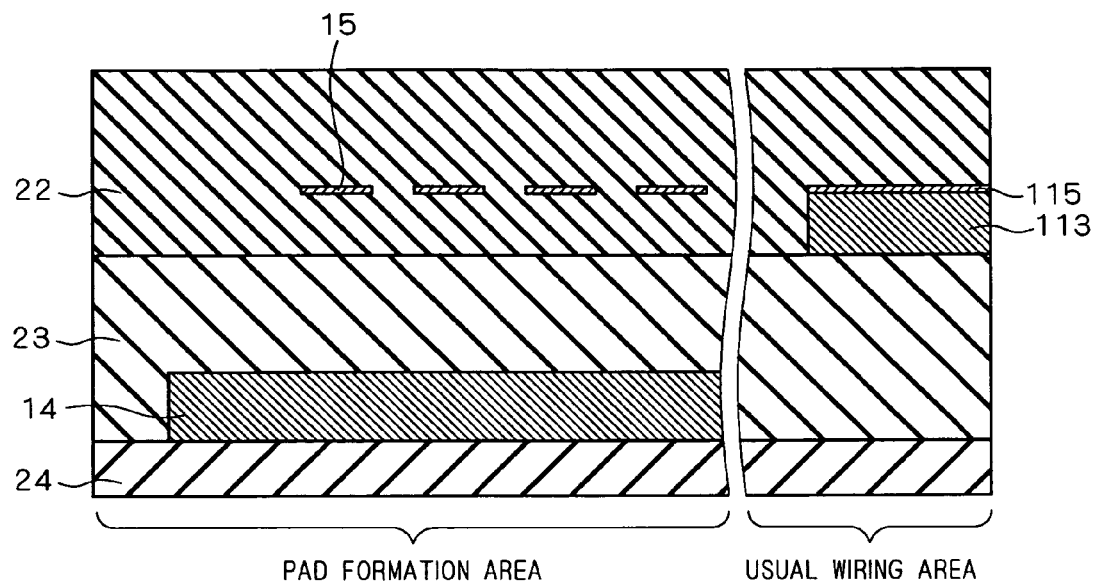
FIG. 21 is a drawing showing the manufacturing process of the semiconductor device concerning Embodiment 3.
Figure 22:
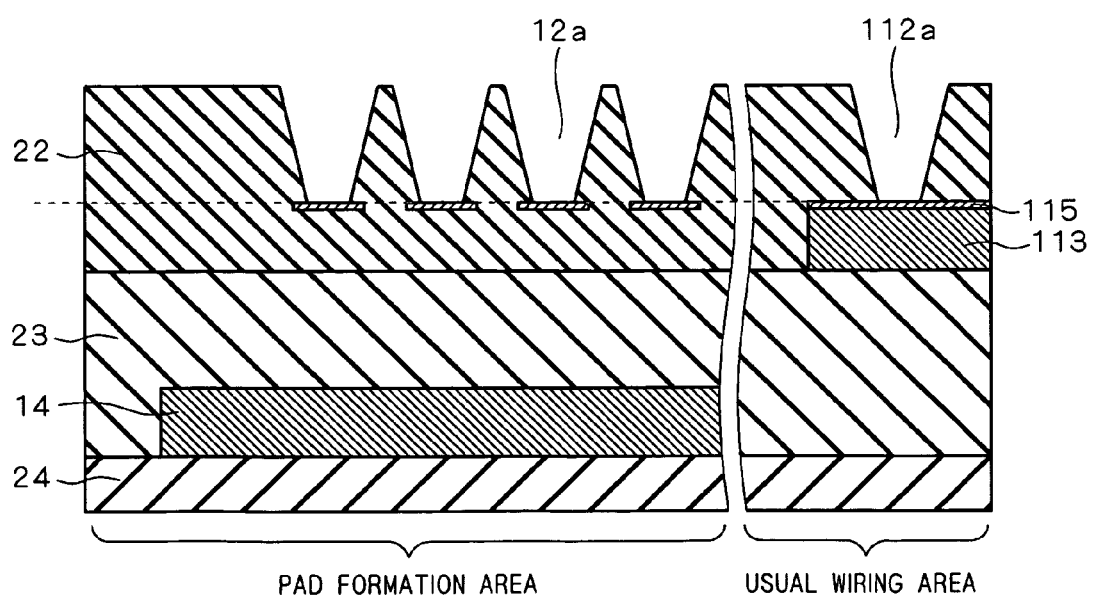
FIG. 22 is a drawing showing the manufacturing process of the semiconductor device concerning Embodiment 3.

First interlayer insulation film 22 is deposited again after that (FIG. 21). Etching stopper 15 is formed in the portion in which second metal 12 is formed in first interlayer insulation film 22 of a pad region at the same height as the wiring 113 upper surface. And via hole 12a for second metal 12 and via hole 112a for original via hole 112 are formed in first interlayer insulation film 22 by selective etching using photo lithography technology (FIG. 22). Since etching of via hole 12a is stopped by etching stopper 15 at this time, an over-etching is not generated in via hole 12a of the second metal 12 concerned. Etching of via hole 112a is stopped by barrier metal 115 of the wiring 113 upper surface. Thus, it is possible to form easily via hole 12a for second metal 12 and via hole 112a for original via hole 112 to the same depth.

As mentioned above, according to the embodiment, a problem of dishing of the second metal 12 upper surface, a problem of short-circuit of bonding pad 1 and wiring 14, etc. resulting from the over-etching of via hole 12a are avoidable. Since the structure of the embodiment is the same as that of Embodiment 2, the structure of a semiconductor device with high strength can be formed.

The above explanation showed the example which formed etching stopper 15 locally under each second metal 12. That is, in the upper example, etching stopper 15 had the shape of same line as second metal 12. However, etching stopper 15 may be formed in the whole region under bonding pad 1 in one.

Embodiment 4

When a crack occurs under the bonding pad and it reaches even wiring, the metal migration resistance of the wiring concerned will deteriorate. There is a tendency to become easy to generate a crack in the interlayer insulation film between a bonding pad and the wiring concerned, and for strength to fall, by letting wiring pass under the bonding pad.

Therefore, it is desirable not to let wiring pass carelessly in the lower part of a bonding pad from the viewpoint of preventing the generation of a crack. However, for high integration of a semiconductor device, the region under a bonding pad is also needed to be used effectively and it is obliged to let wiring pass under the bonding pad. So, in the embodiment, the semiconductor device structure which can suppress strength degradation even when wirings pass under the bonding pad is proposed.

When letting a wiring pass under the bonding pad, the present inventor found out by an experiment and a stress simulation that the crack generation in the interlayer insulation film between a bonding pad and the wiring concerned was suppressed by setting up a plurality of metals on the upper surface of the wiring concerned. The example of the device structure is shown below.

Figure 23:
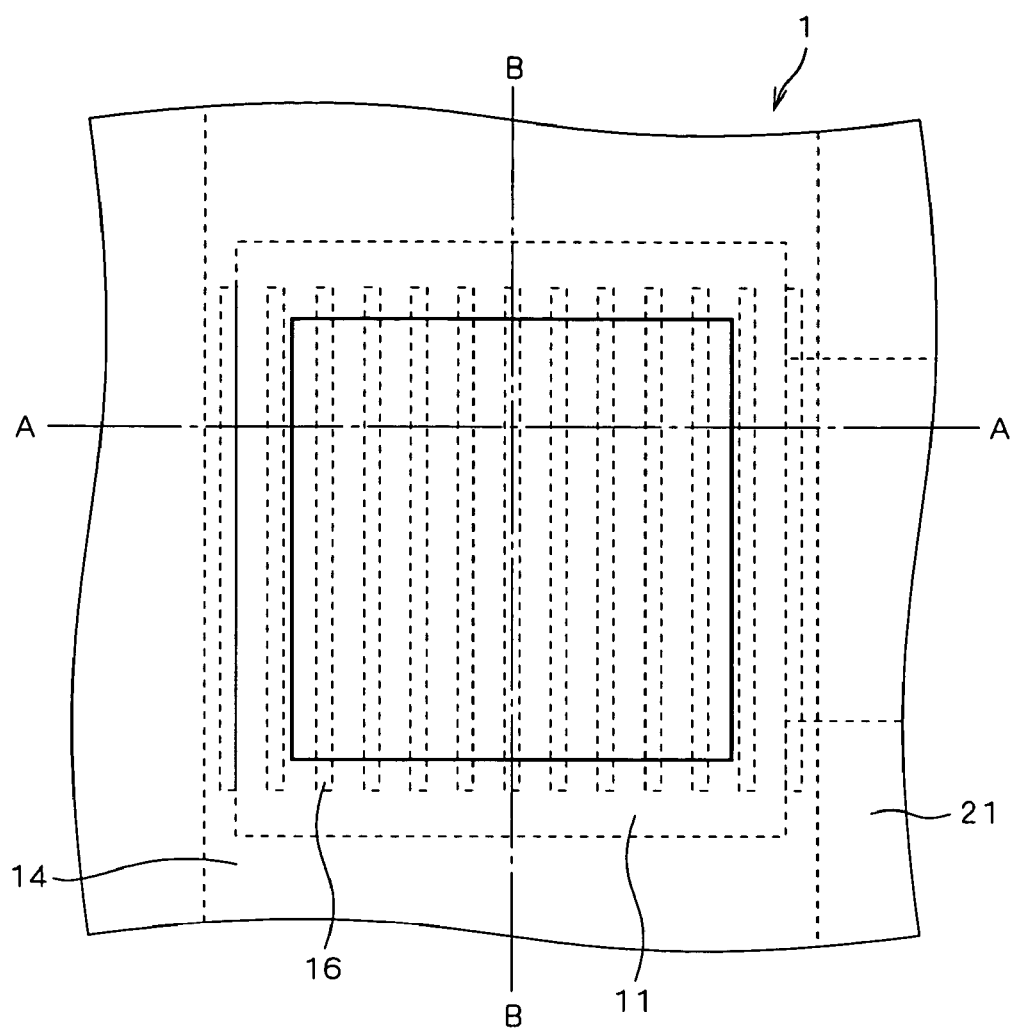
FIG. 23 is a top view of the bonding pad of the semiconductor device concerning Embodiment 4.
Figure 24:
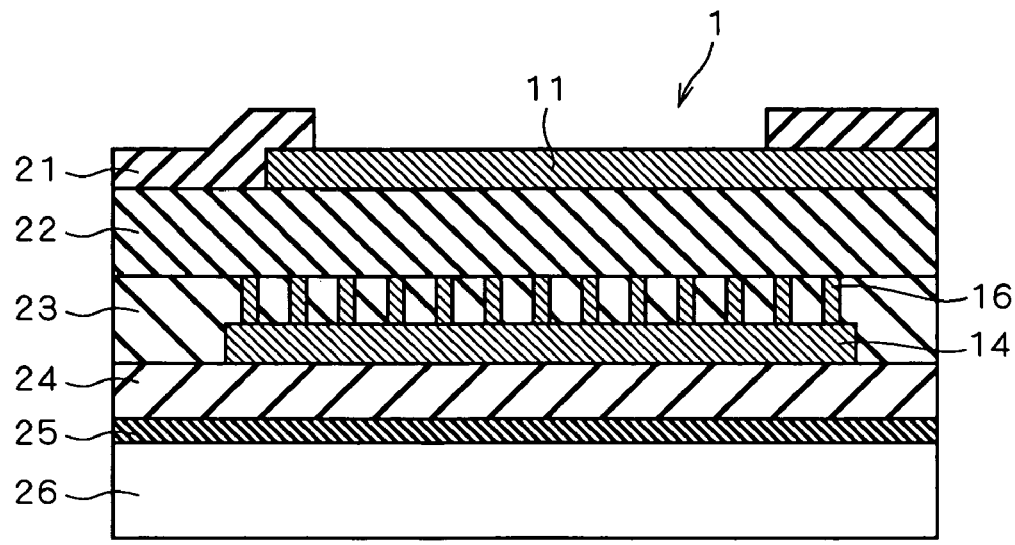
FIG. 24 is a sectional view of the bonding pad of the semiconductor device concerning Embodiment 4.
Figure 25:
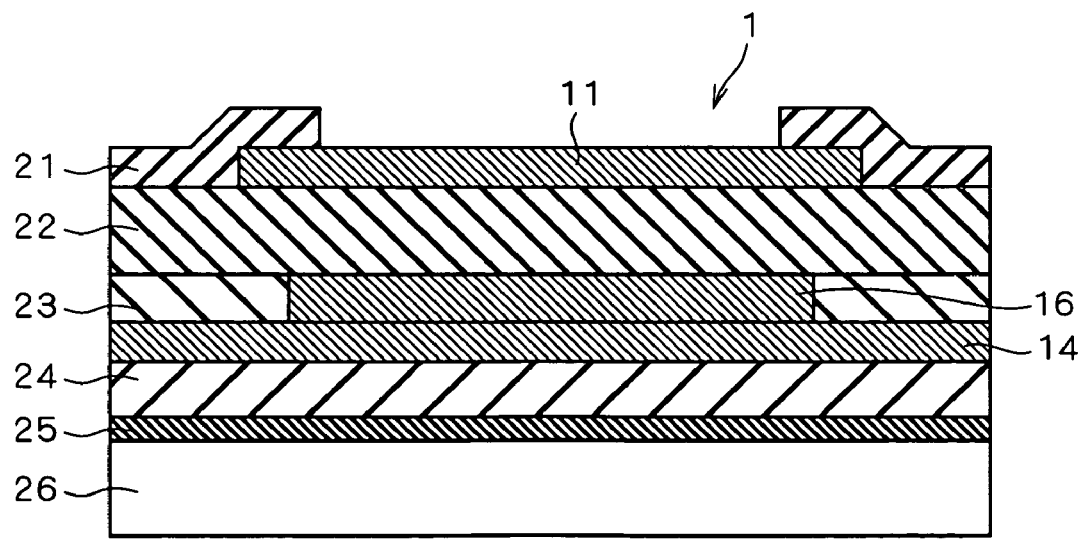
FIG. 25 is a sectional view of the bonding pad of the semiconductor device concerning Embodiment 4.

FIG. 23-FIG. 25 are the drawings showing the structure of the bonding pad of a semiconductor device concerning Embodiment 4. FIG. 23 is a top view of the bonding pad, and FIG. 24 and FIG. 25 are the sectional views of the bonding pad concerned which is taken along a line A-A and a line B-B of FIG. 23, respectively. In these drawings, the same numeral is given to the component which has the same function as what was shown in FIG. 2 and FIG. 3. In this example, bonding pad 1 is a structure which comprises only first metal 11. And original wiring 14 of a second lower-layer wiring layer is formed in the lower part of bonding pad 1 via first interlayer insulation film 22 and second interlayer insulation film 23. In the embodiment, fourth metal 16 of the shape of a plurality of lines is formed on the upper surface of wiring 14 in the region of the lower part of bonding pad 1.

Fourth metal 16 is formed using the via hole for connecting between the first lower-layer wiring layer formed on second interlayer insulation film 23, and the second lower-layer wiring layer. Since fourth metal 16 is a line shape divided into plurality, unlike the case where a via hole of a single large caliber is formed, it is hard to generate dishing on the upper surface, and it is easy to form. The material of fourth metal 16 is good with a common via hole material, for example, tungsten (W), copper, its alloy, etc. are mentioned.

The above-mentioned experiment and simulation result is also shown in FIG. 6. In experiment concerned and simulation, the structure of Embodiment 1 was applied as bonding pad 1 so that the comparison with Embodiment 1 could be performed easily. By the above explanation, in order that explanation is easy, the second lower layer wiring is explained as a wiring layer of one layer under than the first lower layer wiring. However, in the case of applying Embodiment 4 to Embodiment 1, when the second lower layer wiring is one layer under than the first lower layer wiring, third metal 13 and original wiring 14 will electrically connect via fourth metal 16. Therefore, the second lower layer wiring needs to be a lower layer wiring layer two or more layers under than the first lower layer wiring, in that case. Or an insulating layer may be suitably formed so that between third metal 13 and fourth metal 16 may be insulated etc.

As shown in FIG. 6, in the semiconductor device of Embodiment 4, rather than Embodiment 1, the generation of the crack could be suppressed and the good result was obtained. The reason seems to be because the stress applied to bonding pad 1 is absorbed by fourth metal 16 divided into plurality. That is, by forming a plurality of fourth metals 16 on the upper surface of wiring 14 of the lower part of bonding pad 1, it can be suppressed that a crack occurs in the interlayer insulation film under bonding pad 1. Therefore, also when locating wiring 14 under the bonding pad 1 in order to aim at high integration of a semiconductor device, degradation of the strength by it can be suppressed.

Figure 26:
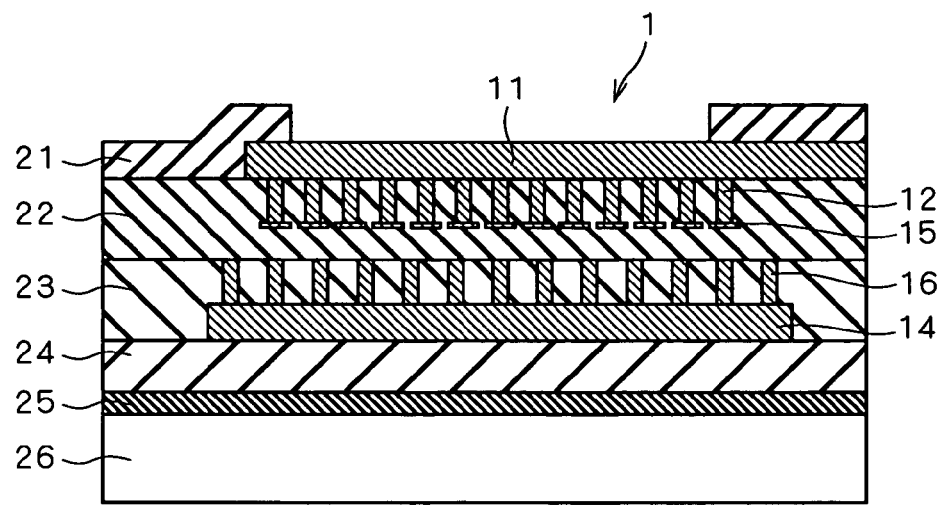
FIG. 26 is a sectional view of the bonding pad of the semiconductor device concerning Embodiment 4.

This embodiment is applicable also to bonding pad 1 of Embodiment 2 or Embodiment 3 besides Embodiment 1. For example, the example applied to Embodiment 3 is shown in FIG. 26. In this drawing, although the pitch of the line of second metal 12 is made to differ from the pitch of the line of fourth metal 16, both may be the same pitch. In the same drawing, although long-side direction of second metal 12 and long-side direction of fourth metal 16 are made in the same direction, they may be mutually different directions. However, as for the long-side direction of second metal 12, as Embodiment 1 explained using FIG. 7-FIG. 9, it is desirable to be located so that it may become vertical in plan view to the advancement direction of the probe which contacts first metal 11.

In the above explanation, although shape of fourth metal 16 was made into the shape of a line, it is not limited to it. For example, as fourth metal 16, the same effect is acquired even if locating a plurality of metals of a small caliber of the same shape as an original via hole.

Embodiment 5

The experiment and the stress simulation of Embodiment 4 showed that the generation of a crack was suppressed by forming a plurality of metals on the wiring upper surface concerned, even when letting wiring pass under the bonding pad. In Embodiment 5, paying attention to the result, by dividing the wiring itself which passes under the bonding pad into plurality this time, further improvement in strength of a semiconductor device is aimed at.

Figure 27:
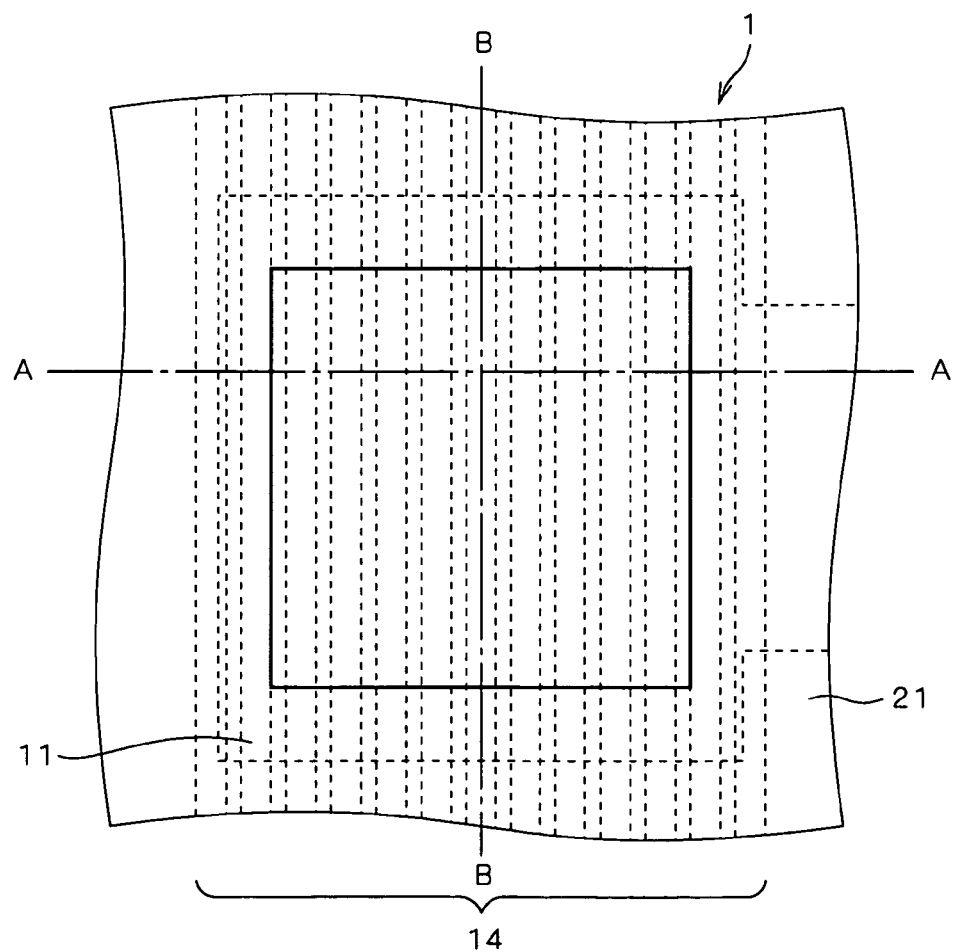
FIG. 27 is a top view of the bonding pad of the semiconductor device concerning Embodiment 5.
Figure 28:
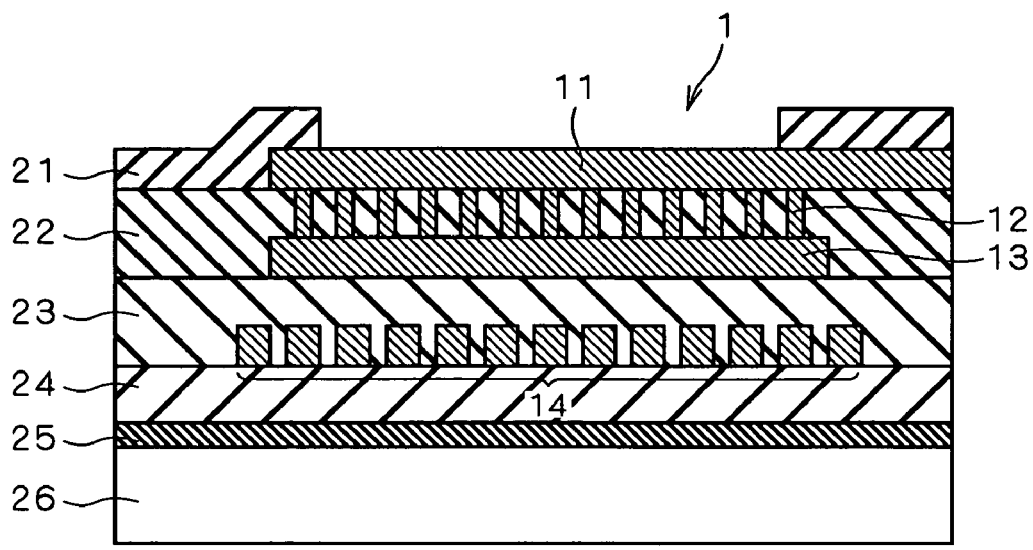
FIG. 28 is a sectional view of the bonding pad of the semiconductor device concerning Embodiment 5.

FIG. 27 and FIG. 28 are the drawings showing the structure of the bonding pad of a semiconductor device concerning Embodiment 5. FIG. 27 is a top view of the bonding pad, and FIG. 28 is a sectional view which is taken along a line A-A of FIG. 27. Since it is the same as that of FIG. 3, the sectional view which is taken along a line B-B of FIG. 27 is omitted. In FIG. 27 and FIG. 28, the same numeral is given to the component which has the same function as FIG. 2 and FIG. 3. As bonding pad 1, the thing of Embodiment 1 is applied as FIG. 27 may show. Differing from the structure shown by Embodiment 1 is the point that wiring 14 passing through the bottom of bonding pad 1 is divided into the shape of lines.

As a result of the experiment and the simulation by a present inventor, in the semiconductor device of FIG. 27 and FIG. 28, the stress generated at bonding pad 1 was absorbed by line-like wiring 14, and the generation of the crack was suppressed like Embodiment 4. That is, it was shown that degradation of the strength by locating the wiring 14 concerned could be suppressed by dividing wiring 14 of the lower part of bonding pad 1 into the shape of a plurality of lines. Therefore, high integration can be aimed at, suppressing the strength deterioration of a semiconductor device.

Here, as mentioned above, it is desirable not to let wiring 14 pass as much as possible under the bonding pad 1 from the viewpoint of preventing the generation of a crack. Therefore, in strength, the one where the line width of wiring 14 in the lower part of bonding pad 1 is narrower becomes high. It is effective, when the line width and interval of wiring 14 are concretely determined so that the percentage of wiring 14 occupied in bonding pad 1 lower part may be 60% or less.

Figure 29:
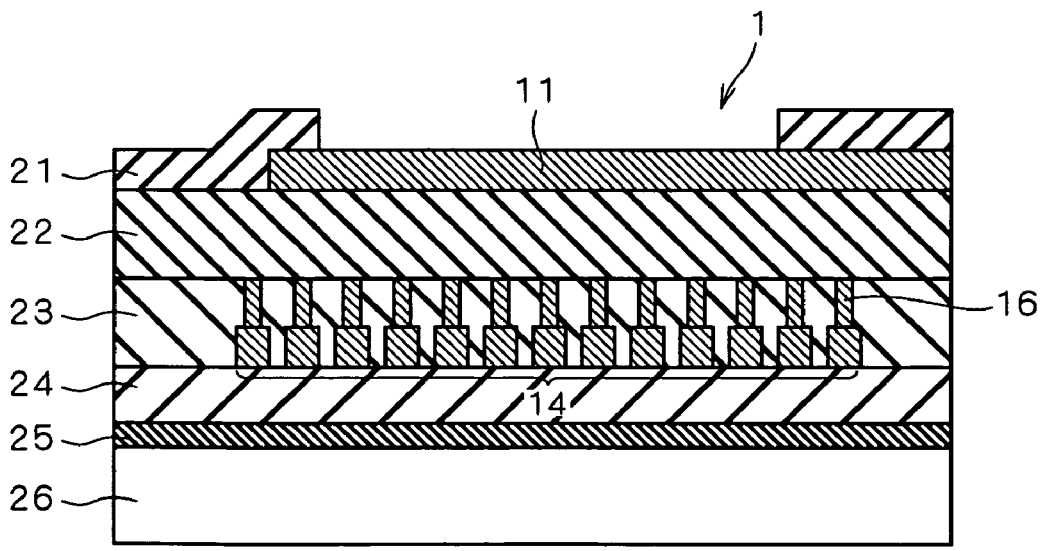
FIG. 29 is a sectional view of the bonding pad of the semiconductor device concerning Embodiment 5.

This embodiment is applicable also to the semiconductor device of Embodiments 2-4 besides Embodiment 1. For example, the example applied to Embodiment 4 is shown in FIG. 29. In this case, each of divided wiring 14 is located under each fourth metal 16. Since wiring 14 can thereby be used as an etching stopper in the case of the via hole formation which forms each fourth metal 16, the forming accuracy of fourth metal 16 improves.

In the present invention, although the application in particular of wiring 14 passing through the bottom of bonding pad 1 is not asked, when using it as a power-source (Vcc) or ground (GND) wiring of a circuit which each bonding pad 1 connects, for example, increase of a semiconductor chip area can be suppressed to the maximum extent. For example, when making bonding pad 1 arranged along each of four sides of semiconductor chip 3 as shown in FIG. 8 in Embodiment 1, it is good to make wiring 14 as a power-source or ground wiring into the shape of a frame like FIG. 30, and to let it pass at the lower part of each bonding pad 1. When arranging two rows of bonding pads 1 side by side on semiconductor chip 3 as shown in FIG. 9, it is good to make wiring 14 as a power-source or ground wiring into the shape of a line corresponding to the row of bonding pad 1, and to let it pass under the bonding pad 1 concerned like FIG. 31.

Figure 30:
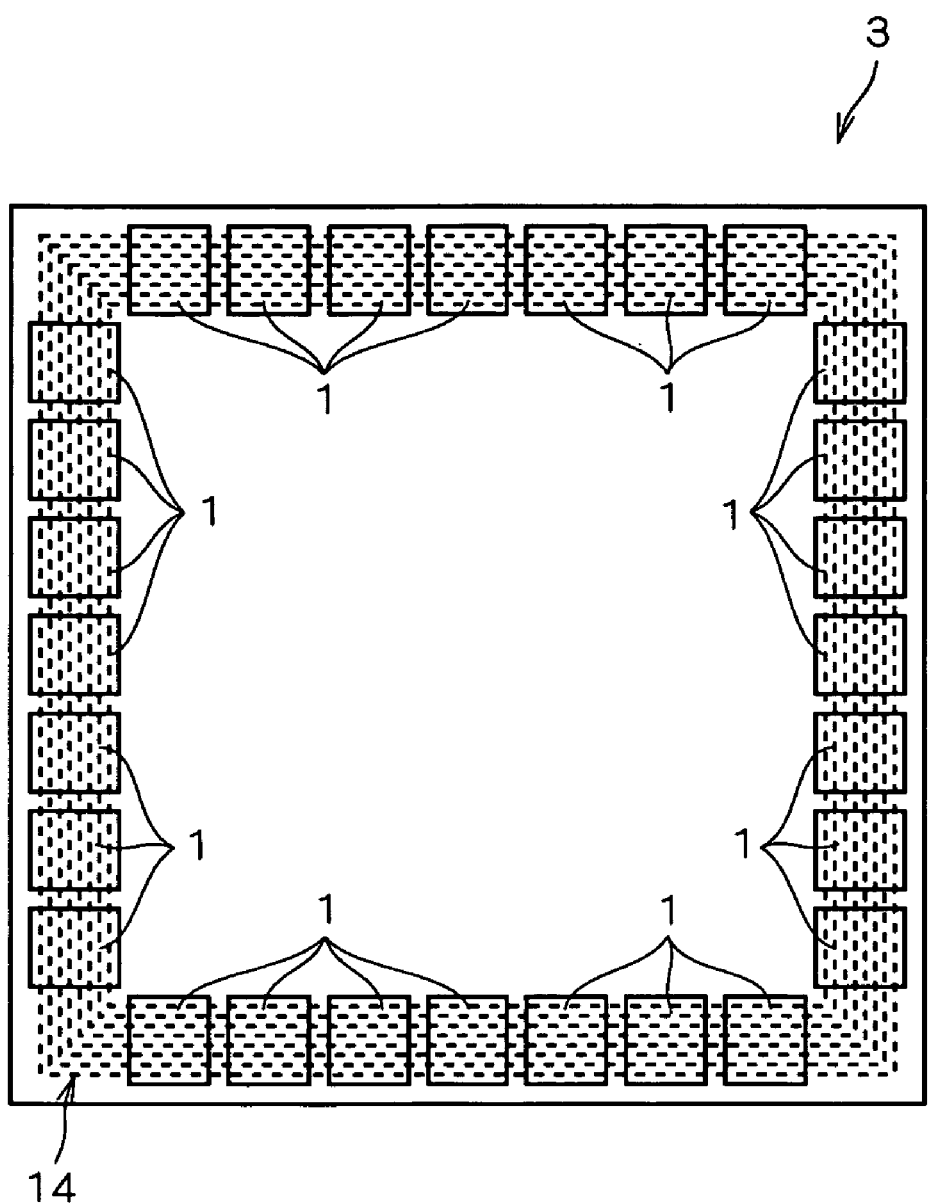
FIG. 30 is a drawing showing an example of the layout of a bonding pad, and its lower layer wiring in the semiconductor device concerning Embodiment 5.
Figure 31:
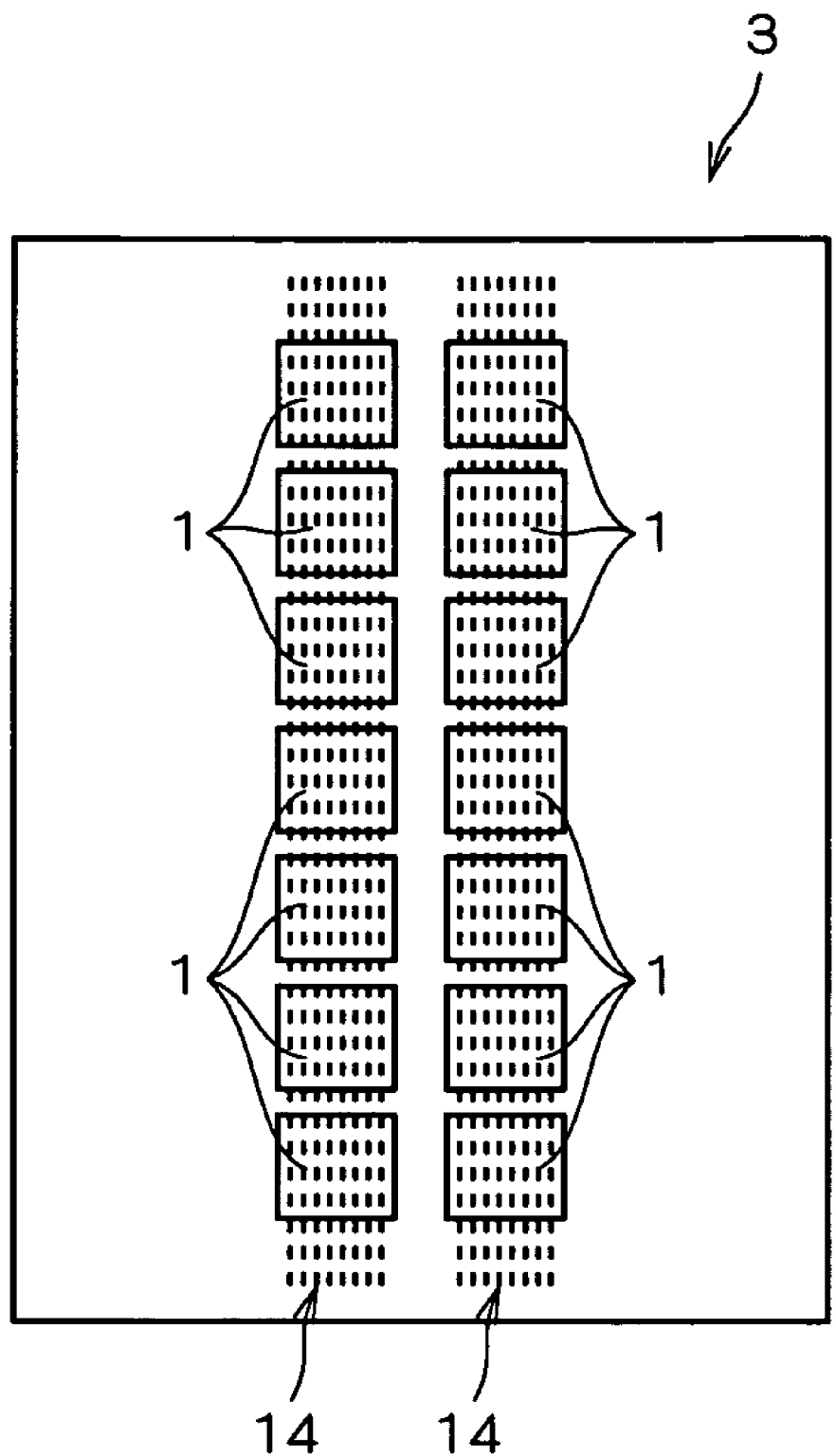
FIG. 31 is a drawing showing an example of the layout of a bonding pad, and its lower layer wiring in the semiconductor device concerning Embodiment 5.

Although the direction of the line of wiring 14 is in agreement with the arrangement direction of bonding pad 1 as a result in the example of FIG. 30 and FIG. 31, in the present invention, any direction is sufficient as the direction of the line of wiring 14. Wiring 14 may be used not only as a power-source or ground wiring but as another signal line.

Embodiment 6

As stated previously, in order to aim at high integration of a semiconductor device, it is necessary to also use the region under a bonding pad effectively. So, in Embodiment 6, a concrete layout of the structure of the lower part of the bonding pad concerning the present invention is proposed.

Figure 32:
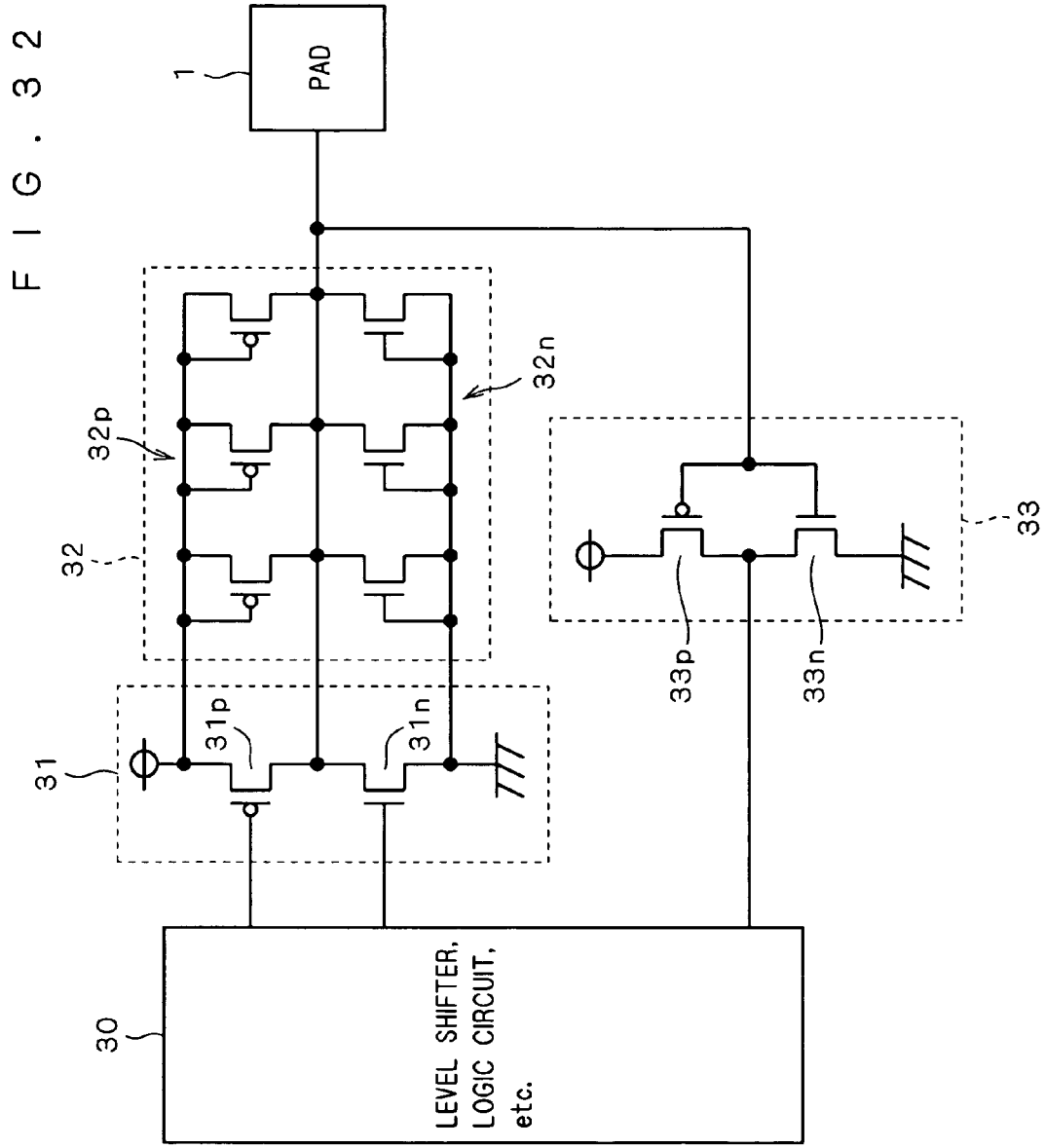
FIG. 32 is a circuit diagram of the input output section of the semiconductor device concerning Embodiment 6.

FIG. 32 is a circuit diagram of an input output section in the semiconductor device concerning Embodiment 6. The semiconductor device concerning Embodiment 6 is provided with output buffer 31, protection circuit 32, and input buffer 33 as an input output section of a signal between internal circuit 30 and bonding pad 1. That is, internal circuit 30 is a circuit connected to an input side of output buffer 31, and an output side of input buffer 33. In the internal circuit 30 concerned, a logic circuit where a signal is outputted to output buffer 31, and a signal from input buffer 33 is inputted, a level shifter which changes power supply voltage into a level for the logic circuits concerned, etc. are contained.

Output buffer 31 is an inverter circuit which outputs a signal from internal circuit 30 to bonding pad 1, and comprises PMOS transistor 31$p$ and 31$n$ of NMOS transistor. Input buffer 33 is an inverter circuit which inputs into internal circuit 30 a signal applied to bonding pad 1, and similarly comprises PMOS transistor 33$p$ and 33$n$ of NMOS transistor.

Protection circuit 32 is for protecting a semiconductor device from the electrostatic discharge (ESD: Electrostatic Discharge) applied to bonding pad 1. Protection circuit 32 comprises a plurality of PMOS transistor 32$p$ and 32$n$ of NMOS transistors which made diode connection. Like FIG. 32, parallel connection of PMOS transistor 32$p$ is made to PMOS transistor 31$p$ of output buffer 31, and PMOS transistor 33$p$ of input buffer 33. On the other hand, parallel connection of 32$n$ of the NMOS transistors is made to 31$n$ of NMOS transistors of output buffer 31, and 33$n$ of NMOS transistors of input buffer 33. When a voltage higher than a power source or a voltage lower than a ground is applied to bonding pad 1 by ESD, a current flows into this protection circuit 32, and it is prevented that high voltage is thereby loaded over output buffer 31 or input buffer 33. In order that PMOS transistor 32$p$ and 32$n$ of NMOS transistors of protection circuit 32 need to flow large current in an instant, what has large size is used.

In FIG. 32, in order to simplify explanation, bonding pad 1 of only a piece is shown, but the semiconductor device is provided with a plurality of bonding pads 1 arranged, for example like FIG. 30 or FIG. 31 also in this embodiment. Each of output buffer 31, protection circuit 32, and input buffer 33 is formed a piece for every bonding pad of a piece.

FIG. 33-FIG. 45 are the drawings showing the structure of the input output section of the semiconductor device concerning Embodiment 6. FIG. 33-FIG. 43 are layout patterns of wirings and via holes of the input output section concerned among them, and FIG. 44 and FIG. 45 are sectional views of the input output section concerned. Hereafter, the structure of the semiconductor device concerning Embodiment 6 is explained using these drawings.

Figure 33:
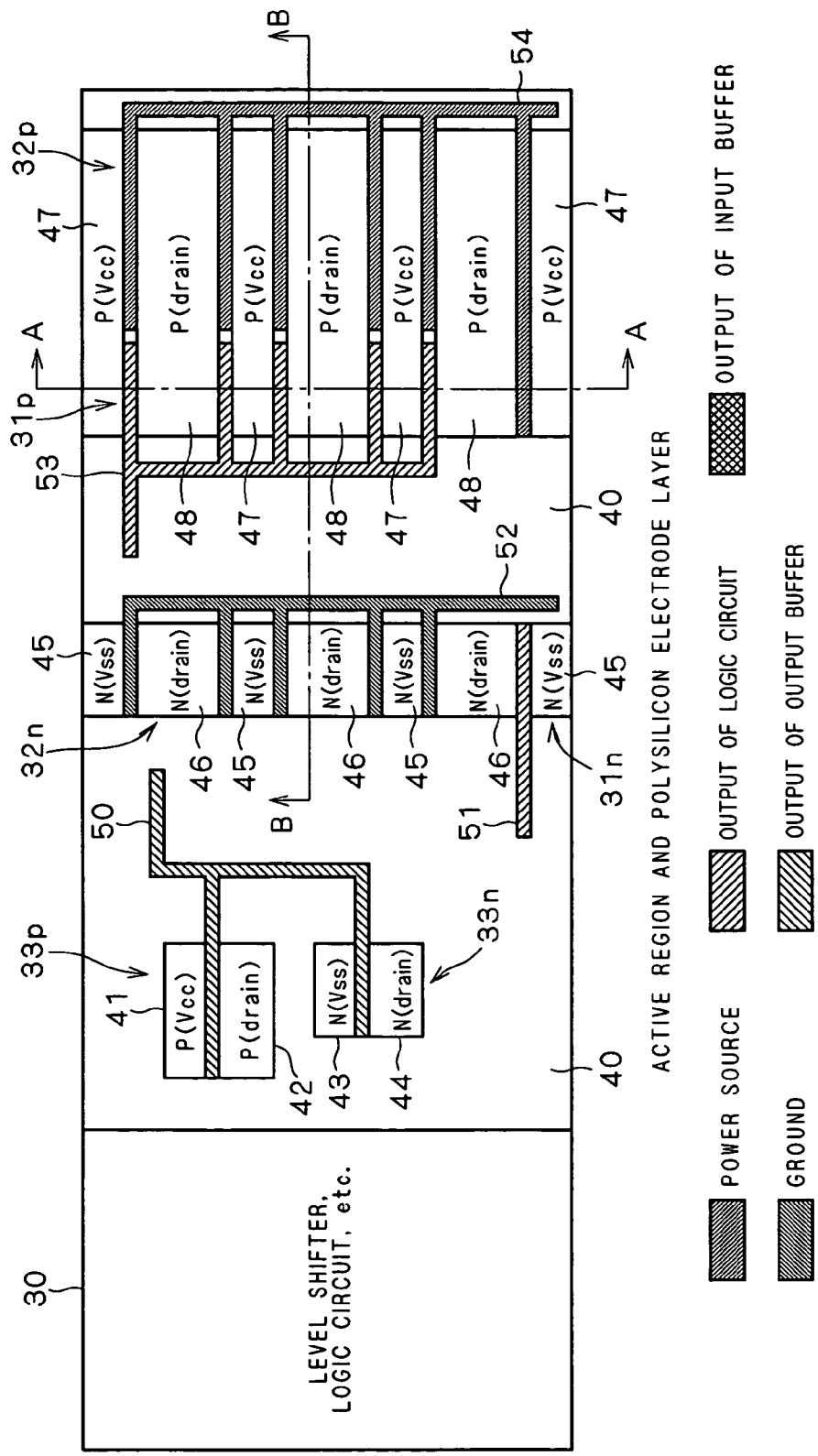
FIG. 33 is a layout pattern of the active region and polysilicon electrode layer of the input output section of the semiconductor device concerning Embodiment 6.

Here, correspondence with the layout patterns of FIG. 33-FIG. 43 and the sectional views of FIG. 44 and FIG. 45 is explained. FIG. 44 and FIG. 45 correspond to the cross sections which are taken along a line A-A and a line B-B which are shown in the layout patterns of FIG. 33-FIG. 43, respectively. And FIG. 33 shows the layout of active regions formed in semiconductor substrate 90 and polysilicon electrode layers formed on semiconductor substrate 90 shown in FIG. 44 and FIG. 45. Similarly FIG. 34 shows the layout of the first via hole layer in interlayer insulation film 91 of an undermost layer, FIG. 35 shows the layout of the first metal wiring layer on interlayer insulation film 91, FIG. 36 shows the layout of the second via hole layer in interlayer insulation film 92 which covers a first metal wiring layer, FIG. 37 shows the layout of the second metal wiring layer on interlayer insulation film 92, FIG. 38 shows the layout of the third via hole layer in interlayer insulation film 93 which covers a second metal wiring layer, FIG. 39 shows the layout of the third metal wiring layer on interlayer insulation film 93, FIG. 40 shows the layout of the fourth via hole layer formed in interlayer insulation film 94 which covers a third metal wiring layer, FIG. 41 shows the layout of the fourth metal wiring layer on interlayer insulation film 94, FIG. 42 shows the layout of the fifth via hole layer in interlayer insulation film 95 which covers a fourth metal wiring layer, and FIG. 43 shows the layout of the fifth metal wiring layer on interlayer insulation film 95, and opening 83 of passivation film 96 which covers it, respectively. Although the portion of the left-hand side in each layout pattern is a formation area of internal circuit 30, in order that it is easy, illustration of the concrete layout of the portion is omitted.

A common wiring material is sufficient as the material of each metal wiring layer, and aluminium, copper, those alloy (for example, Al—Si—Cu, Al—Cu, etc.), etc. are mentioned as an example. A common via hole material is sufficient also as each via hole layer, and tungsten, copper, its alloy, etc. are mentioned as an example.

In order to give facilities to explanation, hatching distinguished by the function has been performed to the wiring and the via hole in each drawing of FIG. 33-FIG. 45. Concretely, they are distinguished into five of a power node, a ground (reference potential) node, an output node of the logic circuit of internal circuit 30, an output node of output buffer 31, and an output node of protection circuit 32. In FIG. 33-FIG. 45, the same numeral is consistently attached to the same component.

Each transistor 31$p$-33$p$, 31$n$-33$n$ which forms output buffer 31, protection circuit 32, and input buffer 33 which were shown in FIG. 32 is respectively formed in the active region specified by isolation insulating layer 40 formed in the upper part of semiconductor substrate 90, as shown in FIG. 33.

Since they are connected in parallel mutually, PMOS transistor 31p of output buffer 31 and PMOS transistor 32p of protection circuit 32 are formed in the same active region like FIG. 33. PMOS transistor 32p of protection circuit 32 needs to enlarge a formation area so that the size may become large. Since carrier mobility is lower than an NMOS transistor, the PMOS transistor needs to enlarge the size. As a result, like FIG. 33, the active region in which PMOS transistors 31p and 32p are formed becomes wider than the active region in which NMOS transistors 31n and 32n are formed, and on it, it is formed so that a plurality of transistors may be regularly located in a line.

On the other hand, since they are connected in parallel mutually, 31n of NMOS transistors of output buffer 31 and 32n of NMOS transistors of protection circuit 32 are formed in the same active region. Usually, an NMOS transistors 31n and 32n formation area turns into an area smaller than the formation area of PMOS transistors 31p and 32p like FIG. 33. The upper part of the active region in which NMOS transistors 31n and 32n are formed also becomes the structure where a plurality of transistors are regularly located in a line.

Gate electrode 51 of 31n of NMOS transistors is connected to wiring 59 of a first metal wiring layer (FIG. 35) via via hole 51c of a first via hole layer (FIG. 34). Gate electrode 53 of PMOS transistor 31p is connected to wiring 55 of a first metal wiring layer via via hole 53c of a first via hole layer. That is, wirings 55 and 59 are input lines of output buffer 31, and are connected to the logic circuit (not illustrated) in internal circuit 30.

Source region 47 of PMOS transistors 31p and 32p and gate electrode 54 of PMOS transistor 32p are connected to wiring 62 of a first metal wiring layer via via hole 47c and via hole 54c of a first via hole layer, respectively. The wiring 62 concerned is connected to wiring 67 of a second metal wiring layer (FIG. 37) via via hole 62c of a second via hole layer (FIG. 36). In this embodiment, wiring 67 is a source line, for example, was located in the chip peripheral part in the shape of a frame like FIG. 30. In addition to the wiring 67 concerned, wiring 74 of a third metal wiring layer (FIG. 39) is also used as a source line so that it can contribute to the realization of high-capacity of a power source (both have connected mutually via via hole 67c of a third via hole layer (FIG. 38)). Like FIG. 37, the wirings 67 and 74 concerned are divided into the shape of a plurality of lines.

Source region 45 of NMOS transistors 31n and 32n and gate electrode 52 of NMOS transistors 32n are connected to wiring 60 of a first metal wiring layer via via hole 45c and via hole 52c of a first via hole layer, respectively. The wiring 60 concerned is connected to wiring 72 via via hole 60c of a second via hole layer, wiring 65 of a second metal wiring layer, and via hole 65c of a third via hole layer. In this embodiment, wiring 72 is a ground line, for example, was located in the chip peripheral part in the shape of a frame like FIG. 30. In addition to wiring 72, in this example, wiring 79 of a fourth metal wiring layer (FIG. 41) is also used as a ground line (both are connected mutually via via hole 72c of a fourth via hole layer (FIG. 40)).

On the other hand, source region 41 of PMOS transistor 33p of input buffer 33 connects with wiring 70 of a third metal wiring layer via via hole 41c of a first via hole layer, wiring 56 of a first metal wiring layer, via hole 56c of a second via hole layer, wiring 63 of a second metal wiring layer and via hole 63c of a third via hole layer. In this embodiment, wiring 70 is a source line, for example, was located in the chip peripheral part in the shape of a frame like FIG. 30. In addition to the wiring 70 concerned, in this example, wiring 77 of a fourth metal wiring layer is also used as a source line (both have connected mutually via via hole 70c of a fourth via hole layer).

Source region 43 of NMOS transistors 33n of input buffer 33 connects with wiring 71 of a third metal wiring layer via via hole 43c of a first via hole layer, wiring 57 of a first metal wiring layer, via hole 57c of a second via hole layer, wiring 64 of a second metal wiring layer, and via hole 64c of a third via hole layer. In this embodiment, wiring 71 is a ground line, for example, was located in the chip peripheral part in the shape of a frame like FIG. 30. In addition to the wiring 71 concerned, in this example, wiring 78 of a fourth metal wiring layer is also used as a ground line (both have connected mutually via via hole 71c of a fourth via hole layer).

Wiring 68 of a third metal wiring layer and wiring 75 of a fourth metal wiring layer (refer to FIG. 39-FIG. 41) are the source lines for internal circuit 30 (both have connected mutually via via hole 68c of a fourth via hole layer). Wiring 69 of a third metal wiring layer and wiring 76 of a fourth metal wiring layer are the ground lines for internal circuit 30 similarly (both have connected mutually via via hole 69c of a fourth via hole layer).

Drain area 46 of NMOS transistors 31n and 32n, drain area 48 of PMOS transistors 31p and 32p and gate electrode 50 of input buffer 33 are altogether connected to wiring 61 (common wiring) of a first metal wiring layer via via hole 46c, via hole 48c, and via hole 50c of a first via hole layer, respectively. The wiring 61 concerned connects with wiring 82 of a fifth metal wiring layer (FIG. 43) via via hole 61c of a second via hole layer, wiring 66 of a second metal wiring layer, via hole 66c of a third via hole layer, wiring 73 of a third metal wiring layer, via hole 73c of a fourth via hole layer, wiring 80 of a fourth metal wiring layer, and via hole 80c of a fifth via hole layer (FIG. 42). The wiring 82 concerned functions as bonding pad 1. As shown in FIG. 44 and FIG. 45, the upper surface of a semiconductor device is covered with passivation film 96, but opening 83 which the upper surface exposes is formed above wiring 82 which is bonding pad 1.

The bonding pad 1 concerned has the same structure (refer to FIG. 1-FIG. 3) as Embodiment 1. That is, in bonding pad 1, under wiring 82 of a fifth metal wiring layer, via hole 81c of the shape of a plurality of line formed in the fifth via hole layer like FIG. 42 connects, and wiring 81 of a fourth metal wiring layer connects like FIG. 41 under the via hole 81c concerned further. That is, bonding pad 1 has, like Embodiment 1, wiring 82 (first metal) formed using the fifth metal wiring layer which is a top layer wiring layer, via hole 81c (second metal) of the shape of a plurality of lines connected under the wiring 82 concerned, and wiring 81 formed using the fourth metal wiring layer (first lower-layer wiring layer) of one-layer under than the fifth metal wiring layer.

Therefore, in this embodiment, it is desirable for width W and interval D of via hole 81c to satisfy the relation:

$$W \leq D \leq 2 \times W \quad (1).$$

When it is made such and made for the applying direction of the stress to bonding pad 1 to become near in plan view vertically to the long-side direction of via hole 81c as Embodiment 1 explained, it will become difficult to generate a crack in interlayer insulation films 94 and 95. It is desirable to put in order and locate a plurality of bonding pads 1 to the long-side direction of via hole 81c further in that case. Thereby, it becomes easy to make a probe, a bonding tool, etc. which advance from the outside of a chip contact so that the advancement direction may become vertical in plan view to the long-side direction of via hole 81*c*.

Wiring 74 of the third metal wiring layer which is a source line passing through the bottom of bonding pad 1 is divided into the shape of a plurality of lines. That is, this wiring 74 is equivalent to the "wiring of the second lower-layer wiring layer divided into the shape of a line" shown in Embodiment 5. That is, the wiring 74 concerned can absorb the stress generated at bonding pad 1. Therefore, high integration can be aimed at, suppressing the strength deterioration of the semiconductor device by letting wiring 74 pass under bonding pad 1.

Since bonding pad 1 is located above output buffer 31, bonding pad 1 and output buffer 31 concerned are connectable by a short wiring route like FIG. 45. Therefore, the wiring resistance and wiring capacity between bonding pad 1 and output buffer 31 can be suppressed to the minimum. Thereby, loss of the driving ability of output buffer 31 is suppressed, and the input output circuit excellent in the electrical property is obtained.

Bonding pad 1 of this embodiment is formed above PMOS transistors 31*p* and 32*p* of output buffer 31 and protection circuit 32, and is not formed above the NMOS transistors 31*n* and 32*n* as the above-mentioned FIG. 33-FIG. 45 show. It is not formed above input buffer 33 and internal circuit 30.

As mentioned above, the area of the active region in which PMOS transistors 31*p* and 32*p* are formed is comparatively wide, and the region upper part concerned becomes the structure where a plurality of transistors are regularly located in a line. Therefore, the stress applied from the outside is uniformly distributed to the whole formation area of PMOS transistors 31*p* and 32*p*, and it is hard to concentrate the stress to a specific part. Therefore, it can be said that PMOS transistors 31*p* and 32*p* have the high resistance over a stress. Usually, when an active device is located under the bonding pad 1, we are anxious about breakage of the element concerned by the stress generated at bonding pad 1. However, high integration can be aimed at in this embodiment, suppressing the strength deterioration of a semiconductor device to the minimum, since PMOS transistors 31*p* and 32*p* which have a structure excellent in stress resistance are located under the bonding pad 1.

Furthermore, in this embodiment, drain area 48 of PMOS transistors 31*p* and 32*p*, drain area 46 of NMOS transistors 31*n* and 32*n*, and bonding pad 1 are electrically connected to common wiring 61 as FIG. 33-FIG. 45 show. In the wiring 61 concerned, the connecting part (via hole 61*c*) to bonding pad 1 is between the connecting part to drain area 48 (via hole 48*c*), and the connecting part to drain area 46 (via hole 46*c*). When ESD enters into bonding pad 1 by arranging such, for example, it is prevented that high voltage is applied shifting toward one of the two of PMOS transistors 31*p* and 32*p* or NMOS transistors 31*n* and 32*n*, and a current flows into protection circuit 32. Therefore, the ESD resistance of a semiconductor device becomes still higher.

The upper surface of bonding pad 1 is exposed to opening 83 of passivation film 96, and physical access is performed into the exposed portion in the case of probing or bonding. In this embodiment, via hole 80*c*, wiring 80, via hole 73*c*, via hole 66*c*, wiring 66, and via hole 61*c* which accomplish a connection structure for electrically connecting bonding pad 1, and wiring 61 which output buffer 31 and input buffer 33 connect are located at the location shifted from opening 83 like FIG. 45. That is, the connection structure concerned is connected under the edge part covered with passivation film 96 instead of the central part of bonding pad 1 exposed to opening 83. Therefore, it is prevented that the stress applied to bonding pad 1 in the case of probing or bonding is directly applied to the connection structure concerned, and the high connection reliability between bonding pad 1, and output buffer 31 and input buffer 33 is acquired.

In this embodiment, bonding pad 1 is formed above PMOS transistors 31*p* and 32*p*, and is not formed above the NMOS transistors 31*n* and 32*n*. Therefore, the edge part of bonding pad 1 will be inevitably located like FIG. 45 near the region upper part between the active region of PMOS transistors 31*p* and 32*p*, and the active region of NMOS transistors 31*n* and 32*n*. Therefore, it can be performed easily that the connecting part to bonding pad 1 (via hole 61*c*) is located between the connecting part to drain area 48 (via hole 48*c*), and the connecting part to drain area 46 (via hole 46*c*) in wiring 61, moreover that the connection structure between bonding pad 1 and wiring 61 (via hole 80*c*, wiring 80, via hole 73*c*, via hole 66*c*, wiring 66, and via hole 61*c*) is located under the edge part covered with passivation film 96.

Although the above explanation showed the structure which forms bonding pad 1 above PMOS transistors 31*p* and 32*p*, and is not formed above NMOS transistors 31*n* and 32*n*, the structure which forms it above NMOS transistors 31*n* and 32*n*, and is not formed above PMOS transistors 31*p* and 32*p* may be made on the contrary. Namely, what is necessary is for bonding pad 1 to just be formed above either one of the two of PMOS transistors 31*p* and 32*p* and NMOS transistors 31*n* and 32*n*.

As mentioned above, the active region upper part of NMOS transistors 31*n* and 32*n* is also the structure where a plurality of transistors are regularly located in a line. Since the stress applied from the outside is uniformly distributed over the whole formation area of the NMOS transistors 31*n* and 32*n*, the resistance over a stress is high. Therefore, also when NMOS transistors 31*n* and 32*n* are located under the bonding pad 1, the strength deterioration of a semiconductor device can be suppressed to the minimum. However, as for NMOS transistors 31*n* and 32*n*, since carrier mobility is high compared with PMOS transistors 31*p* and 32*p*, the formation area becomes small like FIG. 33. Therefore, the way formed above PMOS transistors 31*p* and 32*p* can enlarge the area, and bonding pad 1 has the advantage that probing and bonding can be easily performed now.

Although this embodiment showed the example in which wiring 67 of a second metal wiring layer and wiring 74 of a third metal wiring layer which are source lines were divided into the shape of a plurality of lines like FIG. 37 and FIG. 39, as shown in FIG. 46, for example, each wiring 67 which was divided into plurality may be connected partially (the same may be said about wiring 74). In that case, since it is prevented that electric potential varies for every source line divided into plurality, the operational reliability of the semiconductor device concerning the present invention improves.

In explanation of this embodiment, although the structure where a semiconductor device had a five-layer metal wiring layer was shown, application of the present invention is not limited to it and may be applied also to the semiconductor element which has a metal wiring layer of four or less layers or six layers or more.

Embodiment 7

FIG. 47-FIG. 59 are the drawings showing the structure of the input output section of the semiconductor device concerning Embodiment 7. FIG. 47-FIG. 57 are the layout patterns of wirings and via holes of the input output section concerned, and correspond to the FIG. 33-FIG. 43 of Embodiment 6, respectively. FIG. 58 and FIG. 59 are the sectional views of the input output section concerned, and correspond to the FIG. 44 and FIG. 45 of Embodiment 6, respectively. FIG. 58 and FIG. 59 correspond to the cross section which is taken along a line A-A and a line B-B which are shown in the layout patterns of FIG. 33-FIG. 43, respectively.

In FIG. 47-FIG. 59, the same numeral as it is given to the component which has the same function as what was shown in FIG. 33-FIG. 45. It is only that arrangement of a wiring and a via hole differs among FIG. 47-FIG. 59, and FIG. 33-FIG. 45, and mutual electric connecting relation is the same. That is, the equivalent circuit of the structure shown in FIG. 47-FIG. 59 is the same as FIG. 32. Therefore, below, the detailed explanation about the connecting relation of each wiring and via hole is omitted, and the characteristic portion of Embodiment 7 is explained.

In previous Embodiment 6, the structure where bonding pad 1 is formed above either one of the two of PMOS transistors 31p and 32p and NMOS transistors 31n and 32n of output buffer 31 and protection circuit 32 was shown. However, in this embodiment, like FIG. 59, bonding pad 1 is formed so that it may straddle above PMOS transistors 31p and 32p and NMOS transistors 31n and 32n. In this embodiment, bonding pad 1 is not formed above input buffer 33 and internal circuit 30.

Since active region upper part of PMOS transistors 31p and 32p and NMOS transistors 31n and 32n is the structure where a plurality of transistors are regularly located in a line as mentioned above, the resistance over a stress is high. Therefore, high integration can be aimed at, suppressing the strength deterioration of a semiconductor device like this embodiment, to the minimum, when locating PMOS transistors 31p and 32p and NMOS transistors 31n and 32n under the bonding pad 1.

When bonding pad 1 is located above output buffer 31, bonding pad 1 and output buffer 31 are connectable by a short wiring route like FIG. 59. Thereby, loss of the driving ability of output buffer 31 is suppressed, and the input output circuit excellent in the electrical property is obtained.

In this embodiment, bonding pad 1 can be formed so that it may straddle above PMOS transistors 31p and 32p and NMOS transistors 31n and 32n, and the area of bonding pad 1 can be made larger than Embodiment 6. Thereby, the effect that probing and bonding to the bonding pad 1 concerned become easy is acquired.

The connection structure (via hole 80c, wiring 80, via hole 73c, via hole 66c, wiring 66, and via hole 61c) for electrically connecting bonding pad 1 to wiring 61 which output buffer 31 and input buffer 33 connect is located at the location shifted from opening 83 of passivation film 96 like FIG. 59. Therefore, it is prevented that the stress applied to bonding pad 1 in the case of probing or bonding is directly applied to the connection structure concerned, and the high connection reliability between bonding pad 1, and output buffer 31 and input buffer 33 is acquired.

Since bonding pad 1 has the same structure (refer to FIG. 1-FIG. 3) as Embodiment 1, it is desirable to make width W and interval D of via hole 81c satisfy the relation of the above-mentioned formula (1). In that case, when making the applying direction of the stress to bonding pad 1 become near in plan view vertically to the long-side direction of via hole 81c, it will become difficult to generate a crack in interlayer insulation films 94 and 95. It is desirable to put in order and locate a plurality of bonding pads 1 to the long-side direction of via hole 81c. Thereby, it becomes easy to make a probe, a bonding tool, etc. which advance from the outside of a chip contact so that the advancement direction may become vertical in plan view to the long-side direction of via hole 81c.

As the result of having enlarged bonding pad 1, not only wiring 74 that is a source line but wiring 72 will pass along the bottom of the bonding pad 1 concerned in Embodiment 7. In this embodiment, wiring 74 and wiring 72 are divided into the shape of a plurality of lines like FIG. 53, respectively. That is, wirings 72 and 74 are equivalent to the "wiring of the second lower-layer wiring layer divided into the shape of a line" shown by Embodiment 5. That is, the wirings 72 and 74 concerned can absorb the stress generated at bonding pad 1. Therefore, the strength deterioration of a semiconductor device by letting wiring 74 and wiring 72 pass the bottom of the bonding pad 1 concerned is suppressed.

Embodiment 8

FIG. 60-FIG. 64 are the layout patterns showing the structure of the input output section of the semiconductor device concerning Embodiment 8, and correspond to the FIG. 53-FIG. 57 which were shown in Embodiment 7, respectively. That is, FIG. 60-FIG. 64 show the layout of the third metal wiring layer, the fourth via hole layer, the fourth metal wiring layer, the fifth via hole layer, and the fifth metal wiring layer of the input output section of the semiconductor device, respectively. Since the layout of an active region and polysilicon electrode layer, the first via hole layer, the first metal wiring layer, the second via hole layer, the second metal wiring layer and the third via hole layer is the same as that of what was shown in the FIG. 47 of Embodiment 7—FIG. 52, illustration here is omitted. Also in FIG. 60-FIG. 64, the same numeral as it is given to the component which has the same function as what was shown in the FIG. 33-FIG. 45 which were shown in Embodiment 6.

It is only that the layouts of a wiring and a via hole differ, and mutual electric connecting relation is the same in FIG. 60-FIG. 64, and FIG. 53-FIG. 57. That is, the equivalent circuit of the input output section of this embodiment is the same as FIG. 32. Therefore, below, the detailed explanation about the connecting relation of each wiring and via hole is omitted, and the characteristic portion of Embodiment 8 is explained.

In this embodiment, bonding pad 1 is made still larger than Embodiment 7, and it is formed so that the upper part of output buffer 31, protection circuit 32, and input buffer 33 and the upper part of a part of internal circuit 30 may be straddled. Namely, like FIG. 62-FIG. 64, wiring 81 of a fourth metal wiring layer, via hole 81c of a fifth via hole layer, and wiring 82 of a fifth metal wiring layer which form bonding pad 1 are made to extend and exist above output buffer 31, protection circuit 32, input buffer 33, and a part of internal circuit 30, respectively.

Since bonding pad 1 has the same structure (refer to FIG. 1-FIG. 3) as Embodiment 1, it is desirable to make width W and interval D of via hole 81c satisfy the relation of the above-mentioned formula (1). In that case, when making the applying direction of the stress to bonding pad 1 become near in plan view vertically to the long-side direction of via hole 81c, it will become difficult to generate a crack in interlayer insulation films 94 and 95. Further, it is desirable to put in order and locate a plurality of bonding pads 1 to the long-side direction of via hole 81c. Thereby, it becomes easy to make a probe, a bonding tool, etc. which advance from the outside of a chip contact so that the advancement direction may become vertical in plan view to the long-side direction of via hole 81c.

Like FIG. 60-FIG. 62, wiring 68 of a third metal wiring layer (source line for internal circuits 30), wiring 69 (ground line for internal circuits 30), wiring 70 and 74 (power source line), and wiring 71 and 72 (ground line) are passing under bonding pad 1. In this embodiment, those wirings 68-72, and 74 are divided into the shape of a plurality of lines, respectively, and are operated as "a wiring of the second lower-layer wiring layer divided into the shape of a line" shown in Embodiment 5. That is, wiring 68-72, and 74 can absorb the stress generated at bonding pad 1, and can suppress the generation of a crack.

Thus, according to this embodiment, the area of bonding pad 1 can be enlarged, maintaining the resistance over a stress of a semiconductor device. When the area of bonding pad 1 becomes large, the effect that probing and bonding to the bonding pad 1 concerned become easy will be acquired.

As shown in FIG. 65, it becomes possible to use it, dividing the upper surface of bonding pad 1 into the region for performing probing (probing region), and the region for performing wire bonding (bonding region).

In recent years, in order to contribute to the miniaturization of a semiconductor module, the wire used for bonding is also in the tendency of becoming thin. Therefore, when the upper surface of a bonding pad is damaged by probing, and making bonding of the wire, it will be easy to generate a connection failure. When the area of bonding pad 1 can be enlarged like this embodiment and a probing region and a bonding region can be divided, even if it is after probing, the upper surface of a bonding region is unhurt and can make bonding of the wire surely.

Figure 66A:
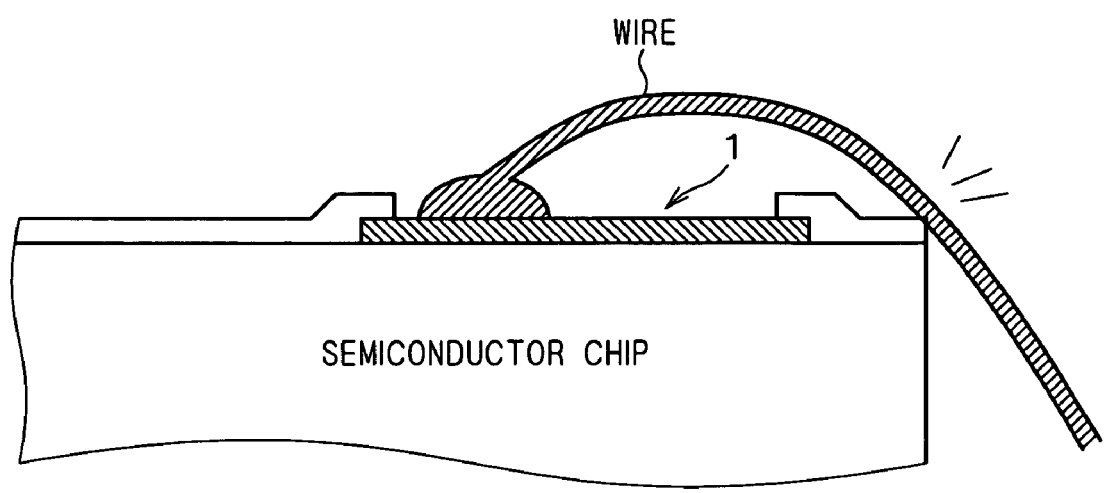
FIG. 66 is a drawing for explaining the effect of Embodiment 8.
Figure 66B:
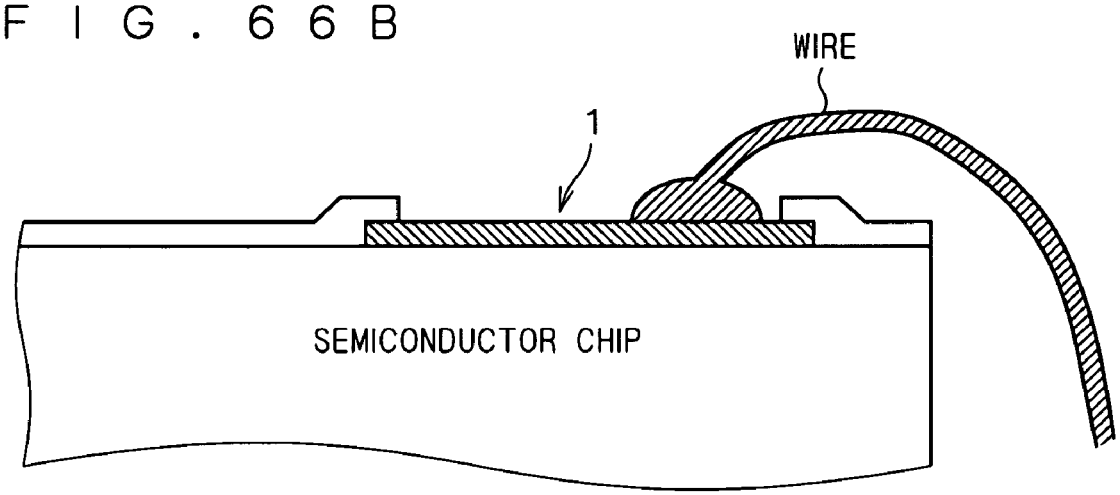

When specifying a probing region and a bonding region on the upper surface of bonding pad 1 individually, it is desirable to make the bonding region into the outside of a semiconductor chip. The reason is explained using FIG. 66. For example, when bonding of the wire is made inside a semiconductor chip like FIG. 66(*a*), a wire will contact the edge of a semiconductor chip easily. When lengthening a wire slightly, the contact can be prevented, but it is disadvantageous for the miniaturization of a semiconductor module. Contact with the wire concerned and the edge of a semiconductor chip can be prevented without lengthening a wire, when making bonding of the wire to the outside of a semiconductor chip like FIG. 66(*b*) to it.

Although this invention was explained in detail, the above-mentioned explanation is exemplification in all the aspects, and this invention is not limited to it. The countless modifications which are not exemplified may be assumed without separating from the scope of this invention.

The invention claimed is:

1. A semiconductor device comprising:
a plurality of bonding pads, wherein each of the bonding pads has a first metal and a plurality of second metals, each of the plurality of second metals has a linear pattern having a plurality of stripes with a rectangular shape having a long side and a short side in a plan view, is arranged directly under the first metal, and is connected with the first metal; and
a passivation film which covers a side wall and a top surface of the first metal of each of the plurality of bonding pads and has a plurality of openings, each of the plurality of openings exposing a part of the top surface of the first metal of each of the plurality of bonding pads,
wherein in the plan view, the bonding pads are arranged uniformly and in order along the long side direction of the second metal, wherein a width W at a top and interval D of a bottom of each of the second metals satisfy a relation:

$W \leq D \leq 2W$, and in the plan view, an input buffer and an output buffer are formed below each of the plurality of bonding pads, each of the input buffer and the output buffer including a transistor, the input buffer receiving a first signal from the bonding pad and outputting the first signal to an internal circuit, the output buffer receiving a second signal from the internal circuit and outputting the second signal to the bonding pad.

2. The semiconductor device according to claim 1, wherein each of the plurality of bonding pads has a third metal arranged under the plurality of second metals and is connected with the plurality of second metals, and
wherein the first metal is composed of aluminum and each of the plurality of second metals is composed of tungsten.

3. The semiconductor device according to claim 1, wherein the first metal and each of the plurality of bonding pads is probed by advancing a probe needle in a direction perpendicular to the long side direction of the second metals.

* * * * *